United States Patent
Takemura

(10) Patent No.: US 8,487,303 B2
(45) Date of Patent: Jul. 16, 2013

(54) SEMICONDUCTOR MEMORY DEVICE

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 148 days.

(21) Appl. No.: 13/047,188

(22) Filed: Mar. 14, 2011

(65) Prior Publication Data

US 2011/0228584 A1 Sep. 22, 2011

(30) Foreign Application Priority Data

Mar. 19, 2010 (JP) ................................ 2010-063969
Mar. 30, 2010 (JP) ................................ 2010-077882

(51) Int. Cl.
*H01L 29/12* (2006.01)

(52) U.S. Cl.
USPC ............... 257/43; 257/57; 257/68; 257/71; 257/296; 257/369

(58) Field of Classification Search
USPC .................... 257/43, 57, 68, 71, 296, 369
See application file for complete search history.

(56) References Cited

U.S. PATENT DOCUMENTS

| | | | |
|---|---|---|---|
| 4,466,081 A | 8/1984 | Masuoka | |
| 5,349,366 A | 9/1994 | Yamazaki et al. | |
| 5,731,856 A | 3/1998 | Kim et al. | |
| 5,744,864 A | 4/1998 | Cillessen et al. | |
| 5,750,433 A | 5/1998 | Jo | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,778,422 B2 | 8/2004 | Takahashi et al. | |
| 6,787,835 B2 | 9/2004 | Atwood et al. | |
| 6,949,782 B2 | 9/2005 | Atwood et al. | |
| 7,049,190 B2 | 5/2006 | Takeda et al. | |

(Continued)

FOREIGN PATENT DOCUMENTS

CN 1956197 A 5/2007
EP 1 737 044 A1 12/2006

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Long Pham

(74) *Attorney, Agent, or Firm* — Fish & Richardson P.C.

(57) ABSTRACT

In a matrix including a plurality of memory cells, each in which a drain of a writing transistor is connected to a gate of a reading transistor and the drain is connected to one electrode of a capacitor, a gate of the writing transistor is connected to a writing word line, a source of the writing transistor and a source of the reading transistor is connected to a bit line, and a drain of the reading transistor is connected to a reading word line. A conductivity type of the writing transistor is different from a conductivity type of the reading transistor. In order to increase the integration degree, a bias line may be substituted with a reading word line in another row, or memory cells are connected in series so as to have a NAND structure, and a reading word line and a writing word line may be shared.

20 Claims, 24 Drawing Sheets

U.S. PATENT DOCUMENTS

| | | | |
|---|---|---|---|
| 7,050,323 B2 | 5/2006 | Takahashi et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,468,901 B2 | 12/2008 | Kameshiro et al. |
| 7,501,293 B2 | 3/2009 | Ito et al. |
| 7,642,588 B2 | 1/2010 | Cheng et al. |
| 7,674,650 B2 | 3/2010 | Akimoto et al. |
| 7,732,819 B2 | 6/2010 | Akimoto et al. |
| 7,791,074 B2 | 9/2010 | Iwasaki |
| 7,935,582 B2 | 5/2011 | Iwasaki |
| 7,956,361 B2 | 6/2011 | Iwasaki |
| 8,154,024 B2 | 4/2012 | Iwasaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2003/0227041 A1 | 12/2003 | Atwood et al. |
| 2004/0038446 A1 | 2/2004 | Takeda et al. |
| 2004/0042247 A1 | 3/2004 | Takahashi et al. |
| 2004/0127038 A1 | 7/2004 | Carcia et al. |
| 2004/0164326 A1 | 8/2004 | Atwood et al. |
| 2005/0017302 A1 | 1/2005 | Hoffman |
| 2005/0030782 A1 | 2/2005 | Takahashi et al. |
| 2005/0199959 A1 | 9/2005 | Chiang et al. |
| 2005/0237786 A1 | 10/2005 | Atwood et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0090393 A1 | 4/2007 | Cheng et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Wasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |

FOREIGN PATENT DOCUMENTS

| | | |
|---|---|---|
| EP | 2 226 847 A2 | 9/2010 |
| EP | 2 339 639 A2 | 6/2011 |
| JP | 57002563 A | 1/1982 |
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10022376 A | 1/1998 |
| JP | 11-505377 A | 5/1999 |
| JP | 2000-044236 A | 2/2000 |
| JP | 2000-150900 A | 5/2000 |
| JP | 2001-053167 A | 2/2001 |
| JP | 2001053164 A | 2/2001 |
| JP | 2001-351386 A | 12/2001 |
| JP | 2002-076356 A | 3/2002 |
| JP | 2002269976 A | 9/2002 |
| JP | 2002-289859 A | 10/2002 |
| JP | 2003059259 A | 2/2003 |
| JP | 2003-086000 A | 3/2003 |
| JP | 2003-086808 A | 3/2003 |
| JP | 2004014094 A | 1/2004 |
| JP | 2004-103957 A | 4/2004 |
| JP | 2004-273614 A | 9/2004 |
| JP | 2004-273732 A | 9/2004 |
| JP | 2006338730 A | 12/2006 |
| JP | 2007-103918 A | 4/2007 |
| JP | 2007123893 A | 5/2007 |
| JP | 2009016646 A | 1/2009 |
| JP | 2009-135350 A | 6/2009 |
| WO | 2004/114391 A1 | 12/2004 |
| WO | 2007/029844 A1 | 3/2007 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic NANO-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al.. "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IgZo Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (Application No. PCT/JP2011/055002) Dated Jun. 7, 2011, in English.

Written Opinion (Application No. PCT/JP2011/055002) Dated Jun. 7, 2011, in English.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for Sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply Dram's," IEEE Transactions on Electron Devices, Jun. 1, 1994, vol. 41, No. 6, pp. 926-931.

ON state where gate potential is +3V

ON state where gate potential is +3V or +4V

ON state where gate potential is +3V, +4V or +5V

ON state where gate potential is -3V

ON state where gate potential is -3V or -2V

ON state where gate potential is -3V, -2V or -1V unit memory cell unit memory cell OFF state where gate potential is +4V OFF state where gate potential is +4V or +5V OFF state where gate potential is +4V, +5V or +6V

SEMICONDUCTOR MEMORY DEVICE

TECHNICAL FIELD

The present invention relates to a memory device using a semiconductor.

BACKGROUND ART

There are many kinds of memory devices using semiconductors. For example, a dynamic random access memory (DRAM), a static random access memory (SRAM), an electrically erasable and programmable read only memory (EEPROM), a flash memory, and the like can be given.

In a DRAM, data is stored by holding charge in a capacitor which is provided in a memory cell. However, even when a conventional transistor which has been used for switching is in an off state, a slight amount of leakage current is generated between a source and a drain; thus, the data is lost within a relatively short time (several tens of seconds at the longest). Therefore, the data needs to be rewritten (refreshed) in a certain cycle (generally several tens of milliseconds).

In an SRAM, data is held by utilizing a bistable state of a flip-flop circuit. Although a CMOS inverter is generally used in a flip-flop circuit of an SRAM, since six transistors are used in one memory cell, an integration degree of the SRAM is lower than an integration degree of a DRAM. In addition, the data is lost when power is not supplied.

On the other hand, in an EEPROM or a flash memory, a so-called floating gate is provided between a channel and a gate and charge is accumulated in the floating gate, whereby data is held. The charge accumulated in the floating gate is held even after power supply to a transistor stops, which is why these memories are called non-volatile memories. For example, Patent Document 1 may be referred to for a flash memory.

In this specification, a memory having a floating gate, examples of which are an EEPROM and a flash memory, is called a floating gate non-volatile memory (FGNVM). Since data at some stages can be held in one memory cell in an FGNVM, storage capacity can be large. Further, since the number of contact holes can be significantly decreased in a NAND-type flash memory, an integration degree can be increased to some extent.

However, in a conventional FGNVM, high voltage is needed at the time of injection of charge to a floating gate or removal of the charge. Because of this, deterioration of a gate insulating film cannot be avoided and writing and erasing cannot be repeated without limitation.

REFERENCE

[Patent Document 1] Japanese Published Patent Application No. S57-105889

DISCLOSURE OF INVENTION

As described above, a conventional semiconductor memory device has good points and bad points and there has been no semiconductor devices meeting all necessary conditions. In a memory device, reduction in power consumption is required. When the power consumption is high, the size of a device for supplying power needs to be larger, or an operating time on a battery is shortened. Moreover, a semiconductor element might be heated; thus, the characteristics of the element might be deteriorated, and in some cases, a circuit is damaged. In addition, there is preferably no limitation on the number of rewriting times of a memory device and it is desirable that rewriting can be performed one billion times or more. Needless to say, a high integration degree is also needed.

In light of these points, a DRAM has difficulty in reducing power consumption because leakage current is generated and refreshing is performed all the time. In contrast, in an SRAM, there is another problem in that the integration degree cannot be increased because six transistors are included in one memory cell. Moreover, in an FGNVM, although the power consumption and the integration degree are not problematic, the number of rewriting times is a hundred thousand or less.

In view of the above, it is the first object of one embodiment of the present invention to achieve the following three conditions at the same time: power consumed by a memory cell for holding memory is lower than that in a DRAM; the number of transistors used in a memory cell is five or less; and the number of rewriting times is one million or more. Further, it is the second object to achieve the following two conditions at the same time: data is held without power supply for 10 hours or longer, preferably 100 hours or longer; and the number of rewriting times is one million or more. Note that in this specification, a data holding time is a time needed for the amount of charge held in a memory cell to be decreased to 90% of the initial amount.

In one embodiment of the present invention, in addition to the above objects, it is another object to provide a novel semiconductor device, specifically a novel semiconductor memory device. It is another object to provide a driving method of a novel semiconductor device, specifically a driving method of a semiconductor memory device. Further, it is another object, to provide a manufacturing method of a novel semiconductor device, specifically a manufacturing method of a semiconductor memory device. One embodiment of the present invention achieves at least one of the above-described objects.

Before embodiments of the present invention are described, terms used in this specification will be briefly explained. A source and a drain of a transistor have the same or substantially the same structure and function. Even if the structures are different, in this specification, when one of a source and a drain of a transistor is called a source, the other is called a drain for convenience, and they are not particularly distinguished for the reason that a potential applied to the source or the drain or a polarity of the potential is not definite. Therefore, a source in this specification can be alternatively referred to as a drain.

In this specification, "to be orthogonal to each other (in a matrix)" means not only to intersect with each other at right angles but also to be orthogonal to each other in the simplest circuit diagram even though a physical angle is not a right angle. "To be parallel to each other (in a matrix)" means to be parallel to each other in the simplest circuit diagram even though two wirings are provided so as to physically intersect with each other.

In one embodiment of the present invention, one memory cell includes a transistor as a writing transistor, in which leakage current between a source and a drain in an off state is small, another transistor (a reading transistor), and a capacitor. The conductivity type of the reading transistor is different from the conductivity type of the writing transistor. For example, when the writing transistor has N-type conductivity, the reading transistor has P-type conductivity. Further, as wirings connected to these, at least three kinds of wirings of a writing word line, a bit line, and a reading word line are prepared.

The drain of the writing transistor is connected to a gate of the reading transistor and one electrode of the capacitor. Further, a gate of the writing transistor is connected to the writing word line; the source of the writing transistor and a source of the reading transistor are connected to the bit line; and the other electrode of the capacitor is connected to the reading word line.

In the writing transistor in an off state (in the case of an n-channel transistor, a state where the potential of the gate is lower than the potential of the source and the drain), leakage current between the source and the drain is $1\times10^{-20}$ A or smaller, preferably $1\times10^{-21}$ A or smaller at a temperature when the transistor is in use (e.g., 25° C.), or $1\times10^{-20}$ A or smaller at 85° C. In the case of a general silicon semiconductor, it is difficult to realize leakage current having such a small value; however, in a transistor obtained by processing an oxide semiconductor in a preferable condition, such a value can be achieved. Therefore, an oxide semiconductor is preferably used for a material of the writing transistor. Needless to say, if leakage current can be made to have a value smaller than or equal to the above-described value by another method with the use of a silicon semiconductor or other kinds of semiconductors, the use of such semiconductors is not precluded.

Although a variety of known materials can be used as the oxide semiconductor, a material with a band gap greater than or equal to 3 electron volts, preferably greater than or equal to 3 electron volts and less than 3.6 electron volts, is desirable. In addition, it is desirable to use a material with electron affinity greater than or equal to 4 electron volts, preferably greater than or equal to 4 electron volts and less than 4.9 electron volts. In particular, an oxide including gallium and indium is preferable for the purpose of the present invention. Among such materials, a material whose carrier concentration derived from a donor or an acceptor is less than $1\times10^{-14}$ cm$^{-3}$, preferably less than $1\times10^{-11}$ cm$^{-3}$ is desirable.

As the reading transistor, although there is no particular limitation on the leakage current between a source and a drain in an off state, smaller leakage current is preferable because power consumption can be reduced. Further, a transistor which operates at high speed is desirable in order to increase the reading speed. Specifically, it is preferable to use a transistor with switching speed of 10 nanoseconds or less. Further, in both the writing transistor and the reading transistor, gate leakage current (leakage current between the gate and the source or between the gate and the drain) needs to be extremely small. Also in the capacitor, internal leakage current (leakage current between the electrodes) needs to be small. Each leakage current is preferably $1\times10^{-20}$ A or smaller, more preferably $1\times10^{-21}$ A or smaller at a temperature when the transistor or the capacitor is in use (e.g., 25° C.).

A potential of the gate of the reading transistor is changed in accordance with a potential of the reading word line. As a result, the gate capacitance of the reading transistor is changed in some cases. That is, the gate capacitance of the reading transistor in the case where the reading transistor is in an on state may become larger than that in the case where the reading transistor is in an off state. When change in the gate capacitance is larger than the capacitance of the capacitor, a problem might be caused in operation of a memory cell.

Therefore, the capacitance of the capacitor is preferably larger than or equal to the gate capacitance of the reading transistor, more preferably larger than or equal to twice as large as the gate capacitance of the reading transistor. The capacitance of the capacitor is preferably 10 fF or smaller so that the semiconductor memory device operates at high speed.

The writing word line, the bit line, and the reading word line are arranged in a matrix. The writing word line is preferably orthogonal to the bit line, and the writing word line is preferably parallel to the reading word line so that matrix drive is performed.

An example of a memory cell having the above-described structure is illustrated in FIG. 1A. Here, a memory cell in the n-th row and the m-th column is described as an example, and n and m are natural numbers. In FIG. 1A, a memory cell including a writing transistor WTr(n,m), a reading transistor RTr(n,m), and a capacitor C(n,m) is illustrated. Here, a drain of the writing transistor WTr(n,m) is connected to a gate of the reading transistor RTr(n,m) and one electrode of the capacitor C(n,m).

Further, a gate of the writing transistor WTr(n,m) is connected to a writing word line Qn; a source of the writing transistor WTr(n,m) and a source of the reading transistor RTr(n,m) is connected to a bit line Rm; and the other electrode of the capacitor C(n,m) is connected to a reading word line Pn.

A drain of the reading transistor RTr(n,m) is connected to a bias line Sn. In FIG. 1A, the writing word line Qn, the reading word line Pn, and the bias line Sn are parallel to one another. The wiring word line Qn is orthogonal to the bit line Rm.

In FIG. 1B, the memory cell in the n-th row and the m-th column (n and m are natural numbers of 2 or more) and a portion around the memory cell are illustrated. As apparent from the diagram, three wirings per row and one wiring per column are needed; thus, (3N+M) wirings are needed in a matrix of N rows and M columns.

In the memory cell illustrated in FIG. 1A, the writing transistor WTr(n,m) is turned on by applying appropriate potential to the writing word line Qn. By the potential of the bit line Rm at this time, charge is injected to the drain of the writing transistor WTr(n,m). The amount of the charge injected at this time is determined in accordance with the potential of the bit line Rm, the gate capacitance of the reading transistor RTr(n,m), the capacitance of the capacitor C(n,m), and the like and the result is thus always almost the same in the case where the conditions are the same, and variation is small. In this manner, data is written.

Then, by applying another appropriate potential to the writing word line Qn, the writing transistor WTr(n,m) is turned off. In this case, charge in the drain of the writing transistor WTr(n,m) is kept. At the time of reading, appropriate potentials are applied to the reading word line Pn, the bias line Sn, and the like, and the reading transistor RTr(n,m) is monitored; thus, the written data can be known.

In the above structure, one bias line may be shared between two adjacent rows. An example of a memory cell having such a structure is illustrated in FIG. 5. Here, a memory cell in the (2n−1)-th row and the m-th column and an adjacent memory cell in the 2n-th row and the m-th column (n and m are natural numbers) are described as an example.

FIG. 5 illustrates the memory cell in the (2n−1)-th row and the m-th column, which includes a writing transistor WTr(2n−1,m), a reading transistor RTr(2n−1,m), and a capacitor C(2n−1,m), and the memory cell in the 2n-th row and the m-th column, which includes a writing transistor WTr(2n,m), a reading transistor RTr(2n,m), and a capacitor C(2n,m).

A drain of the writing transistor WTr(2n−1,m) is connected to a gate of the reading transistor RTr(2n−1,m) and one electrode of the capacitor C(2n−1,m). Similarly, a drain of the writing transistor WTr(2n,m) is connected to a gate of the reading transistor RTr(2n,m) and one electrode of the capacitor C(2n,m).

Further, a gate of the writing transistor WTr($2n-1$,m) is connected to a writing word line Q$2n-1$. A gate of the writing transistor WTr($2n$,m) is connected to a writing word line Q$2n$. The other electrode of the capacitor C($2n-1$,m) is connected to a reading word line P$2n-1$. The other electrode of the capacitor C($2n$,m) is connected to a reading word line P$2n$. A drain of the reading transistor RTr($2n-1$,m) and a drain of the reading transistor RTr($2n$,m) are connected to a bias line Sn. A source of the writing transistor WTr($2n-1$,m), a source of the writing transistor WTr($2n$,m), a source of the reading transistor RTr($2n-1$,m), and a source of the reading transistor RTr($2n$,m) are connected to a bit line Rm.

As apparent from the above, five wirings per two rows and one wiring per column are needed; thus, (5N+M) wirings are needed in a matrix of 2N rows and M columns. In the semiconductor memory device in FIGS. 1A and 1B, (6N+M) wirings are needed in a matrix of the same scale. Thus, one bias line is shared between two adjacent rows, so that the number of wirings can be reduced as compared to the structure illustrated in FIGS. 1A and 1B.

Alternatively, a bias line in the structure illustrated in FIGS. 1A and 1B may be substituted with a writing word line in the adjacent row. An example of a memory cell having the above-described structure is illustrated in FIG. 6A. Here, a memory cell in the n-th row and the m-th column (n and m are natural numbers) is described as an example. In FIG. 6A, a memory cell including a writing transistor WTr(n,m), a reading transistor RTr(n,m), and a capacitor C(n,m) is illustrated.

A drain of the writing transistor WTr(n,m) is connected to a gate of the reading transistor RTr(n,m) and one electrode of the capacitor C(n,m). Further, a gate of the writing transistor WTr(n,m) is connected to a writing word line Qn. A source of the writing transistor WTr(n,m) and a source of the reading transistor RTr(n,m) are connected to a bit line Rm. A drain of the reading transistor RTr(n,m) is connected to a reading word line Qn+1 in the next row. The other electrode of the capacitor C(n,m) is connected to a reading word line Pn.

In FIG. 6B, the memory cell in the n-th row and the m-th column and a portion around the memory cell are illustrated. As apparent from the diagram, two wirings per row and one wiring per column are needed; therefore, considering an end portion of a matrix, (2N+M+1) wirings are needed in matrix of N rows and M columns. Thus, the bias line in the structure in FIGS. 1A and 1B is substituted with a writing word line in the next row, so that the number of wirings can be reduced as compared to the structure in FIGS. 1A and 1B.

Another embodiment of the present invention is a semiconductor memory device including a memory unit which is formed using a plurality of writing transistors, reading transistors, and capacitors, which are similar to those used in FIGS. 1A and 1B. Here, the conductivity type of the writing transistor is different from the conductivity type of the reading transistor. For example, when the writing transistor has N-type conductivity, the reading transistor has P-type conductivity.

That is, a drain of a first writing transistor is connected to one electrode of a first capacitor and a gate of a first reading transistor, and a drain of a second writing transistor is connected to one electrode of a second capacitor and a gate of a second reading transistor.

Further, the drain of the first writing transistor is connected to a source of the second writing transistor, and a drain of the first reading transistor is connected to a source of the second reading transistor. Furthermore, a gate of the first writing transistor is connected to a first writing word line, a gate of the second writing transistor is connected to a second writing word line, the other electrode of the first capacitor is connected to a first reading word line, and the other electrode of the second capacitor is connected to a second reading word line.

A source of the first writing transistor and a source of the first reading transistor may be connected to a bit line. Note that one or more of transistors may be placed between the source of the first writing transistor and the bit line and/or between the source of the first reading transistor and the bit line.

The first writing word line, the second writing word line, the first reading word line, and the second reading word line are parallel to one another and orthogonal to the bit line.

An example of a memory unit having the above structure is illustrated in FIG. 16A. The memory unit illustrated here includes a plurality of unit memory cells each provided with one writing transistor, one reading transistor, and one capacitor. That is, illustrated is a memory unit including three memory cells, which are a first memory cell including a writing transistor WTr1, a reading transistor RTr1, and a capacitor C1, a second memory cell including a writing transistor WTr2, a reading transistor RTr2, and a capacitor C2, and a third memory cell including a writing transistor WTr3, a reading transistor RTr3, and a capacitor C3.

In each memory cell, a drain of the writing transistor is connected to one electrode of the capacitor and a gate of the reading transistor. Potentials of intersections at which these transistors and the capacitors are connected to one another relate to on and off of the reading transistors; therefore, hereinafter, these intersections are referred to as nodes F1, F2, and F3.

The drain of the writing transistor WTr1 is connected to a source of the writing transistor WTr2, and a drain of the reading transistor RTr1 is connected to a source of the reading transistor RTr2. Further, the drain of the writing transistor WTr2 is connected to a source of the writing transistor WTr3, and a drain of the reading transistor RTr2 is connected to a source of the reading transistor RTr3.

In this example, a drain of the reading transistor RTr3 is connected to a bias line S. One or more of transistors may be provided between the drain of the reading transistor RTr3 and the bias line S. Further, a source of the writing transistor WTr1 and a source of the reading transistor RTr1 are connected to a bit line R. Gates of the writing transistors WTr1, WTr2, and WTr3 are connected to writing word lines Q1, Q2, and Q3, respectively. The other electrodes of the capacitors C1, C2, and C3 are connected to reading word lines P1, P2, and P3, respectively.

The writing word lines Q1, Q2, and Q3 and the reading word lines P1, P2, and P3 are parallel to one another and orthogonal to the bit line R. In the case where the bias line S is kept at a constant potential, the bias line S is not necessarily parallel to or orthogonal to other wirings. Note that the bias line S is preferably orthogonal to the bit line for increasing the integration degree.

Thus, the three memory cells share one contact provided between the bit line and the memory cells, so that an area of the contact of the portion per unit memory cell can be reduced and the integration degree can be increased. An example in which three memory cells are provided in a memory unit is illustrated in FIG. 16A; however, one memory unit may include four or more memory cells. For example, one memory unit may include 16 memory cells, or 32 memory cells.

Such a structure is similar to the NAND structure of a flash memory. As illustrated in FIG. 16A, when memory cells are connected in series, a larger number of memory cells can share one contact provided between one bit line and the memory cells, whereby an area per unit memory cell can be reduced. For example, given that the minimum feature size is F, an area per unit memory cell in a semiconductor memory device can be reduced to 12 $F^2$ or less.

The circuit diagram illustrated in FIG. 16A is one of memory units used in a semiconductor memory device. The semiconductor memory device is obtained by arranging these memory units in matrix. FIG. 19 illustrates an example of the structure.

Here, illustrated are eight memory units of a memory unit in the n-th row and the (m−1)-th column, a memory unit in the n-th row and the m-th column, a memory unit in the n-th row and the (m+1)-th column, a memory unit in the n-th row and the (m+2)-th column, a memory unit in the (n+1)-th row and the (m−1) column, a memory unit in the (n+1)-th row and the m-th column, a memory unit in the (n+1)-th row and the (m+1)-th column, and a memory unit in the (n+1)-th row and the (m+2) column, in which 24 memory cells are included in total.

In the memory unit in the n-th row and the m-th column, writing word lines Q1$n$, Q2$n$, and Q3$n$, reading word lines P1$n$, P2$n$, and P3$n$, a bias line S$n$, and a bit line R$m$ are provided. The other memory units are provided with similar wirings.

Another embodiment of the present invention is a semiconductor memory device including a memory unit similar to that illustrated in FIG. 16A, which is formed using a plurality of writing transistors, reading transistors, and capacitors. That is, a drain of a first writing transistor is connected to one electrode of a first capacitor and a gate of a first reading transistor, a drain of a second writing transistor is connected to one electrode of a second capacitor and a gate of a second reading transistor, and a drain of a third writing transistor is connected to one electrode of a third capacitor and a gate of a third reading transistor.

Further, the drain of the first writing transistor is connected to a source of the second writing transistor, and a drain of the first reading transistor is connected to a source of the second reading transistor. Similarly, the drain of the second writing transistor is connected to a source of the third writing transistor, and a drain of the second reading transistor is connected to a source of the third reading transistor.

Furthermore, a gate of the first writing transistor is connected to a first writing word line, the other electrode of the first capacitor and a gate of the second writing transistor are connected to a second writing word line, and the other electrode of the second capacitor and a gate of the third writing transistor are connected to a third writing word line.

A source of the first writing transistor and a source of the first reading transistor may be connected to a bit line. Note that one or more of transistors may be placed between the source of the first writing transistor and the bit line and/or between the source of the first reading transistor and the bit line.

The first writing word line, the second writing word line, and the third writing word line are parallel to one another and orthogonal to the bit line.

An example of a memory unit having the above structure is illustrated in FIG. 16B. The memory unit illustrated in FIG. 16B includes a plurality of unit memory cells each provided with one writing transistor, one reading transistor, and one capacitor. That is, illustrated is a memory unit including three memory cells, which are a first memory cell including a writing transistor WTr1, a reading transistor RTr1, and a capacitor C1, a second memory cell including a writing transistor WTr2, a reading transistor RTr2, and a capacitor C2, and a third memory cell including a writing transistor WTr3, a reading transistor RTr3, and a capacitor C3.

In each memory cell, a drain of the writing transistor, one electrode of the capacitor, and a gate of the reading transistor are connected to one another. Potentials of intersections at which these transistors and the capacitors are connected to one another relate to on and off of the reading transistors; therefore, hereinafter, these intersections are referred to as nodes F1, F2, and F3.

The drain of the writing transistor WTr1 is connected to a source of the writing transistor WTr2, and a drain of the reading transistor RTr1 is connected to a source of the reading transistor RTr2. Further, the drain of the writing transistor WTr2 is connected to a source of the writing transistor WTr3, and a drain of the reading transistor RTr2 is connected to a source of the reading transistor RTr3.

In this example, a drain of the reading transistor RTr3 is connected to a bias line S. One or more of transistors may be provided between the drain of the reading transistor RTr3 and the bias line S. Further, a source of the writing transistor WTr1 and a source of the reading transistor RTr1 are connected to a bit line R. Gates of the writing transistors WTr1, WTr2, and WTr3 are connected to writing word lines Q1, Q2, and Q3, respectively. The other electrodes of the capacitors C1 and C2 are connected to the writing word lines Q2 and Q3, respectively. The other electrode of the capacitor C3 is connected to a reading word line P.

The writing word lines Q1, Q2, and Q3 and the reading word line P are parallel to one another and orthogonal to the bit line R. In the case where the bias line S is kept at a constant potential, the bias line S is not necessarily parallel to or orthogonal to other wirings. Note that the bias line S is preferably orthogonal to the bit line for increasing the integration degree.

As in the memory unit illustrated in FIG. 16A, the three memory cells share one contact provided between the bit line and the memory cells, so that an area of the contact of the portion per unit memory cell can be reduced and the integration degree can be increased. A larger number of memory cells can share one contact provided between one bit line and the memory cells, whereby an area per unit memory cell can be reduced.

In addition, in the structure illustrated in FIG. 16B, an effect of reduction in area can be obtained by substituting part of the reading word line needed for the structure illustrated in FIG. 16A with a writing word line. By such an effect, for example, an area per unit memory cell in a semiconductor memory device can be reduced to $9F^2$ or less.

Although several structures are described above as means for achieving the objects, a different means is also disclosed in this specification. Further, the objects can be achieved also by making modifications obvious to those skilled in the art to the above structures or any means for achieving the objects which is disclosed in this specification. Therefore, means for achieving the objects are not limited to the above three structures.

At least one of the above objects can be achieved by employing any of the above-described structures. In each of the above structures, since the writing operation is performed by turning a transistor on or off, the problem of deterioration of an insulating film cannot occur. Therefore, there is substantially no limit on the number of rewriting times in the semiconductor memory devices having the above-describe structures.

The semiconductor memory devices having the above-described structures also shows excellent characteristics related to a period during which data can be held. Charge can be held for 10 hours or longer, preferably 100 hours or longer by making leakage current between the source and the drain of the transistor in an off state which is used, gate leakage current, and internal leakage current in the capacitor meet the above-described conditions. Moreover, by improving conditions, charge can be held for one month or longer, or one year or longer.

In the case where the charge is reduced due to the leakage current, refreshing may be performed similarly to a conventional DRAM; an interval between refreshing operations is determined in accordance with a period during which the charge can be held. In the case where the charge is held for such a long period as described above, refreshing is necessary, for example, only once a month or once a year. Frequent refreshing which is needed in a conventional DRAM is not necessary and thus power consumption of a semiconductor memory device is reduced.

Note that in the semiconductor memory devices having the above structures, data is not lost by operation of reading the data. Such a feature could be realized only in an SRAM. In the semiconductor memory devices having the above structures, the number of transistors used in one memory cell is five or less, typically two, which is smaller than that in the case of a conventional SRAM. Furthermore, when one of the transistors is formed using an oxide semiconductor in a thin film shape, the integration degree can be increased because the transistor can be stacked over a conventional silicon semiconductor.

As for the integration degree, in the semiconductor memory devices having the above structures, an absolute value of necessary capacitance for a memory cell can be reduced. In a DRAM, for example, capacitance of at least 30 fF is needed because operation is interfered unless the capacitance of a memory cell is almost the same as or larger than the wiring capacitance. However, capacitance is proportional to the area. In the case where the integration degree is increased, the area of one memory cell decreases; thus, necessary capacitance cannot be secured. For this reason, a capacitor having a large capacitance needs to be formed in a DRAM by employing a special shape or a special material.

On the other hand, the capacitance of the capacitor in the semiconductor memory devices having the above structures can be determined by a relative proportion to the gate capacitance of the reading transistor. That is, as the integration degree is increased, the gate capacitance of the reading transistor is decreased; therefore, the capacitance necessary in the capacitor is also decreased in the same proportion. Therefore, even when the integration degree is increased, a capacitor having basically the same structure can be used.

Further, in the semiconductor memory devices having the above-described structures, high voltage, which is needed for writing and erasing in an FGNVM, is not needed. Among FGNVMs, a so-called flash memory (especially a NAND-type flash memory) is superior to an SRAM and a DRAM in view of the integration degree; however, in order that even part of data be rewritten, data in a predetermined region needs to be collectively erased with the use of high voltage. In this respect, in the semiconductor memory devices having the above structures, writing (rewriting) is performed per row and thus completes through the minimum necessary operation.

Further, since at the time of writing, charge is injected to the floating gate in one direction in a non-equilibrium state in an FGNVM, a variation in the amount of charge is large. Data at a plurality of stages which depends on the amount of the charge held in the floating gate can be stored. However, when the variation in the amount of the charge is considered, data at around four stages (2 bits) is general. Higher voltage needs to be used in order that data of a larger number of bits be stored.

On the other hand, charge is reversibly injected to the capacitor in the structures described above, and thus a variation is small; for example, a variation in the threshold voltage of the reading transistor due to injection of charge can be 0.5 volts or smaller. Thus, data at more stages can be held in one memory cell within a narrower voltage range; consequently, voltage for writing or reading can be lower. For example, voltage used for writing or reading data of 4 bits (16 stages) can be 10 volts or lower.

BEST MODE FOR CARRYING OUT THE INVENTION

Figure 1A:
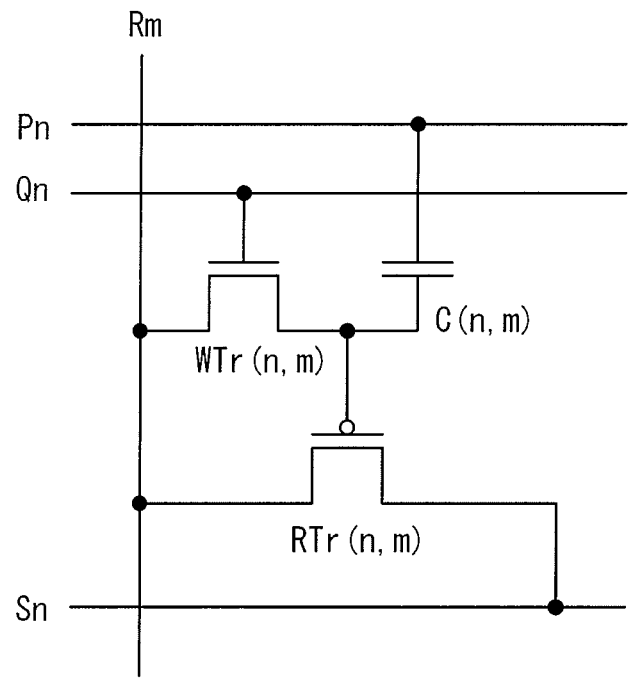
FIGS. 1A and 1B illustrate an example of a semiconductor memory device of the present invention.

Hereinafter, embodiments will be described with reference to drawings. Note that the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

The structures, the conditions, and the like disclosed in any of the following embodiments can be combined with those disclosed in other embodiments as appropriate. Note that in structures described below, the same portions or portions having similar functions are denoted by the same reference numerals in different drawings, and detailed description thereof is not repeated in some cases.

Further, in the embodiments described below, for easy understanding, timing, width, height, or the like of a pulse is explained to have a fixed value; however, in consideration of the spirit of the present invention, it can be easily understood that the timing of the pulse is not necessarily synchronized or the width or height of the pulse is not necessarily fixed.
(Embodiment 1)

Figure 1B:
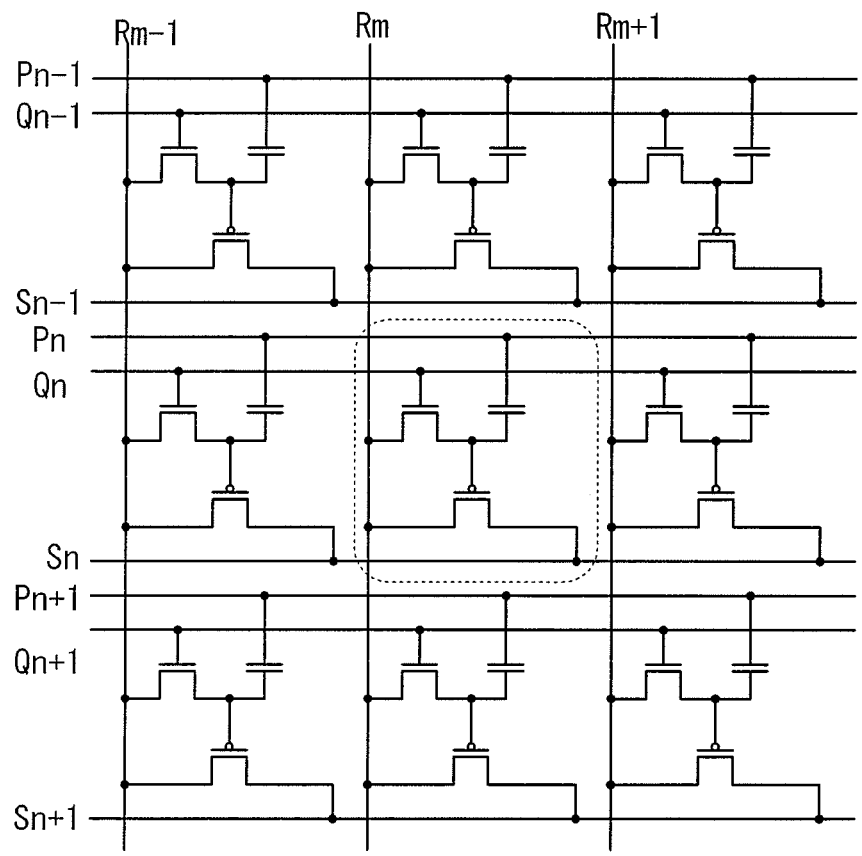

In this embodiment, an example of operation of the semiconductor memory device illustrated in FIGS. 1A and 1B is described with reference to FIGS. 4A to 4F. Note that specific values are given below as potentials for the purpose of aid for understanding a technical idea. Needless to say, such values are changed in accordance with various characteristics of a transistor, a capacitor, or the like, or for convenience of the practitioner. Further, the semiconductor memory device illustrated in FIGS. 1A and 1B can write and read data by a method other than a method described below.

Here, the writing transistor WTr(n,m) is an n-channel transistor and the reading transistor RTr(n,m) is a p-channel transistor. The writing transistor WTr(n,m) is turned on (current flows through the transistor) when a potential of the gate is higher than a potential of either the source or the drain by 1 V or more, and the writing transistor is in an off state (current does not flow) under the other conditions. The reading transistor RTr(n,m) is turned on (current flow through the transistor) when a potential of the gate is lower than a potential of either the source or the drain by 1 V or more, and the reading transistor is in an off state (current does not flow) under the other conditions.

A portion of the gate capacitance of the reading transistor RTr(n,m), which is changed due to the gate bias, is negligible as compared to the capacitance of the capacitor C(n,m). Further, the parasitic capacitance of the writing transistor WTr(n,m), the parasitic capacitance of the reading transistor RTr(n,m), the parasitic capacitance generated between wirings, and the like, which are not illustrated in the drawings, are considered to be 0. In FIGS. 4A to 4F, a circle is on a transistor in an on state, and a cross mark is on a transistor in an off state. A description may be written in the drawings when a transistor is turned on under a specific condition.

Figure 4A:
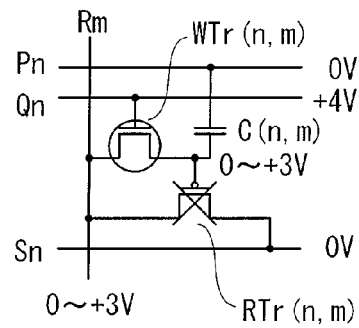
FIGS. 4A to 4F illustrate an example of a driving method of a semiconductor memory device of the present invention.

At the time of writing, as illustrated in FIG. 4A, a potential of the reading word line Pn and a potential of the bias line Sn are set to 0 V. A potential of the bit line Rm is set to a value at one of four levels of 0 V, +1 V, +2 V, and +3 V, in accordance with data to be written. When a potential of the writing word line Qn is +4 V, the writing transistor WTr(n,m) is turned on and a potential of the drain of the writing transistor WTr(n,m) becomes close to a potential of the source of the writing transistor (i.e., the potential of the bit line Rm). Here, the potential of the drain of the writing transistor WTr(n,m) becomes equal to the potential of the bit line Rm.

On the other hand, a potential of the gate of the reading transistor RTr(n,m) is equal to the potential of the drain of the writing transistor WTr(n,m) at this stage. That is, the potential of the gate of the reading transistor RTr(n,m) is higher than or equal to 0 V and equal to a potential of the source of the reading transistor RTr(n,m) (i.e., the potential of the bit line Rm).

A potential of the drain of the reading transistor RTr(n,m) (i.e., the potential of the bias line Sn) is 0 V. Accordingly, the potential of the gate of the reading transistor RTr(n,m) is higher than or equal to the potential of the source or the drain, so that the reading transistor RTr(n,m) is in an off state. Thus, data can be written.

Note that keeping the reading transistor RTr(n,m) in an off state as much as possible even at the time of writing is effective in reducing leakage current of the reading transistor RTr(n,m), which flows from the gate to the source or from the gate to the drain. In general, such leakage current increases when a transistor is in an on state and extremely decreases when a transistor is in an off state.

Because such leakage current is leak of charge held in the capacitor C(n,m), the more leakage current flows, the more a data holding time is decreased. In this embodiment, the reading transistor RTr(n,m) is turned on only at the time of reading, which is excellent in storage of data.

Figure 4B:
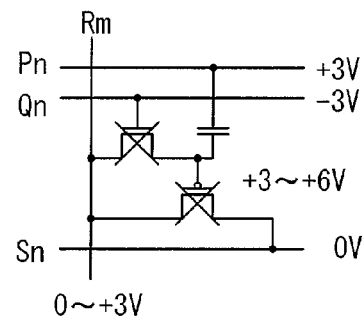

Next, in the case where writing is performed in a row other than the n-th row, as illustrated in FIG. 4B, the potential of the writing word line Qn is set to −3 V. In addition, the potential of the reading word line Pn is set to +3 V and the potential of the bias line Sn is set to 0 V. The potential of the bit line Rm is set to a value at one of four levels of 0 V; +1 V, +2V, and +3 V, in accordance with data to be written in the row where writing is performed.

Since the drain of the writing transistor WTr(n,m) is connected to the reading word line Pn through the capacitor C(n,m), the potential of the drain of the writing transistor WTr(n,m) is increased by 3 V in accordance with change in the potential of the reading word line Pn (i.e., increase in potential from 0 V, which is the state illustrated in FIG. 4A, to +3 V, which is the state illustrated in FIG. 4B). That is, the potential of the drain of the writing transistor WTr(n,m) is set to +3 V, +4 V, +5 V, or +6 V, in accordance with the written data.

In this state, the potential (−3 V) of the gate of the writing transistor WTr(n,m) is lower than the potential (0 V to +3 V) of the source of the writing transistor WTr(n,m) (the potential of the bit line Rm and the potential (+3 V to +6 V) of the drain of the writing transistor WTr(n,m), so that the writing transistor WTr(n,m) is turned off.

Further, the potential (+3 V to +6 V) of the gate of the reading transistor RTr(n,m) is higher than the potential (0 V to +3 V) of the source of the reading transistor RTr(n,m) (i.e., the potential of the bit line Rm) and the potential (0 V) of the drain of the reading transistor RTr(n,m) (i.e., the potential of the bias line Sn), so that the reading transistor RTr(n,m) is in an off state.

Figure 4C:
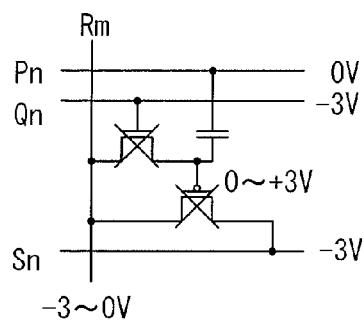

Next, the reading will be described. As illustrated in FIG. 4C, the potential of the writing word line Qn and the potential of the bias line Sn are set to −3 V. The potential of the reading word line Pn is set to 0 V. In this state, the potential of the drain of the writing transistor WTr(n,m) is set to 0 V, +1 V, +2 V, or +3 V in accordance with the written data. When the potential of the bit line Rm is higher than or equal to −3 V and lower than or equal to 0 V, both the writing transistor WTr(n,m) and the reading transistor RTr(n,m) are in an off state. That is, a writing transistor and a reading transistor in a row where reading is not performed are set in an off state in this manner.

On the other hand, the potential of the reading word line Pn in the row where reading is performed is set to −3 V. Thus, the potential of the gate of the reading transistor RTr(n,m) is set to −3 V, −2 V, −1 V, or 0V in accordance with the written data. The potential of the bit line Rm is −3 V. At this time, when the potential of the bias line Sn is −3 V, the reading transistor RTr(n,m) is in an off state.

Figure 4D:
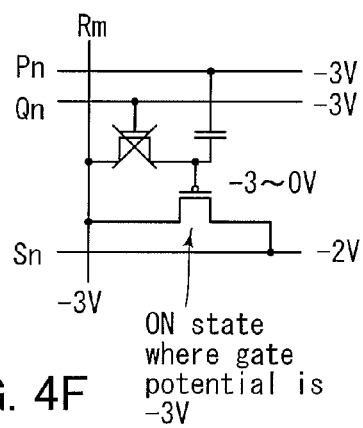

However, as illustrated in FIG. 4D, when the potential of the bias line Sn is set to −2 V, the reading transistor RTr(n,m) is turned on in the case where the potential of the gate of the reading transistor RTr(n,m) is −3 V.

When the reading transistor RTr(n,m) is turned on, current flows through the bit line Rm; thus, by detection of the current, it can be known that the reading transistor RTr(n,m) is in an on state. Alternatively, when a capacitor is provided in an end portion of the bit line Rm, the initial potential (−3 V) of the bit line Rm becomes close to the potential of the bias line Sn. Also in this case, it can be known that the reading transistor RTr(n,m) is in an on state.

Figure 4E:
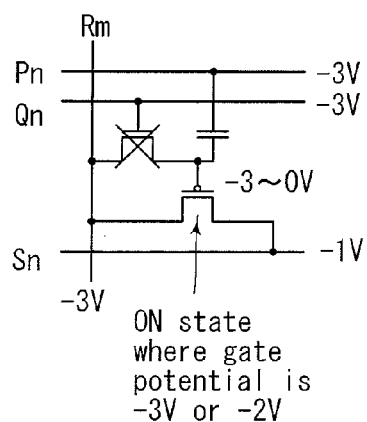

Similarly, as illustrated in FIG. 4E, when the potential of the bias line Sn is set to −1 V, the reading transistor RTr(n,m) is turned on in the case where the potential of the gate of the reading transistor RTr(n,m) is −3 V or −2 V.

Figure 4F:
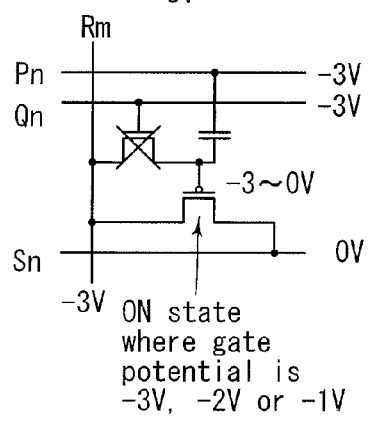

Further, as illustrated in FIG. 4F, when the potential of the bias line Sn is set to 0 V, the reading transistor RTr(n,m) is turned on in the case where the potential of the gate of the reading transistor RTr(n,m) is −3 V, −2 V, or −1 V.

It can be assumed that the potential of the gate of the reading transistor RTr(n,m) is 0 V in the case where the reading transistor RTr(n,m) remains off even when the potential of the bias line is set to 0 V.

In this manner, the data (2 bits) at four stages can be written and read. Needless to say, in a similar manner, much more data such as data (3 bits) at eight stages or data (4 bits) at 16 stages can be written and read.

In the above description, although the parasitic capacitance and the gate capacitance of the reading transistor RTr(n,m) are ignored as compared to the capacitance of the capacitor C(n,m), voltage to be applied needs to be determined in view of these capacitance in an actual memory cell.

The gate capacitance of the reading transistor RTr(n,m) in an on state and that in an off state greatly varies; therefore, the potential of the gate of the reading transistor RTr(n,m) is influenced by the variation. As the ratio of the gate capacitance of the reading transistor RTr(n,m) to the capacitance of the capacitor C(n,m) is higher, the influence is bigger. Accordingly, the capacitance of the capacitor C(n,m) is preferably larger than or equal to twice as large as the gate capacitance of the reading transistor RTr(n,m).

Note that in order that data at some stages (multivalued data) be stored by making the amount of the charge held in the memory cell be at a plurality of stages, it is necessary that variation in the amount of the charge held is small. In the semiconductor memory circuit and the semiconductor memory device which are described in this embodiment, variation in the amount of the charge held is small, which is suitable for this purpose.

(Embodiment 2)

In this embodiment, timings when signals are applied to a variety of wirings in the writing method and the reading method of the semiconductor memory device described in Embodiment 1 will be described. First, the writing method will be described with reference to FIG. 2.

As described in Embodiment 1, signals depending on data are applied to bit lines (Rm−1, Rm, Rm+1, and the like). Here, the potential of the bit line is higher than or equal to VRM and lower than or equal to VRH. A signal with which a writing transistor is turned on is sequentially applied to a writing word line (e.g., Qn) in a row including a memory cell in which writing is to be performed, and a reading word line (e.g., Pn) and a bias line (e.g., Sn) in the same row are supplied with signals with which a potential of each line becomes an appropriate value. The potential of the writing word line at this time is VQH, the potential of the reading word line at this time is VPM, and the potential of the bias line at this time is VSM.

On the other hand, signals with which a writing transistor is turned off is applied to writing word lines in the other rows, and reading word lines and bias lines in the other rows are supplied with signals with which a potential of each line becomes an appropriate value. The potential of the writing word line at this time is VQL, the potential of the reading word line at this time is VPM, and the potential of the bias line at this time is VSH.

Here, in order that the reading transistor be in an off state, the potential VPH of the reading word line is preferably higher than or equal to (VPM+(VRH−VRM)) and the potential VSH of the bias line is preferably lower than or equal to (VRM+(VPH−VPM)). For example, supposing that the potential of the bit line is set to a value at one of four levels of VRM, VRM+α, VRM+2α, and VRM+3α (α>0), since VRH=VRM+3α, the potential VPH of the reading word line is preferably higher than or equal to (VPM+3α).

In Embodiment 1, the above condition is satisfied with VRM=0 [V], α=1 [V], VPM=0 [V], VSM=0 [V], VPH=+3 [V], and VSH=0 [V]. Although the potential (VSM or VSH) of the bias line is constantly kept at 0 V (i.e., VSM=VSH=0) at the time of writing in Embodiment 1, the potential may be changed in the case where data is written in the row and in the case where data is not written in the row.

Figure 2:
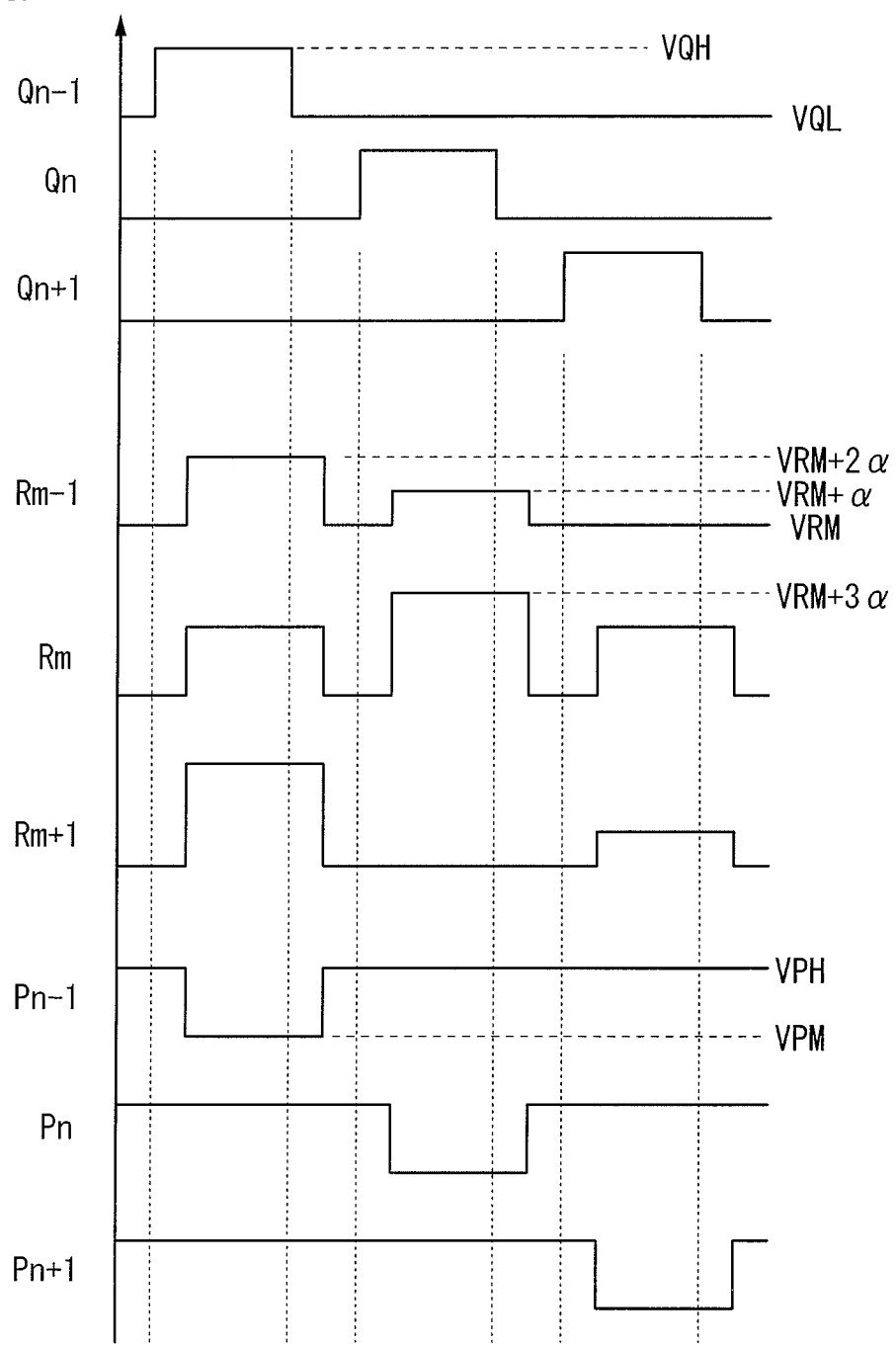
FIG. 2 illustrates an example of a driving method (writing) of a semiconductor memory device of the present invention.

FIG. 2 illustrates a timing chart of the signals in consideration of the above. In FIG. 2, examples of pulses applied to the writing word lines (Qn−1, Qn, and Qn+1), the bit lines (Rm−1, Rm, and Rm+1), and the reading word lines (Pn−1, Pn, and Pn+1) are illustrated. The wave height of a pulse and the magnitude of amplitude of a pulse are conceptual. A period for which the pulse continues may be determined in consideration of the characteristics of the writing transistor.

In FIG. 2, the pulses each applied to the writing word lines (Qn−1, Qn, and Qn+1) are prevented from overlapping with one another; however, for example, part of a period in which the pulse is applied to the writing word line Qn−1 may overlap with a period in which the pulse is applied to the writing word line Qn. Further, VQL needs to be lower than or equal to the threshold voltage of the writing transistor, and is set to −3 V in Embodiment 1. Moreover, VQH needs to be higher than or equal to the threshold voltage of the writing transistor, and is set to +4 V in Embodiment 1. Note that VQL and VQH can have other values.

The signals applied to the bit lines (Rm−1, Rm, and Rm+1) include a plurality of pulses and the height of the pulses can be various. Here, the pulses have four stages of VRM, VRM+α, VRM+2α, and VRM+3α (α>0). These pulses are not completely synchronized with the pulses applied to the writing word lines, but application of the pulses to the bit lines is preferably started after a predetermined period ($\tau_1$) after application of the pulses to the writing word lines is started, and the application of the pulses to the bit lines is preferably stopped after a predetermined period ($\tau_2$) after the application of the pulses to the writing word lines is stopped. Here, $\tau_1$ and $\tau_2$ may be set so that $\tau_1 < \tau_2$ or $\tau_1 > \tau_2$; however, for design of a circuit, it is preferable that they be set so that $\tau_1 = \tau_2$.

The pulses applied to the reading word lines (Pn−1, Pn, and Pn+1) may be synchronized with the pulses applied to the writing word lines or may be slightly delayed. In order that the potential of the drain of the writing transistor be certainly set to a predetermined value, application of the pulses to the reading word lines (Pn−1, Pn, and Pn+1) is preferably stopped after a predetermined period after the application of the pulses to the writing word lines in the same row is stopped.

In this manner, the potential of the drain of the writing transistor in each memory cell is determined. Based on the potential, the amount of charge generated in the drain of each of the writing transistors is determined. Here, the amount of charge in each of the memory cells is shown in Table 1 when the amount of charge corresponding to the potential VRL is Q0, that corresponding to the potential VRL+α is Q1, that corresponding to the potential VRL+2α is Q2, and that corresponding to the potential VRL+3α is Q3. When a transistor having small leakage current between a source and a drain in an off state is used as the writing transistor, these charges can be held for an extremely long time (10 hours or longer) even after power supply to the semiconductor memory device is stopped.

TABLE 1

|  | (m − 1)-th column | m-th column | (m + 1)-th column |
|---|---|---|---|
| (n − 1)-th row | Q2 | Q2 | Q3 |
| n-th row | Q1 | Q3 | Q0 |
| (n + 1)-th row | Q0 | Q2 | Q1 |

Figure 3A:
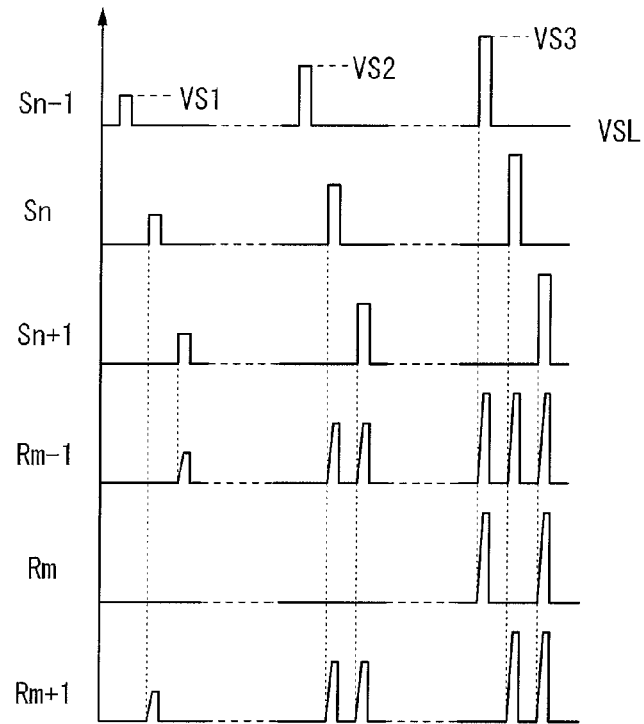
FIGS. 3A to 3C illustrate an example of a driving method (reading) of a semiconductor memory device of the present invention.
Figure 3B:
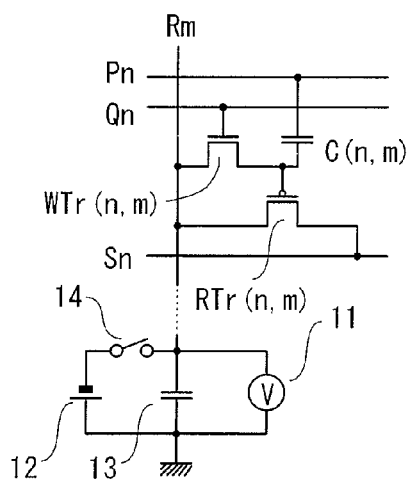

Next, the reading method will be described with reference to FIGS. 3A and 3B. FIG. 3B illustrates a principle of an example of a method for performing reading. As illustrated in FIG. 3B, a capacitor 13, a means 11 for measuring a potential of an electrode of the capacitor 13, a means 12 for supplying a potential to the capacitor 13, and a switch 14 are provided at an end portion of the bit line Rm.

First, the switch 14 is turned on, and a potential of an electrode on a memory cell side (located on an upper side in FIG. 3B) of the capacitor 13 (i.e., the potential of the bit line Rm) is set to a certain potential VRL by the means 12 for supplying a potential to the capacitor 13. Then, the switch 14 is turned off. After that, when a potential of the bit line Rm is changed for some reason, change in the potential can be observed by the means 11 for measuring a potential of the electrode of the capacitor. After a series of operations is finished, the potential of the bit line Rm is set to VRL again.

In the row where the reading is performed, the reading transistor is turned on and off in accordance with the potential of the bias line. For example, as illustrated in FIG. 3A, pulses each at one of three levels of height (VS1, VS2, or VS3) are sequentially input to the bias lines Sn−1, Sn, and Sn+1.

As is apparent from the description with reference to FIGS. 4D to 4F in Embodiment 1, the reading transistor can be in an on state or in an off state in accordance with the potential of the gate of the reading transistor and the potential of the bias line. Here, the reading transistor is turned on with the pulse at the height VS1 in the case where the charge held in the memory cell is Q0. The reading transistor is turned on with the pulse at the height VS2 in the case where the charge held in the memory cell is Q0 or Q1. The reading transistor is turned on with the pulse at the height VS3 in the case where the charge held in the memory cell is Q0, Q1, or Q2.

When the reading transistor is turned on, the potential of the bit line becomes close to or equal to the potential of the bias line. The means 11 for measuring a potential of the electrode of the capacitor in FIG. 3B measures this change, whereby whether the reading transistor is turned on can be observed.

For example, when the three pulses each at a different level of height are applied in one memory cell, the potential of the capacitor is changed in response to every pulse in the case where the charge held in the memory cell is Q0. That is, three pulses are observed.

On the contrary, in the case where the charge held in the memory cell is Q1, the potential of the capacitor is not changed in response to the lowest pulse but is changed in response to the other two pulses, so that two pulses are observed. Similarly, in the case where the charge held in the memory cell is Q2, the potential of the capacitor is changed in response to only the highest pulse, so that one pulse is observed, and in the case where the charge held in the memory cell is Q3, the potential of the capacitor is not changed in response to any of pulses, so that no pulse is observed.

Thus, the number of times of generating a pulse in each memory cell is recorded, whereby data written in the memory cell can be known. For example, according to FIG. 3A, in the memory cell in the (n+1)-th row and the (m−1)-th column, a pulse is generated three times for one reading operation. This is because the charge held is Q0, so that the reading transistor is turned on in response to all the pulses which are applied to the bias line Sn, and the bit line Rm has the same potential as the bias line Sn or the potential of the bit line Rm becomes close to the potential of the bias line Sn.

On the other hand, in a memory cell in the n-th row and the m-th column, no pulse is generated. This is because the amount of charge in the memory cell is Q3 that is the largest and the reading transistor is not turned on even with the pulse at the height VS3 that is the highest pulse. Results of adding up the number of pulses generated in each of the memory cells in this manner are shown in Table 2. In this manner, data stored in each memory cell can be read. In the example above, data is sequentially read per row; it is also possible that only data in a specific memory cell is read in a similar manner.

TABLE 2

|  | (m − 1)-th column | m-th column | (m + 1)-th column |
|---|---|---|---|
| (n − 1)-th row | 1 | 1 | 0 |
| n-th row | 2 | 0 | 3 |
| (n + 1)-th row | 3 | 1 | 2 |

Figure 3C:
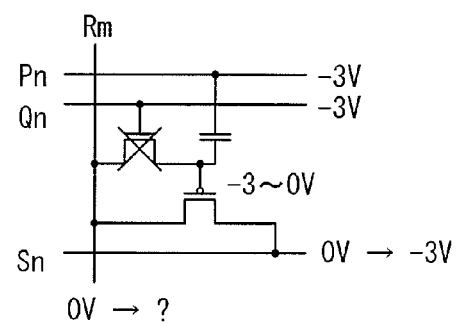

Note that data can be known by directly observing voltage as well as by knowing the amount of charge held in the memory cell by the number of the generated pulses, as described above. For example, as illustrated in FIG. 3C, when the potential of the reading word line Pn is set to −3 V and the potential of the writing word line Qn is set to −3 V, the writing transistor WTr(n,m) is in an off state and the potential of the gate of the reading transistor RTr(n,m) is higher than or equal to −3 V and lower than or equal to 0 V.

Further, the capacitor 13 illustrated in FIG. 3B is connected to the end portion of the bit line Rm, and the potential of the bit line Rm is 0 V. Supposing that the initial potential of the bias line Sn is 0 V, the reading transistor RTr(n,m) is in an on state at this state in the case where the potential of the gate of the reading transistor RTr(n,m) is −3 V, −2 V, or −1 V, but current does not flow because the potential of the source and the potential of the drain are equal. In the case where the potential of the gate of the reading transistor RTr(n,m) is 0 V, the reading transistor RTr(n,m) is in an off state.

Then, when the potential of the bias line Sn is decreased to −3 V, current flows between the source and the drain of the reading transistor RTr(n,m) in the case where the potential of the gate of the reading transistor RTr(n,m) is other than 0 V. Note that since the capacitor 13 is provided at the end portion of the bit line Rm, current stops flowing when the potential of the bit line Rm reaches a predetermined value.

For example, supposing that the potential of the gate of the reading transistor RTr(n,m) is −2 V, the potential of the bit line Rm is decreased from 0 V. At a stage where the potential of the bit line Rm reaches −1 V, in the reading transistor RTr(n,m), the potential of the gate (−2 V) is lower than the potential of the source (−1 V) by 1 V, so that the reading transistor RTr(n, m) is in an on state. When the potential of the bit line Rm is further decreased, in the reading transistor RTr(n,m), the difference between the potential of the gate (−2 V) and the potential of the source (the potential of the bit line Rm and lower than −1V) becomes less than 1 V, so that the reading transistor RTr(n,m) is turned off. As a result, the amount of charge of the bit line Rm is not changed and the potential of the bit line Rm is approximately constant.

In this case, the potential of the bit line Rm is lower than −1 V but the reading transistor RTr (n,m) is turned off before the potential of the bit line Rm is decreased to −2 V, so that the potential of the bit line Rm is higher than or equal to −2 V and lower than −1 V. The potential of the bit line Rm at this time can be detected by the means 11 for measuring a potential illustrated in FIG. 3B. That is, when the potential of the bit line Rm is higher than or equal to −2 V and lower than −1 V, it can be assumed that the potential of the gate of the reading transistor RTr(n,m) is −2 V; accordingly, data which is written in the memory cell can be known.

Similarly, when the potential of the gate of the reading transistor RTr(n,m) is −3 V or −1 V, the potential of the bit line Rm is higher than or equal to −3 V and lower than −2 V, or higher than or equal to −1 V and lower than 0 V, respectively. When the potential of the gate of the reading transistor RTr (n,m) is 0 V, the potential of the bit line Rm is not changed from 0V because the reading transistor RTr(n,m) remains in an off state. Also in such a manner, the amount of charge at the time of writing can be known.

(Embodiment 3)

In this embodiment, examples of a shape and a manufacturing method of the semiconductor memory device described in Embodiment 1 and 2 will be described. In this embodiment, an oxide semiconductor containing zinc and indium is used for the writing transistor WTr and a single crystal silicon semiconductor is used for the reading transistor RTr. Therefore, the writing transistor WTr is stacked over the reading transistor RTr.

That is, an insulated gate transistor including a single crystal silicon semiconductor which is provided over a single crystal silicon substrate is used as the reading transistor RTr and a transistor in which an oxide semiconductor is used is formed thereover as the writing transistor WTr. Note that although an example in which a semiconductor memory device is formed over a single crystal silicon substrate is described in this embodiment, the semiconductor memory device can be provided over another kind of substrate.

Figure 7A:
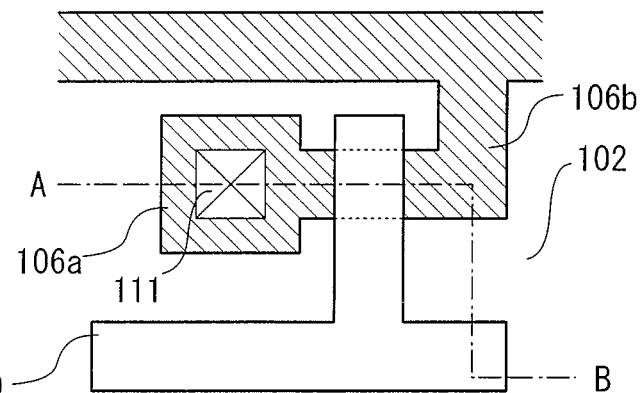
FIGS. 7A to 7C illustrate an example of layout and the like of wirings of a semiconductor memory device of the present invention.
Figure 7B:
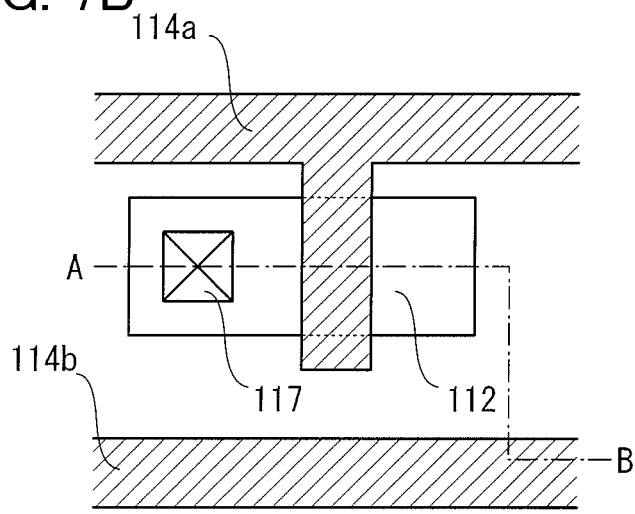
Figure 7C:
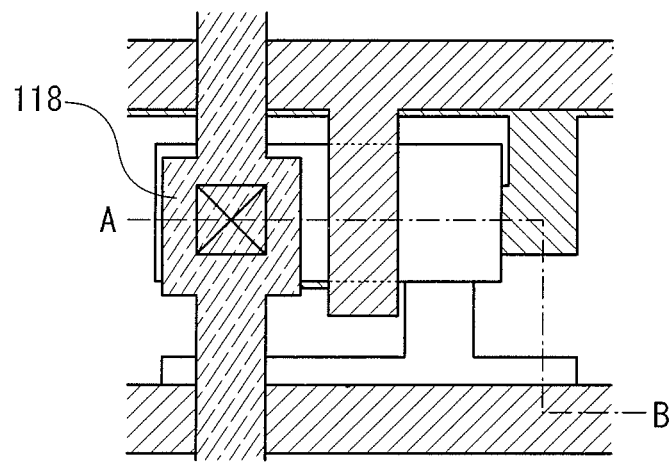

An example of layout of a memory cell of the semiconductor memory device in this embodiment is illustrated in FIGS. 7A to 7C. In FIG. 7A, main wirings, main electrodes, and the like provided over a single crystal silicon substrate are illustrated. An element separation region 102 is formed over the substrate. Conductive regions 106a and 106b are formed using a conductive material or doped silicon over the substrate, and part thereof serves as a source and a drain of the reading transistor RTr. Part of the conductive region 106b serves as a bias line. The conductive regions 106a and 106b are separated from each other by a reading gate 110 of the reading transistor RTr. A first connection electrode 111 is provided in the conductive region 106a.

Main wirings, main electrodes, and the like, focusing on the transistor including an oxide semiconductor, which is formed over the circuit illustrated in FIG. 7A, are illustrated in FIG. 7B. An island-shaped oxide semiconductor region 112 and first wirings 114a and 114b are formed. Here, the first wiring 114a serves as a writing word line and the first wiring 114b serves as a reading word line. Part of the first wiring 114a overlaps with the oxide semiconductor region 112 and serves as a gate electrode of the writing transistor WTr. The oxide semiconductor region 112 is connected to the reading gate 110 in a lower layer. A capacitor is formed in a portion where the first wiring 114b overlaps with the reading gate 110. Further, a second connection electrode 117 is provided in order to connect the oxide semiconductor region 112 to an upper layer (e.g., a bit line).

A material which forms an ohmic contact with an oxide semiconductor to be formed later is preferable as a material of the reading gate 110. An example of such a material is a material whose work function W is almost the same as or smaller than electron affinity φ of the oxide semiconductor (an energy gap between the lowest end of the conduction band of the oxide semiconductor and the vacuum level). In other words, W<φ+0.3 [electron volt] may be satisfied. For example, titanium, molybdenum, and titanium nitride can be given.

FIG. 7C illustrates a structure where the structure illustrated in FIG. 7A overlaps with the structure illustrated in FIG. 7B. In FIG. 7C, the structures are shifted a little from each other so as to see the overlap. Further, a second wiring 118 (e.g., a bit line) formed over the transistor including an oxide semiconductor is also illustrated.

Note that a dot A and a dot B denote the same positions through FIGS. 7A to 7C. Although a design rule of such elements can be selected as appropriate by the practitioner, it is preferable that a channel width of each transistor is greater than or equal to 10 nm and less than or equal to 0.1 µm and a channel length thereof is greater than or equal to 10 nm and less than or equal to 0.1 µm for increase in the integration degree.

Hereinafter, a method for manufacturing the semiconductor memory device having the above-described structure will be described. FIGS. 8A to 8D and FIGS. 9A to 9C are cross-sectional views taken along a line linking the dot A to the dot B in FIGS. 7A to 7C. In this embodiment, an n-type single crystal silicon substrate is used as a substrate; however, an n-type well may be formed in a p-type single crystal silicon substrate and the transistor of this embodiment may be formed thereover. A manufacturing process will be described below in numerical order of the cross-sectional views.

<FIG. 8A>

Figure 8A:
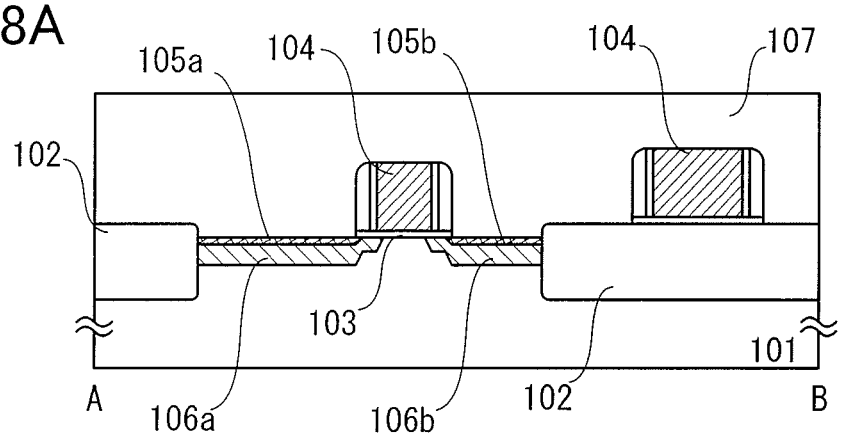
FIGS. 8A to 8D illustrate an example of a manufacturing process of a semiconductor memory device of the present invention.
Figure 8B:
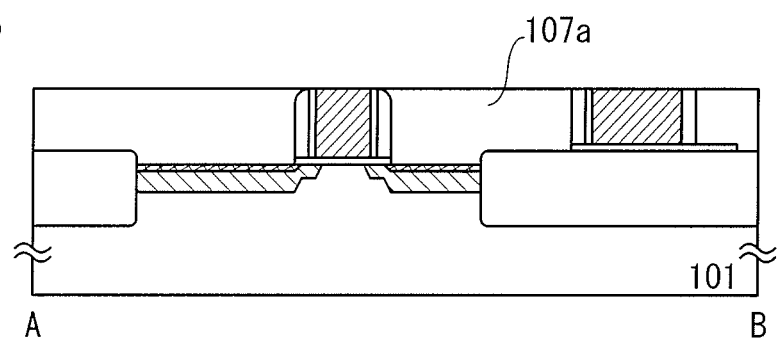
Figure 8C:
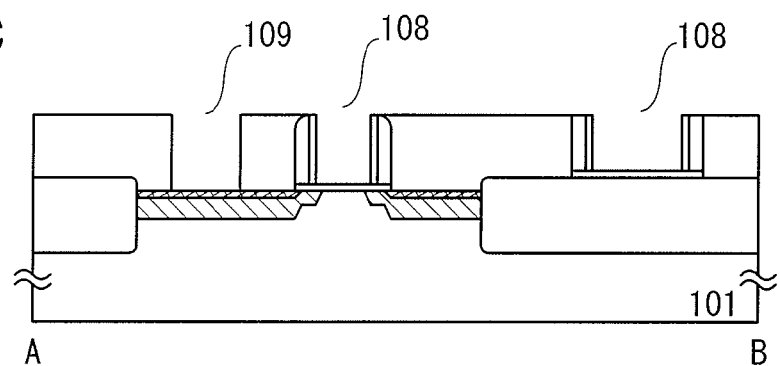

First, with the use of a known semiconductor manufacturing technique, as illustrated in FIG. 8A, the element separation region 102, the conductive regions 106a and 106b formed using p-doped silicon or the like, a first gate insulating film 103, a dummy gate 104, and a first interlayer insulator 107 are formed over an n-type single crystal silicon substrate 101. Although two dummy gates 104 are illustrated in FIG. 8A, they are one continuous dummy gate as apparent from FIGS. 7A to 7C.

A sidewall may be provided on a side surface of the dummy gate 104 as illustrated in FIG. 8A. Polycrystalline silicon may be used for the dummy gate 104. The thickness of the first gate insulating film 103 is preferably 10 nm or more so that generation of leakage current is suppressed. In order that gate capacitance be less than the capacitance of a capacitor to be formed later, a material having a relatively low dielectric constant, such as silicon oxide, is preferably used for a dielectric of the first gate insulating film 103.

Silicide regions 105a and 105b may be formed over surfaces of the conductive regions 106a and 106b so as to increase conductivity. Further, as described with reference to FIG. 7A, the conductive region 106b serves as part of the bias line.

The first interlayer insulator 107 may be formed as a single layer or a multilayer and may include a stress liner for causing a distortion in the channel of the transistor. Planarizing a film in the uppermost layer by a spin coating method facilitates a later step. For example, as the first interlayer insulator 107, a multilayer film formed in such a manner that a silicon nitride film is formed by a plasma CVD method and a planarized silicon oxide film is formed by a spin coating method thereover may be used.

<FIG. 8B>

In the case where the surface of the first interlayer insulator 107 is sufficiently planarized, the first interlayer insulator 107 is etched by a dry etching method; the dry etching is stopped upon exposure of an upper surface of the dummy gate 104. A chemical mechanical polishing (CMP) method may be used instead of a dry etching method. The surface of the first interlayer insulator 107 may be planarized by a CMP method first, and then etching may be further conducted by a dry etching method. Alternatively, after the interlayer insulator is etched to some extent by a dry etching method, planarizing treatment by a CMP method may be performed. Thus, a first interlayer insulator 107a having a planarized surface is obtained.

<FIG. 8C>

Next, the dummy gate 104 is selectively etched and an opening portion 108 is formed. In the case where polycrystalline silicon is used as a material of the dummy gate 104, 2% to 40% TMAH (tetramethyl ammonium hydroxide), preferably 20% to 25% TMAH may be used for the etching. In addition, an opening portion 109 reaching the silicide region 105a is formed in the first interlayer insulator 107a having a planarized surface.

<FIG. 8D>

A single-layer or a multilayer film of a conductive material is deposited. A material which forms an ohmic contact with an oxide semiconductor to be formed later is preferable as a conductive material. Further, this conductive film also serves as a gate electrode of the reading transistor (here, a p-channel transistor); therefore, a conductive material which has an appropriate physical property value, such as a work function, is preferable for decision of the threshold voltage of the transistor. When these two conditions are not satisfied by one material, a plurality of films is formed so that each condition is satisfied. For example, a multilayer film including titanium nitride and tantalum nitride film as a conductive material may be used.

Figure 8D:
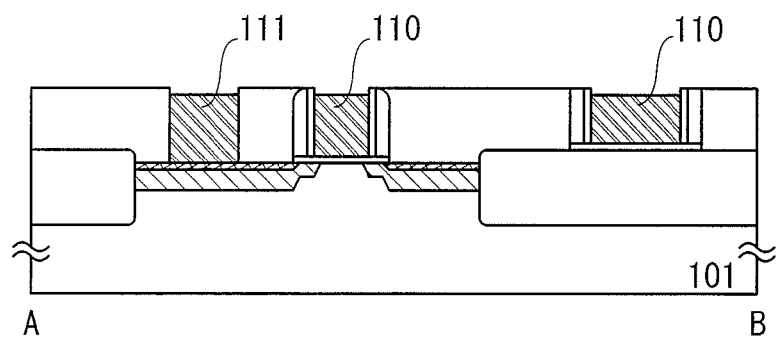

Next, the film of the conductive material is etched by a CMP method to be planarized. This step may be stopped upon of exposure of the first interlayer insulator 107a having a planarized surface. Thus, as illustrated in FIG. 8D, the reading gate 110 of the reading transistor and the first connection electrode 111 are formed. After that, surface treatment by plasma including fluorine is performed in order that hydrogen included in the vicinity of the surface of the first interlayer insulator 107a having a planarized surface be reduced. The treatment is not necessarily performed when the hydrogen concentration of the first interlayer insulator 107a having a planarized surface is sufficiently low. The hydrogen concentration in a region 100 nm deep from the surface of the first interlayer insulator 107a having a planarized surface is lower than $1 \times 10^{18}$ cm$^{-3}$, preferably lower than $1 \times 10^{16}$ cm$^{-3}$.

<FIG. 9A>

Then, an oxide semiconductor film having a thickness of 3 nm to 30 nm is formed by a sputtering method. A method other than a sputtering method may be employed as a method for forming the oxide semiconductor film. The oxide semiconductor preferably contains gallium and indium. The hydrogen concentration in the oxide semiconductor film may be lower than $1 \times 10^{18}$ cm$^{-3}$, preferably lower than $1 \times 10^{16}$ cm$^{-3}$ in order that the reliability of the semiconductor memory device be increased.

The island-shaped oxide semiconductor region 112 is formed by etching the oxide semiconductor film. The oxide semiconductor region 112 may be subjected to heat treatment so that semiconductor characteristics are improved. Thus, a structure in which the reading gate 110 and the oxide semiconductor region 112 are in contact with each other and the first connection electrode 111 and the oxide semiconductor region 112 are in contact with each other can be obtained.

Then, a second gate insulating film 113 is formed by a known deposition method such as a sputtering method. In order that generation of leakage current be reduced, the thickness of the second gate insulating film 113 is preferably 10 nm or more and the hydrogen concentration in the gate insulating film is preferably lower than $1 \times 10^{-18}$ cm$^{-3}$, more preferably lower than $1 \times 10^{-16}$ cm$^{-3}$.

Silicon oxide, aluminum oxide, hafnium oxide, lanthanum oxide, aluminum nitride, or the like may be used for the gate insulating film. A multilayer film of these materials may be used as well as a single-layer film thereof. The second gate insulating film 113 is a dielectric of a capacitor which is formed using the reading gate 110 and the first wiring 114b and is preferably formed using a material having a relative permittivity of 10 or more so that the capacitance of the capacitor is larger than the gate capacitance of the reading transistor. The oxide semiconductor region 112 may also be subjected to heat treatment after the gate insulating film is formed so that characteristics of the oxide semiconductor region 112 are improved.

<FIG. 9B>

The first wiring 114a (writing word line) and the first wiring 114b (reading word line) are formed using a conductive material. Part of the first wiring 114a serves as the gate electrode of the transistor including an oxide semiconductor. As a material of the first wiring 114a and the first wiring 114b, a material having work function which is larger than the electron affinity of the oxide semiconductor by 0.5 electron volts or more is preferable. Tungsten, gold, platinum, p-type silicon, and the like can be given as examples.

The capacitor in which the second gate insulating film 113 as a dielectric is provided between the reading gate 110 and the first wiring 114b is formed. The capacitance of the capacitor is determined by the magnitude of overlapped part of the reading gate 110 with the first wiring 114b; the area of the overlapped part is preferably larger than or equal to 100 nm$^2$ and smaller than or equal to 0.01 μm$^2$.

Figure 9A:
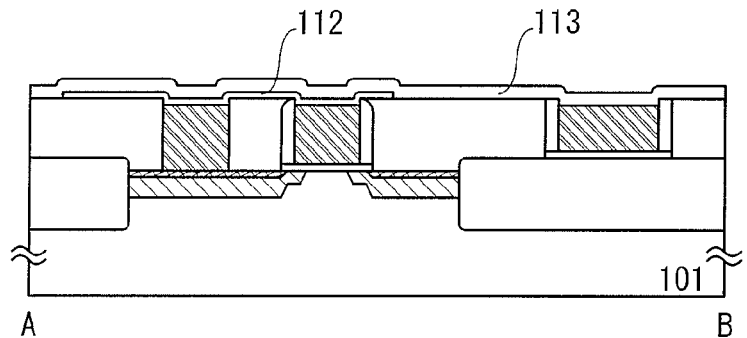
FIGS. 9A to 9C illustrate an example of a manufacturing process of a semiconductor memory device of the present invention.
Figure 9B:
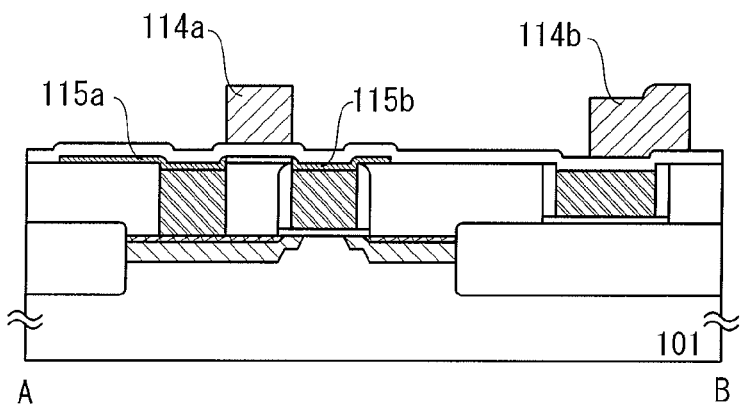

In FIG. 9B, one end of the first connection electrode 111 is aligned with one end of the first wiring 114a serving as the gate electrode of the writing transistor, and one end of the reading gate 110 is aligned with the other end of the first wiring 114a. However, because of the accuracy of mask alignment, the first wiring 114a is shifted to the left side (the first connection electrode 111 side) or to the right side (the reading gate 110 side) in some cases as compared to what is illustrated in FIG. 9B. In that case, on the side opposite to the side to which the first wiring 114a is shifted, a region between the first wiring 114a and the first connection electrode 111 or between the first wiring 114a and the reading gate 110 is in an offset state; accordingly, the resistance of the transistor in an on state is increased.

Although it is possible that the width of the first wiring 114a is increased so that the first wiring 114a overlaps with both the first connection electrode 111 and the reading gate 110 even when the first wiring 114a is shifted to some extent for the prevention of increase in the resistance of the transistor in an on state, it is disadvantageous in high speed operation because the parasitic capacitance is generated between the first wiring 114a and the first connection electrode 111 or between the first wiring 114a and the reading gate 110. Further, increase in the width of a wiring is against reduction in the design rule.

In order to solve these problems, an n-type region may be formed in the oxide semiconductor region in a self-alignment manner with the use of the first wiring 114a as a mask. For that purpose, an ion of an element which is oxidized more easily than an oxide semiconductor is implanted by a known ion implantation method. Examples of such an element are titanium, zinc, magnesium, silicon, phosphorus, boron, and the like. In general, boron and phosphorus are used in a conventional semiconductor process and thus easy to use; particularly, as an ion to be implanted to the above-described thin second gate insulating film 113 or the oxide semiconductor region 112, an ion of phosphorus whose atomic weight is greater than the atomic weight of boron is preferable.

It is desirable that hydrogen is mixed as little as possible in these ions. The hydrogen concentration in the ions is preferably 0.1% or lower. It is known that hydrogen serves as a donor of an oxide semiconductor. When hydrogen is mixed in the ions, hydrogen implanted to the oxide semiconductor moves in the oxide semiconductor and the reliability of an element is decreased.

In the oxide semiconductor, the implanted ions are combined with oxygen and the oxygen deficiency is generated; thus, the oxide semiconductor exhibits n-type conductivity. An oxide semiconductor is different from a silicon semiconductor in that many oxide semiconductors can obtain high conductivity without such heat treatment which is needed in the case of a silicon semiconductor for recovery of crystallinity after ion implantation.

In this manner, regions 115a and 115b exhibiting n-type conductivity are formed in the oxide semiconductor region 112. It is preferable that conditions of ion implantation be set so that carrier (electron) concentration in these regions is $1 \times 10^{-19}$ cm$^{-3}$ or more. A basic element structure is completed through the above steps.

<FIG. 9C>

Figure 9C:
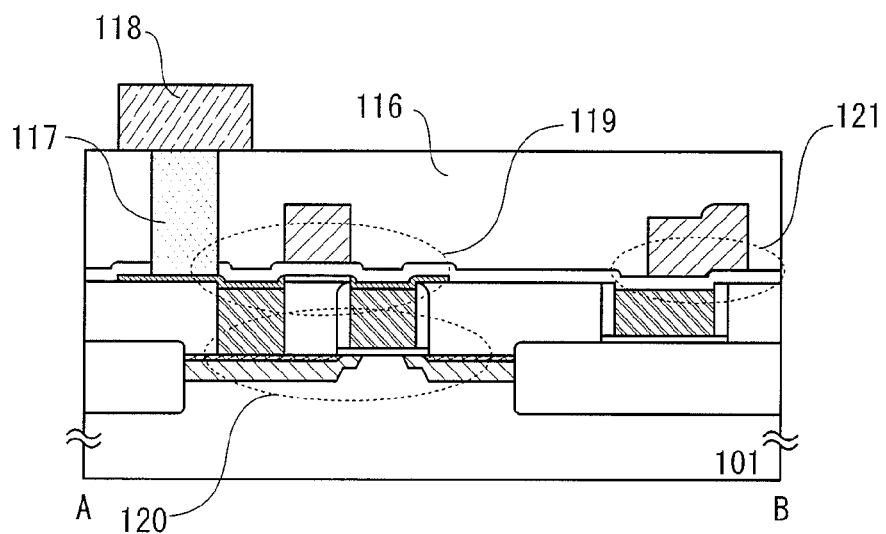

After that, a second interlayer insulator 116 of a single-layer thin film or a multilayer thin film is formed. A surface of the second interlayer insulator 116 is planarized, a contact hole reaching the region 115a exhibiting n-type conductivity is formed, and a second connection electrode 117 is embedded therein. Then, the second wiring 118 (bit line) is formed. A similar wiring may be provided so as to be parallel to the first wirings 114a and 114b. Thus, as illustrated in FIG. 9C, a memory cell of a semiconductor memory device, which includes a writing transistor 119, a reading transistor 120, and a capacitor 121, is manufactured.

(Embodiment 4)

Figure 5:
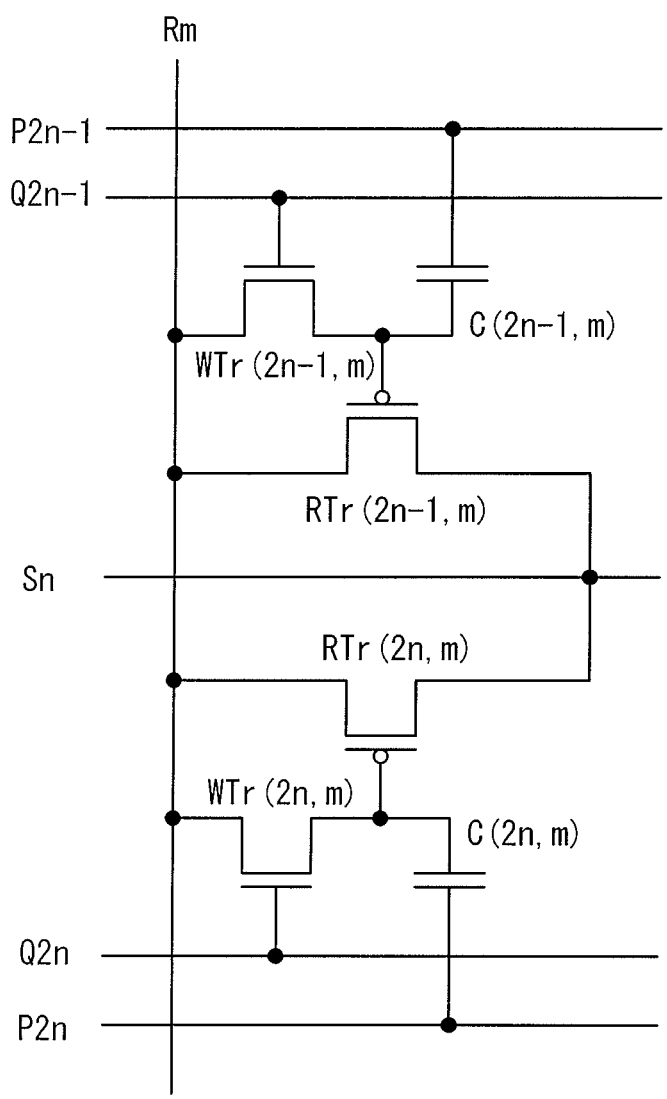
FIG. 5 illustrates an example of a semiconductor memory device of the present invention.

In this embodiment, an example of the semiconductor memory device illustrated in FIG. 5 will be described with reference to FIGS. 10A to 10C. In this embodiment, an oxide semiconductor containing gallium and indium is used for the writing transistor WTr and a single crystal silicon semiconductor is used for the reading transistor RTr. Therefore, the writing transistor WTr is stacked over the reading transistor RTr.

That is, an insulated gate transistor including a single crystal silicon semiconductor which is provided over a single crystal silicon substrate is used as the reading transistor RTr and a transistor in which an oxide semiconductor is used is formed thereover as the writing transistor WTr. Note that although an example in which a single crystal silicon semiconductor is used for the reading transistor RTr is described in this embodiment, another kind of semiconductor can be used.

Figure 10A:
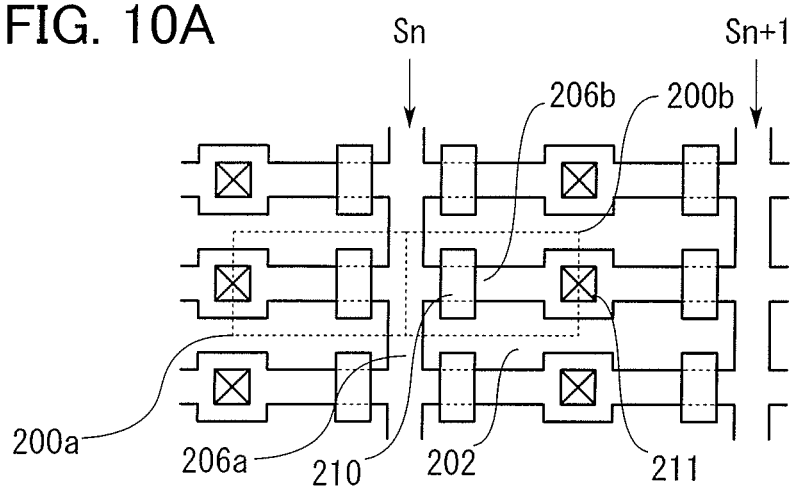
FIGS. 10A to 10C illustrate an example of layout and the like of wirings of a semiconductor memory device of the present invention.
Figure 10B:
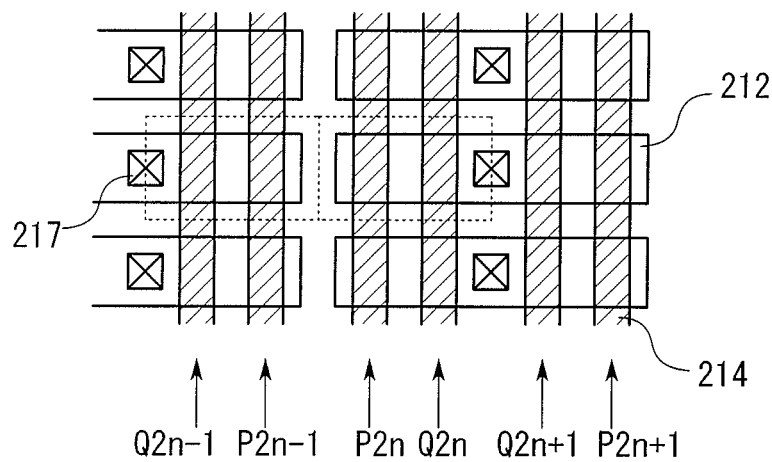
Figure 10C:
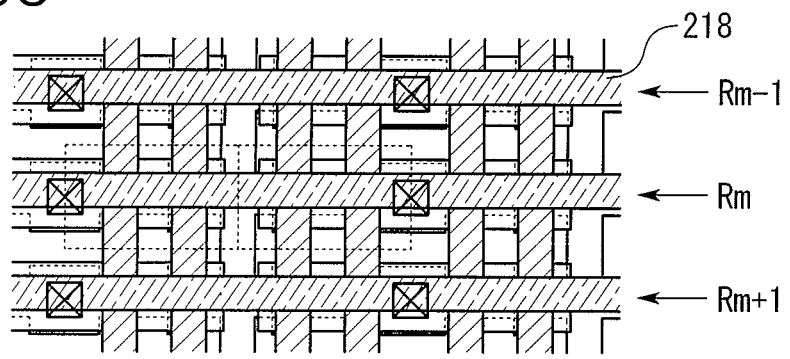

An example of layout of a memory cell of the semiconductor memory device in this embodiment is illustrated in FIGS. 10A to 10C. In FIG. 10A, main wirings, main electrodes, and the like provided over a single crystal silicon substrate are illustrated. Regions 200a and 200b surrounded by a dotted line in FIG. 10A are each a region occupied by one memory cell. For example, the region 200a corresponds to a region occupied by a memory cell in the (2n−1)-th row and the m-th column in FIG. 5, and the region 200b corresponds to a region occupied by a memory cell in the 2n-th row and the m-th column in FIG. 5.

An element separation region 202 is formed over the substrate. Further, over the substrate, conductive regions 206a and 206b are formed using a conductive material or doped silicon, and part thereof serves as a drain and a source of the reading transistor RTr. A wiring extended from the conductive region 206a serves as a bias line (Sn, Sn+1, and the like). The conductive regions 206a and 206b are separated from each other by a reading gate 210. A first connection electrode 211 is provided in the conductive region 206b so as to connect to a circuit in an upper layer.

Main wirings, main electrodes, and the like, focusing on the transistor including the oxide semiconductor, which is formed over the circuit illustrated in FIG. 10A, are illustrated in FIG. 10B. An island-shaped oxide semiconductor region 212 and a first wiring 214 of a conductive material are formed. The first wiring 214 serves as, for example, a reading word line (Q2n−1, Q2n, Q2n+1, and the like) and a reading word line (P2n−1, P2n, P2n+1, and the like).

Part of the writing word line overlaps with the oxide semiconductor region 212 and serves as a gate electrode of the writing transistor WTr. The oxide semiconductor region 212 is connected to the reading gate 210 in a lower layer. Further, a capacitor is formed in a portion where the reading word line overlaps with the reading gate 210.

The oxide semiconductor region 212 is connected to the source (the conductive region 206b) of the reading transistor RTr through the first connection electrode 211. Further, a second connection electrode 217 is provided for connecting the oxide semiconductor region 212 to an upper layer (bit line). The second connection electrode 217 is preferably provided in the same position as the first connection electrode 211 which connects the lower layer to the oxide semiconductor region 212 for reduction in an area of a memory cell.

FIG. 10C illustrates a structure where the structure illustrated in FIG. 10A overlaps with the structure illustrated in FIG. 10B. In FIG. 10C, the structures are shifted a little from each other so as to see the overlap. Further, a second wiring 218 including a conductive material, which is formed over the transistor including an oxide semiconductor, is also illustrated. The second wiring 218 serves as a bit line (Rm−1, Rm, Rm+1, and the like) and is connected to the oxide semiconductor region 212 through the second connection electrode 217.

The semiconductor memory device with such a structure may be manufactured by the method described in Embodiment 3.

(Embodiment 5)

In this embodiment, an example in which the semiconductor memory circuit illustrated in FIGS. 1A and 1B operates in a manner different from the manner in Embodiment 1 will be described with reference to FIGS. 11A to 11F. Note that specific values are given below as potentials for the purpose of aid for understanding a technical idea of the present invention. Needless to say, such values are changed in accordance with various characteristics of a transistor, a capacitor, or the like, or for convenience of the practitioner.

Here, the writing transistor WTr(n,m) is an n-channel transistor and the reading transistor RTr(n,m) is a p-channel transistor. The writing transistor WTr(n,m) is turned on when a potential of the gate is higher than a potential of either the source or the drain by 1 V or more, and the writing transistor is in an off state under the other conditions. The reading transistor RTr(n,m) is turned on when a potential of the gate is lower than a potential of either the source or the drain by 1 V or more, and the reading transistor is in an off state under the other conditions.

A portion of the gate capacitance of the reading transistor RTr(n,m), which is changed due to the gate bias, is negligible as compared to the capacitance of the capacitor C(n,m). Further, the parasitic capacitance of the writing transistor WTr(n,m), the parasitic capacitance of the reading transistor RTr(n,m), the parasitic capacitance generated between wirings, and the like, which are not illustrated in the drawings, are considered to be 0.

In FIGS. 11A to 11F, a circle is on a transistor in an on state, and a cross mark is on a transistor in an off state. A description may be written in the drawings when a transistor is turned on under a specific condition.

Figure 11A:
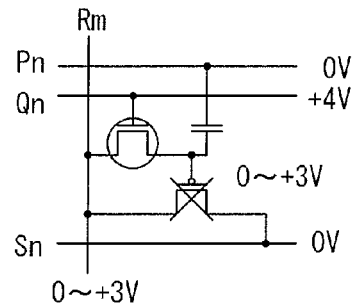
FIGS. 11A to 11F illustrate an example of a driving method of a semiconductor memory device of the present invention.

<FIG. 11A> (Writing in the n-th Row)

At the time of writing, as illustrated in FIG. 11A, a potential of the reading word line Pn and a potential of the bias line Sn are set to 0 V. A potential of the bit line Rm is set to a value at one of four levels of 0 V, +1 V, +2 V, and +3 V, in accordance with data to be written. When a potential of the writing word line Qn is +4 V, the writing transistor WTr(n,m) is turned on and a potential of the drain of the writing transistor WTr(n,m) becomes close to a potential of the source of the writing transistor (i.e., the potential of the bit line Rm). Here, the potential of the drain of the writing transistor WTr(n,m) becomes equal to the potential of the bit line Rm.

On the other hand, a potential of the gate of the reading transistor RTr(n,m) is equal to the potential of the drain of the writing transistor WTr(n,m) at this stage. That is, the potential of the gate of the reading transistor RTr(n,m) is higher than or equal to 0 V and equal to a potential of the source of the reading transistor RTr(n,m) (i.e., the potential of the bit line Rm).

A potential of the drain of the reading transistor RTr(n,m) (i.e., the potential of the bias line Sn) is 0 V. Accordingly, the potential of the gate of the reading transistor RTr(n,m) is higher than or equal to the potential of the source or the drain, so that the reading transistor RTr(n,m) is in an off state. Thus, data can be written.

Figure 11B:
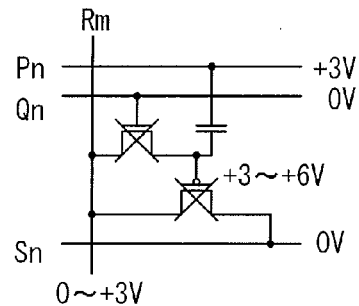

<FIG. 11B> (Writing in a Row Other than the n-th Row)

Next, in the case where writing is performed in a row other than the n-th row, as illustrated in FIG. 11B, the potential of the writing word line Qn is set to 0 V. In addition, the potential of the reading word line Pn is set to +3 V and the potential of the bias line Sn is set to 0 V. The potential of the bit line Rm is set to a value at one of four levels of 0 V, +1 V, +2 V, and +3 V, in accordance with data to be written in the row where writing is performed.

Since the drain of the writing transistor WTr(n,m) is connected to the reading word line Pn through the capacitor C(n,m), the potential of the drain of the writing transistor WTr(n,m) is increased by 3 V in accordance with change in the potential of the reading word line Pn (i.e., increase in potential from 0 V, which is the state illustrated in FIG. 11A, to +3 V, which is the state illustrated in FIG. 11B). That is, in accordance with the written data, the potential of the drain of the writing transistor WTr(n,m) is set to +3 V, +4 V, +5 V, or +6 V.

In this state, the potential of the gate of the writing transistor WTr(n,m) is lower than the potential (0 V to +3 V) of the source of the writing transistor WTr(n,m) (the potential of the bit line Rm) and the potential (+3 V to +6 V) of the drain of the writing transistor WTr(n,m), so that the writing transistor WTr(n,m) is turned off.

Further, the potential of the gate of the reading transistor RTr(n,m) is higher than the potential (0 V to +3 V) of the source of the reading transistor RTr(n,m) (the potential of the bit line Rm) and the potential (0 V) of the drain of the reading transistor RTr(n,m) (the potential of the bias line Sn), so that the reading transistor RTr(n,m) is in an off state.

Figure 11C:
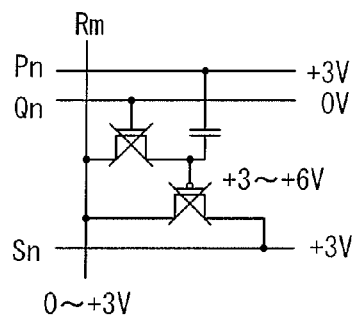

<FIG. 11C> (Reading)

Next, the reading will be described. As illustrated in FIG. 11C, the potential of the writing word line Qn is set to 0 V. The potential of the reading word line Pn and the potential of the bias line Sn are set to +3 V. In this state, the potential of the drain of the writing transistor WTr(n,m) is set to +3 V, +4 V, +5 V, or +6 V in accordance with the written data. When the potential of the bit line Rm is higher than or equal to 0 V and lower than or equal to +3 V, both the writing transistor WTr(n,m) and the reading transistor RTr(n,m) are in an off state. That is, a writing transistor and a reading transistor in a row where reading is not performed are set in an off state in this manner.

Figure 11D:
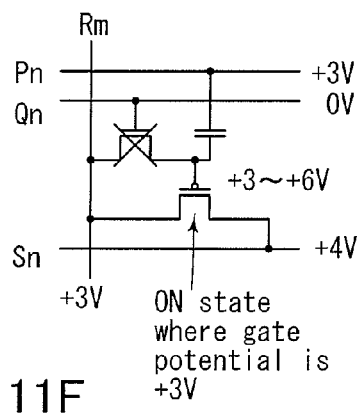

<FIG. 11D> (Reading)

On the other hand, the potential of the bias line Sn in the row where reading is performed is set to larger than +3 V. For example, as illustrated in FIG. 11D, when the potential of the bias line Sn is set to +4 V, the reading transistor RTr(n,m) is turned on in the case where the potential of the gate of the reading transistor RTr(n,m) is +3 V.

When the potential of the bit line is set to +3 V in advance, current flows through the bit line Rm; thus, by detection of the current, it can be known that the reading transistor RTr(n,m)

is in an on state. Alternatively, when a capacitor is provided in an end portion of the bit line Rm, the potential of the bit line Rm becomes close to the potential of the bias line Sn. Also in this case, it can be known that the reading transistor RTr(n,m) is in an on state.

Figure 11E:
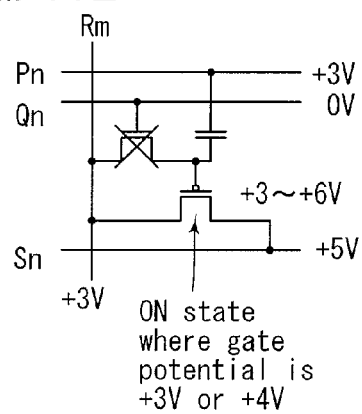

<FIG. 11E> (Reading)

Similarly, as illustrated in FIG. 11E, when the potential of the bias line Sn is set to +5 V, the reading transistor RTr(n,m) is turned on in the case where the potential of the gate of the reading transistor RTr(n,m) is +3 V or +4 V.

Figure 11F:
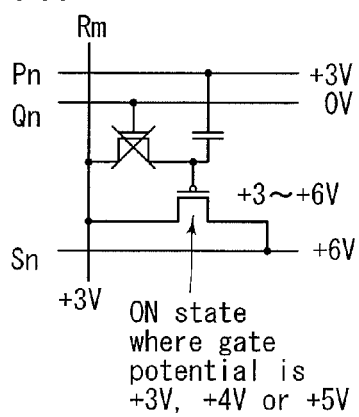

<FIG. 11F> (Reading)

Further, as illustrated in FIG. 11F, when the potential of the bias line Sn is set to +6 V, the reading transistor RTr(n,m) is turned on in the case where the potential of the gate of the reading transistor RTr(n,m) is +3 V, +4 V, or +5 V.

It can be assumed that the potential of the drain of the writing transistor WTr(n,m) (i.e., the potential of the gate of the reading transistor RTr(n,m)) is +6 V in the case where the reading transistor RTr(n,m) remains off even when the potential of the bias line Sn is set to +6 V.

In this manner, the data (2 bits) at four stages can be written and read. Needless to say, in a similar manner, much more data such as data (3 bits) at eight stages or data (4 bits) at 16 stages can be written and read. In this embodiment, as described above, writing and reading can be performed only with a positive potential.

In the above description, although the parasitic capacitance and the gate capacitance of the reading transistor RTr(n,m) are ignored as compared to the capacitance of the capacitor C(n,m), voltage to be applied needs to be determined in view of these capacitance in an actual memory cell. The gate capacitance of the reading transistor RTr(n,m) in an on state and that in an off state greatly varies; therefore, the potential of the gate of the reading transistor RTr(n,m) is influenced by the variation. As the ratio of the gate capacitance of the reading transistor RTr(n,m) to the capacitance of the capacitor C(n,m) is higher, the influence is bigger. Accordingly, the capacitance of the capacitor C(n,m) is preferably larger than or equal to twice as large as the gate capacitance of the reading transistor RTr(n,m).

(Embodiment 6)

In this embodiment, an example of operation of the semiconductor memory circuit illustrated in FIG. 5 will be described with reference to FIGS. 12A to 12C and FIGS. 13A to 13D. Here, the writing transistor WTr(2n−1,m) and the writing transistor WTr(2n,m) are n-channel transistors and the reading transistor RTr(2n−1,m) and the reading transistor RTr(2n,m) are p-channel transistors.

The writing transistor WTr(2n−1,m) and the writing transistor WTr(2n,m) are turned on when a potential of the gate is higher than a potential of either the source or the drain by 1 V or more, and the writing transistors are in an off state under the other conditions. The reading transistor RTr(2n−1,m) and the reading transistor RTr(2n,m) are turned on when a potential of the gate is lower than a potential of either the source or the drain by 1 V or more, and the reading transistors are in an off state under the other conditions.

A portion of the gate capacitance of each of the reading transistor RTr(2n−1,m) and the reading transistor RTr(2n,m), which is changed due to the gate bias, is negligible as compared to the capacitance of the capacitor C(n,m). Further, the parasitic capacitance of the writing transistor WTr(2n−1,m) and the writing transistor WTr(2n,m), the parasitic capacitance of the reading transistor RTr(2n−1,m) and the reading transistor RTr(2n,m), the parasitic capacitance generated between wirings, and the like, which are not illustrated in the drawings, are considered to be 0.

In FIGS. 12A to 12C and FIGS. 13A to 13D, a circle is on a transistor in an on state, and a cross mark is on a transistor in an off state. A description may be written in the drawings when a transistor is turned on under a specific condition.

Figure 12A:
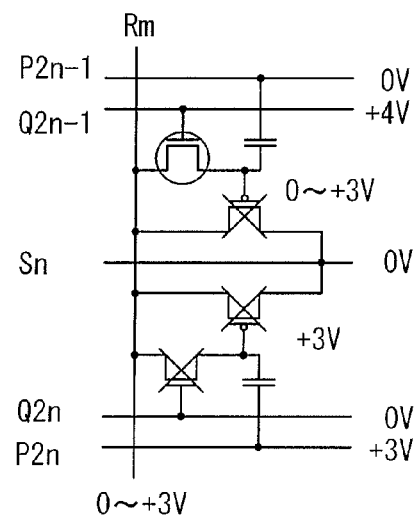
FIGS. 12A to 12C illustrate an example of a driving method (writing) of a semiconductor memory device of the present invention.

<FIG. 12A> (Writing in the (2n−1)-th Row)

At the time of writing in the (2n−1)-th row, as illustrated in FIG. 12A, a potential of the reading word line P2n−1, a potential of the writing word line Q2n, and a potential of the bias line Sn are set to 0 V. A potential of the reading word line P2n is set to +3 V. A potential of the bit line Rm is set to a value at any of four levels of 0 V, +1 V, +2 V, and +3 V, in accordance with data to be written. Note that the potential of the drain of the writing transistor WTr(2n,m) at this time is +3 V.

When a potential of the writing word line Q2n−1 is +4 V, the writing transistor WTr(2n−1,m) is turned on and a potential of the drain of the writing transistor WTr(2n−1,m) becomes close to a potential of the source of the writing transistor (i.e., the potential of the bit line Rm). Here, the potential of the drain of the writing transistor WTr(2n−1,m) becomes equal to the potential of the bit line Rm.

On the other hand, a potential of the gate of the reading transistor RTr(2n−1,m) is equal to the potential of the drain of the writing transistor WTr(2n−1,m) at this stage. That is, the potential of the gate of the reading transistor RTr(2n−1,m) is higher than or equal to 0 V and equal to a potential of the source of the reading transistor RTr(2n−1,m) (i.e., the potential of the bit line Rm).

A potential of the drain of the reading transistor RTr(2n−1,m) (i.e., the potential of the bias line Sn) is 0 V. Accordingly, the potential of the gate of the reading transistor RTr(2n−1,m) is higher than or equal to the potential of the source or the drain, so that the reading transistor RTr(2n−1,m) is in an off state.

Further, since the potential (0V) of the gate of the writing transistor WTr(2n,m) is lower than the potential (higher than or equal to 0 V and lower than or equal to +3 V) of the source thereof (i.e., the potential of the bit line Rm) and the potential (+3 V) of the drain thereof, the writing transistor WTr(2n,m) is in an off state. Furthermore, since the potential (+3 V) of the gate of the reading transistor RTr(2n,m) (i.e., the potential of the drain of the reading transistor WTr(2n,m)) is higher than the potential (higher than or equal to 0 V and lower than or equal to +3 V) of the source thereof (i.e., the potential of the bit line Rm) and the potential (0V) of the drain thereof, the reading transistor RTr(2n,m) is also in an off state. Thus, data can be written in the memory cell in the (2n−1)-th row.

Figure 12B:
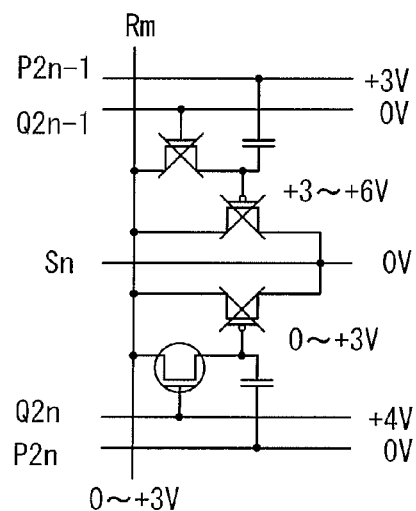

<FIG. 12B> (Writing in the 2n-th Row)

Next, in the case where the writing is performed in the 2n-th row, as illustrated in FIG. 12B, the potential of the writing word line Q2n−1 and the potential of the reading word line P2n are set to 0 V. The potential of the reading word line P2n−1 is set to +3 V, and the potential of the bias line Sn is set to 0 V. A potential of the bit line Rm is set to a value at one of four levels of 0 V, +1 V, +2 V, and +3 V, in accordance with data to be written.

Since the drain of the writing transistor WTr(2n−1,m) is connected to the reading word line P2n−1 through the capacitor C(2n−1,m), the potential of the drain of the writing transistor WTr(2n−1,m) is increased by 3 V in accordance with change in the potential of the reading word line P2n−1 (i.e., increase in potential from 0 V, which is the state illustrated in FIG. 12A, to +3 V, which is the state illustrated in FIG. 12B). That is, in accordance with the written data, the potential of the drain of the writing transistor WTr(2n−1,m) is set to +3 V, +4 V, +5 V, or +6 V.

Then, when the potential of the writing word line Q2n is set to +4 V, the writing transistor WTr(2n,m) is turned on and the potential of the drain of the writing transistor WTr($2n$,m) becomes close to the potential of the source of the writing transistor (i.e., the potential of the bit line Rm). Here, the potential of the drain of the writing transistor WTr($2n$,m) becomes equal to the potential of the bit line Rm.

On the other hand, at this stage, the potential of the gate of the reading transistor RTr($2n$,m) is equal to the potential of the drain of the writing transistor WTr($2n$,m). That is, the potential of the gate of the reading transistor RTr($2n$,m) is higher than or equal to 0 V, which is equal to the potential of the source of the reading transistor RTr($2n$,m) (i.e., the potential of the bit line Rm).

Further, the potential of the drain of the reading transistor RTr($2n$,m) (i.e., the potential of the bias line Sn) is 0 V. Accordingly, since the potential of the gate of the reading transistor RTr($2n-1$,m) is higher than or equal to the potential of the source or the drain, the reading transistor RTr($2n$,m) is in an off state. In addition, the writing transistor WTr($2n-1$,m) and the reading transistor RTr($2n-1$,m) are also in an off state. In this manner, data can be written in the memory cell in the $2n$-th row.

Figure 12C:
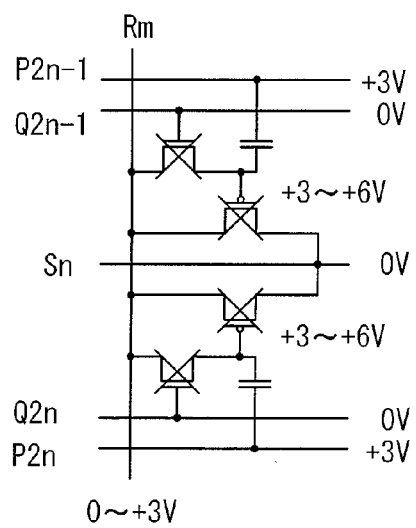

<FIG. 12C> (Writing in Another Row)

Next, in the case where writing is performed in a row other than the above-described rows, as illustrated in FIG. 12C, the potential of the writing word line Q$2n-1$ and the potential of the writing word line Q$2n$ are set to 0 V. The potential of the reading word line P$2n-1$ and the potential of the reading word line P$2n$ are set to +3 V, and the potential of the bias line Sn is set to 0 V. The potential of the bit line Rm is set to a value at one of four levels of 0 V, +1 V, +2 V, and +3 V, in accordance with data to be written in the row where the writing is performed.

Since the drain of the writing transistor WTr($2n$,m) is connected to the reading word line P$2n$ through the capacitor C($2n$,m), the potential of the drain of the writing transistor WTr($2n$,m) is increased by 3 V in accordance with change in the potential of the reading word line P$2n$ (i.e., increase in potential from 0 V, which is the state illustrated in FIG. 12B, to +3 V, which is the state illustrated in FIG. 12C). That is, in accordance with the written data, the potential of the drain of the writing transistor WTr($2n$,m) is set to +3 V, +4 V, +5 V, or +6 V. Similarly, the potential of the drain of the writing transistor WTr($2n-1$,m) is set to +3 V, +4 V, +5 V, or +6 V.

In this state, the potentials (0 V) of the gate of the writing transistor WTr($2n-1$,m) and the gate of the writing transistor WTr($2n$,m) are lower than the potentials (0 V to +3 V) of the source of the writing transistor WTr($2n-1$,m) and the source of the writing transistor WTr($2n$,m) (the potential of the bit line Rm) and the potentials (+3 V to +6 V) of the drain of the writing transistor WTr($2n-1$,m) and the drain of the writing transistor WTr($2n$,m), so that the writing transistor WTr($2n-1$,m) and the writing transistor WTr($2n$,m) are turned off.

Further, the potentials (+3 V to +6 V) of the gate of the reading transistor RTr($2n-1$,m) and the gate of the reading transistor RTr($2n$,m) are higher than the potentials (0 V to +3 V) of the source of the reading transistor RTr($2n-1$,m) and the source of the reading transistor RTr($2n$,m) (the potential of the bit line Rm) and the potentials (0 V) of the drain of the reading transistor RTr($2n-1$,m) and the drain of the reading transistor RTr($2n$,m) (the potential of the bias line Sn), so that the reading transistor RTr($2n-1$,m) and the reading transistor RTr($2n$,m) are turned off.

Figure 13A:
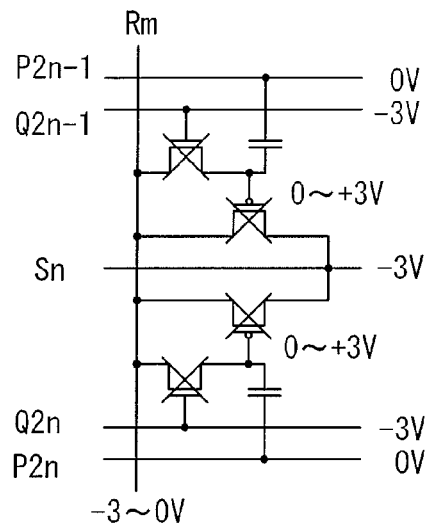
FIGS. 13A to 13D illustrate an example of a driving method (reading) of a semiconductor memory device of the present invention.

<FIG. 13A> (Reading)

Then, reading will be described. As illustrated in FIG. 13A, the potentials of the reading word line P$2n-1$ and the reading word line P$2n$ are set to 0 V, and the potentials of the writing word line Q$2n-1$, the writing word line Q$2n$, and the bias line Sn are set to −3 V. At this state, the potentials of the gate of the reading transistor RTr ($2n-1$,m) and the gate of the reading transistor RTr($2n$,m) are set to 0 V, +1 V, +2 V, or +3 V, in accordance with the written data.

When the potential of the bit line Rm is higher than or equal to −3 V and lower than or equal to 0 V, the writing transistor WTr($2n-1$,m), the writing transistor WTr($2n$,m), the reading transistor RTr($2n-1$,m), and the reading transistor RTr($2n$,m) are in an off state. That is, the transistors in a row where reading is not performed are thus turned off.

Figure 13B:
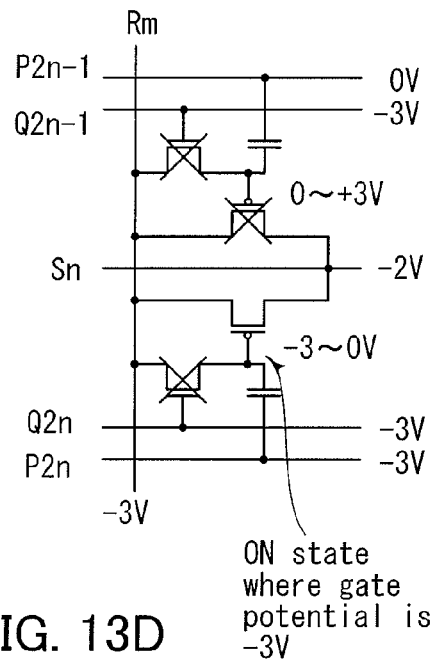

<FIG. 13B> (Reading in the $2n$-th Row [1])

Next, the potential of the reading word line P$2n$ is set to −3 V, and the potential of the bit line Rm is set to −3 V. As a result, the potential of the gate of the reading transistor RTr($2n$,m) is set to −3 V, −2 V, −1 V, or 0 V in accordance with the written data. At this state, the writing transistor WTr($2n$,m) and the reading transistor RTr($2n$,m) are in an off state. When the potential of the bias line Sn is changed, the reading transistor RTr($2n$,m) can be turned on. For example, as illustrated in FIG. 13B, when the potential of the bias line Sn is set to −2 V, the reading transistor RTr($2n$,m) is turned on in the case where the potential of the gate of the reading transistor RTr ($2n$,m) is −3 V.

Figure 13C:
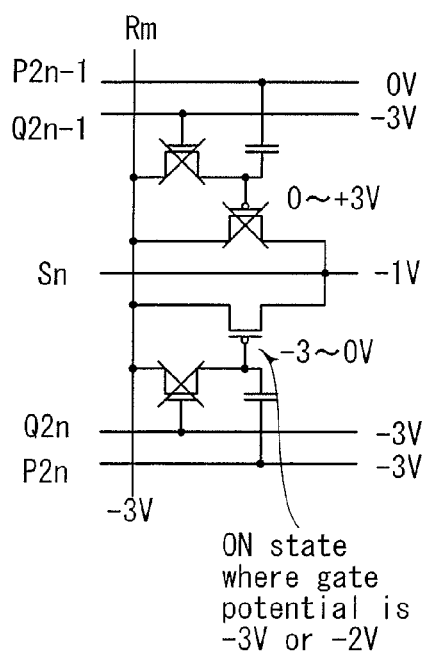

<FIG. 13C> (Reading in the $2n$-th Row [2])

Similarly, as illustrated in FIG. 13C, when the potential of the bias line Sn is set to −1 V, the reading transistor RTr($2n$,m) is turned on in the case where the potential of the gate of the reading transistor RTr($2n$,m) is −3 V or −2 V.

Figure 13D:
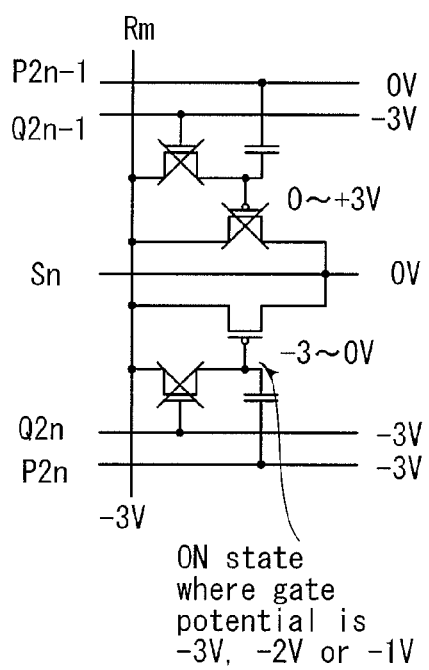

<FIG. 13D> (Reading in the $2n$-th Row [3])

Further, as illustrated in FIG. 13D, when the potential of the bias line Sn is set to 0 V, the reading transistor RTr($2n$,m) is turned on in the case where the potential of the gate of the reading transistor RTr($2n$,m) is −3 V, −2 V, or −1 V.

It can be assumed that the potential of the gate of the reading transistor RTr($2n$,m) is 0 V in the case where the reading transistor RTr($2n$,m) remains off even when the potential of the bias line Sn is set to 0 V.

In a similar manner, data of a memory cell in the ($2n-1$)-th row can be read. In the above example, although writing and reading of the data (2 bits) at four stages are described, much more data such as data (3 bits) at eight stages or data (4 bits) at 16 stages can be written and read in a similar manner. In the above description, the parasitic capacitance and the gate capacitance of the reading transistor RTr(n,m) are ignored as compared to the capacitance of the capacitor C(n,m); however, voltage to be applied needs to be determined in view of these capacitance in an actual memory cell.

(Embodiment 7)

Figure 6A:
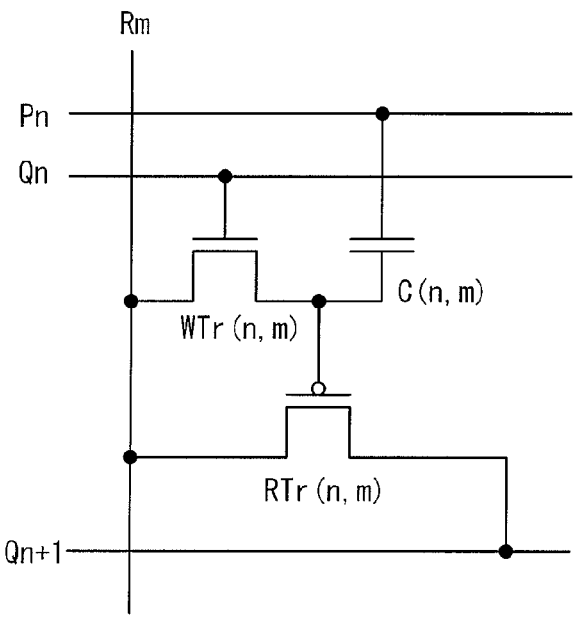
FIGS. 6A and 6B illustrate an example of a semiconductor memory device of the present invention.
Figure 6B:
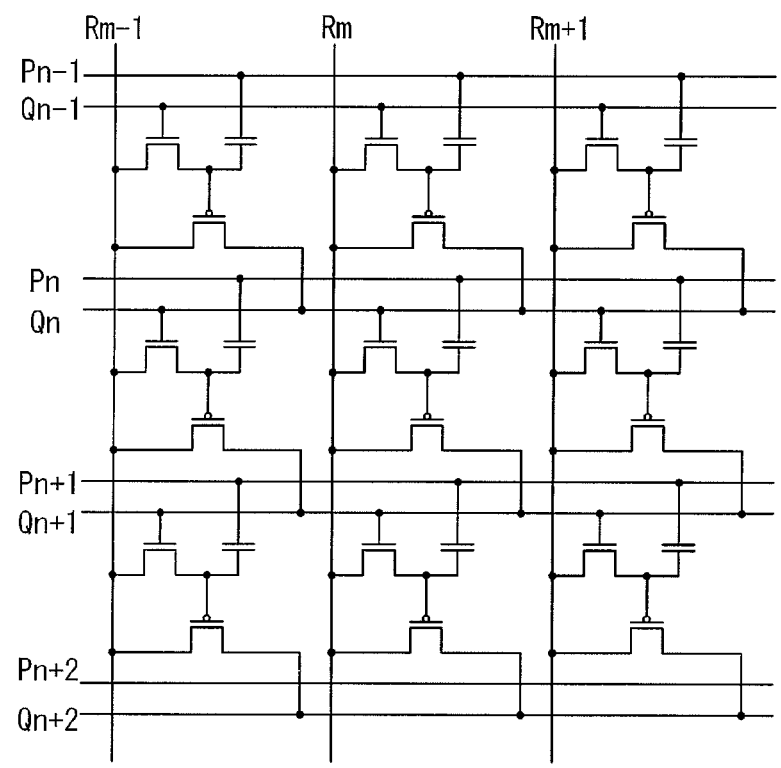

In this embodiment, an example of operation of the semiconductor memory circuit illustrated in FIGS. 6A and 6B will be described with reference to FIGS. 14A to 14D and FIGS. 15A to 15D. Note that specific values are given below as potentials for the purpose of aid for understanding a technical idea of the present invention. Needless to say, such values are changed in accordance with various characteristics of a transistor, a capacitor, or the like, or for convenience of the practitioner.

Here, the writing transistor WTr is an n-channel transistor and the reading transistor RTr is a p-channel transistor. The writing transistor WTr is turned on when a potential of the gate is higher than a potential of either the source or the drain by 1 V or more, and the writing transistor WTr is in an off state under the other conditions. The reading transistor RTr is turned on when a potential of the gate is lower than a potential of either the source or the drain by 1 V or more, and the reading transistor RTr is in an off state under the other conditions.

A portion of the gate capacitance of the reading transistor RTr, which is changed due to the gate bias, is negligible as compared to the capacitance of the capacitor C. Further, the parasitic capacitance of the writing transistor WTr, the parasitic capacitance of the reading transistor RTr, the parasitic capacitance generated between wirings, and the like, which are not illustrated in the drawings, are considered to be 0.

In FIGS. 14A to 14D and FIGS. 15A to 15D, a circle is on a transistor in an on state, and a cross mark is on a transistor in an off state. A description is written in the drawings when a transistor is turned on under a specific condition. The description below is made focusing on a memory cell in the (n−1)-th row and the m-th column and a memory cell in the n-th row and the m-th column.

Figure 14A:
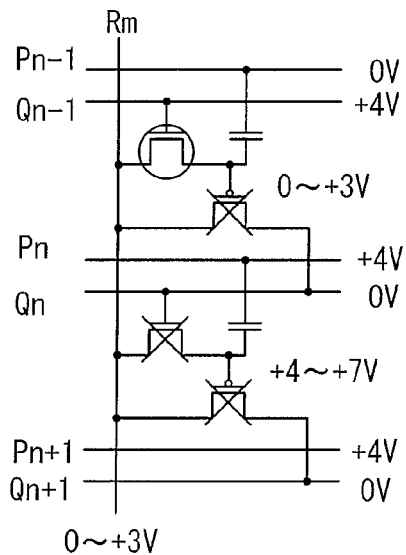
FIGS. 14A to 14D illustrate an example of a driving method (writing) of a semiconductor memory device of the present invention.

<FIG. 14A> (Writing in the (n−1)-th Row)

At the time of writing in a memory cell in the (n−1)-th row, as illustrated in FIG. 14A, potentials of a reading word line Pn−1, a writing word line Qn, and a writing word line Qn+1 are set to 0 V, and potentials of a reading word line Pn and a reading word line Pn+1 are set to +4 V. A potential of a bit line Rm is set to a value at one of four levels of 0 V, +1 V, +2 V, and +3 V, in accordance with data to be written. Further, a potential of a drain of a writing transistor WTr(n,m) (i.e., a potential of a gate of a reading transistor RTr(n,m)) is supposed to be higher than or equal to +4 V and lower than or equal to +7 V at the initial state.

When a potential of a writing word line Qn−1 is +4 V, a writing transistor WTr(n−1,m) is turned on and a potential of a drain of the writing transistor WTr(n−1,m) becomes close to a potential of a source of the writing transistor (i.e., the potential of the bit line Rm). Here, the potential of the drain of the writing transistor WTr(n−1,m) becomes equal to the potential of the bit line Rm.

On the other hand, a potential of a gate of a reading transistor RTr(n−1,m) is equal to the potential of the drain of the writing transistor WTr(n−1,m) at this stage. That is, the potential of the gate of the reading transistor RTr(n−1,m) is equal to a potential of a source of the reading transistor RTr(n−1,m) (i.e., the potential of the bit line Rm).

A potential of a drain of the reading transistor RTr(n−1,m) (i.e., a potential of the writing word line Qn) is 0 V. Accordingly, the potential of the gate of the reading transistor RTr(n−1,m) is higher than or equal to the potential of the source or the drain, so that the reading transistor RTr(n−1,m) is in an off state.

Note that since a potential (0 V) of a gate of the writing transistor WTr(n,m) is lower than or equal to the potential (0 V to +3 V) of the source thereof (i.e., the potential of the bit line Rm) and the potential of the drain thereof (+4 V to +7 V), the writing transistor WTr(n,m) is in an off state. Since the potential (+4 V to +7 V) of the gate of the reading transistor RTr(n,m) is higher than a potential (0 V to +3 V) of a source thereof (i.e., the potential of the bit line Rm) and a potential (0 V) of a drain thereof (i.e., the potential of the writing word line Qn+1), the reading transistor RTr(n,m) is also in an off state. In this manner, data can be written in the memory cell in the (n−1)-th row.

Figure 14B:
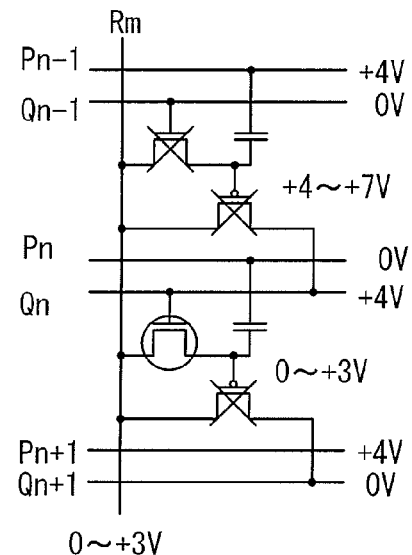

<FIG. 14B> (Writing in the n-th Row)

At the time of writing in a memory cell in the n-th row, as illustrated in FIG. 14B, the potentials of the reading word line Pn, the writing word line Qn−1, and the writing word line Qn+1 are set to 0 V, and the potentials of the reading word line Pn−1 and the reading word line Pn+1 are set to +4 V. The potential of the bit line Rm is set to a value at one of four levels of 0 V, +1 V, +2V, and +3 V, in accordance with data to be written.

The potential of the reading word line Pn−1 is increased by 4 V, so that the potential of the gate of the reading transistor RTr(n−1,m) (i.e., the potential of the drain of the writing transistor WTr(n−1,m)) is also increased to be higher than or equal to +4 V and lower than or equal to +7 V.

Then, when the potential of the writing word line Qn is set to +4 V, the writing transistor WTr(n,m) is turned on and the potential of the drain of the writing transistor WTr(n,m) becomes close to the potential of the source of the writing transistor (i.e., the potential of the bit line Rm). Here, the potential of the drain of the writing transistor WTr(n,m) becomes equal to the potential of the bit line Rm.

On the other hand, at this stage, the potential of the gate of the reading transistor RTr(n,m) is equal to the potential of the drain of the writing transistor WTr(n,m). That is, the potential of the gate of the reading transistor RTr(n,m) is equal to the potential of the source of the reading transistor RTr(n,m) (i.e., the potential of the bit line Rm).

Further, the potential of the drain of the reading transistor RTr(n,m) (i.e., the potential of the writing word line Qn+1) is 0 V. Accordingly, since the potential of the gate of the reading transistor RTr(n,m) (the potential of the bit line Rm) is higher than or equal to the potential of the source or the drain, the reading transistor RTr(n,m) is in an off state.

Note that since a potential (0 V) of a gate of the writing transistor WTr(n−1,m) is lower than or equal to the potential (0 V to +3 V) of the source thereof (i.e., the potential of the bit line Rm) and the potential of the drain thereof (+4 V to +7 V), the writing transistor WTr(n−1,m) is in an off state. Since the potential (+4 V to +7 V) of the gate of the reading transistor RTr(n−1,m) is higher than or equal to the potential (0 V to +3 V) of the source thereof (i.e., the potential of the bit line Rm) and the potential (+4 V) of the drain thereof (i.e., the potential of the writing word line Qn), the reading transistor RTr(n−1, m) is also in an off state. In this manner, data can be written in the memory cell in the n-th row.

Figure 14C:
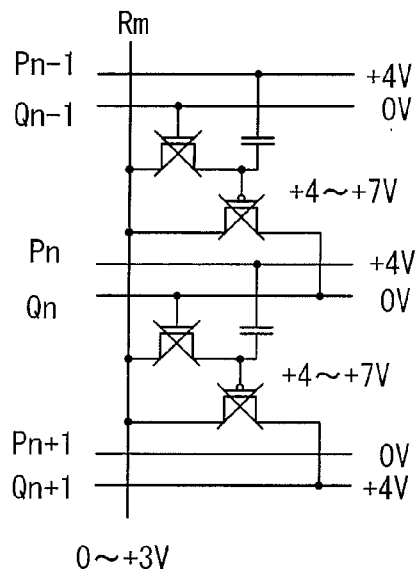

<FIG. 14C> (Writing in the (n+1)-th Row)

At the time of writing in a memory cell in the (n+1)-th row, as illustrated in FIG. 14C, the potentials of the reading word line Pn+1, the writing word line Qn−1, and the writing word line Qn are set to 0 V, and the potentials of the reading word line Pn−1 and the reading word line Pn are set to +4 V. The potential of the bit line Rm is set to a value at one of four levels of 0 V, +1 V, +2V, and +3 V, in accordance with data to be written.

The potential of the reading word line Pn is increased by 4 V, so that the potential of the gate of the reading transistor RTr(n,m) (i.e., the potential of the drain of the writing transistor WTr(n,m)) is also increased to be higher than or equal to +4 V and lower than or equal to +7 V.

Then, the potential of the writing word line Qn+1 is set to +4 V, whereby data can be written in the memory cell in the (n+1)-th row.

Since the potential (0 V) of the gate of the writing transistor WTr(n,m) is lower than or equal to the potential (+4 V to +7 V) of the drain thereof or the potential (0 V to +3 V) of the source thereof (i.e., the potential of the bit line Rm) at this stage, the writing transistor WTr(n,m) is in an off state.

The potential (+4 V to +7 V) of the gate of the reading transistor RTr(n,m) is higher than or equal to the potential (+4 V) of the drain thereof (i.e., the potential of the writing word line Qn+1) and the potential (0 V to +3 V) of the source thereof (i.e., the potential of the bit line Rm), so that the reading transistor RTr(n,m) is also in an off state.

Further, since the potential (0 V) of the gate of the writing transistor WTr(n−1,m) is lower than or equal to the potential (0 V to +3 V) of the source thereof (i.e., the potential of the bit line Rm) and the potential of the drain thereof (+4 V to +7 V), the writing transistor WTr(n−1,m) is in an off state. Since the potential (+4 V to +7 V) of the gate of the reading transistor RTr(n−1,m) is higher than the potential (0 V to +3 V) of the source thereof (i.e., the potential of the bit line Rm) and the potential (0 V) of the drain thereof (i.e., the potential of the writing word line Qn), the reading transistor RTr(n−1,m) is in an off state. In this manner, data can be written in the memory cell in the (n+1)-th row.

Figure 14D:
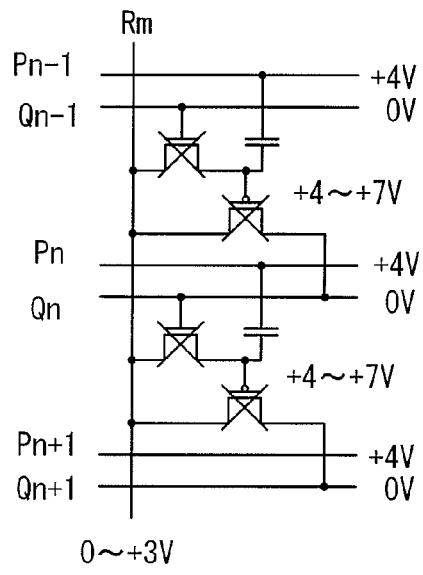

<FIG. 14D> (Writing in Another Row)

At the time of writing in a memory cell in a row other than the above-described rows, as illustrated in FIG. 14D, the potentials of the writing word line Qn−1, the writing word line Qn, and the writing word line Qn+1 are set to 0 V, and the potentials of the reading word line Pn−1, the reading word line Pn, and the reading word line Pn+1 are set to +4 V. The potential of the bit line Rm is set to a value at one of four levels of 0 V, +1 V, +2V, and +3 V, in accordance with data to be written in the row where the writing is performed.

Since the potential (0 V) of the gate of the writing transistor WTr(n,m) is lower than or equal to the potential (+4 V to +7 V) of the drain thereof or the potential (0 V to +3 V) of the source thereof (i.e., the potential of the bit line Rm) in this state, the writing transistor WTr(n,m) is in an off state.

The potential (+4 V to +7 V) of the gate of the reading transistor RTr(n,m) is higher than the potential (0 V) of the drain thereof (i.e., the potential of the writing word line Qn+1) and the potential (0 V to +3 V) of the source thereof (i.e., the potential of the bit line Rm), so that the reading transistor RTr(n,m) is also in an off state.

Further, since the potential (0 V) of the gate of the writing transistor WTr(n−1,m) is lower than or equal to the potential (0 V to +3 V) of the source thereof (i.e., the potential of the bit line Rm) and the potential of the drain thereof (+4 V to +7 V), the writing transistor WTr(n−1,m) is in an off state. Since the potential (+4 V to +7 V) of the gate of the reading transistor RTr(n−1,m) is higher than the potential (0 V to +3 V) of the source thereof (i.e., the potential of the bit line Rm) and the potential (0 V) of the drain thereof (i.e., the potential of the writing word line Qn), the reading transistor RTr(n−1,m) is in an off state.

Figure 15A:
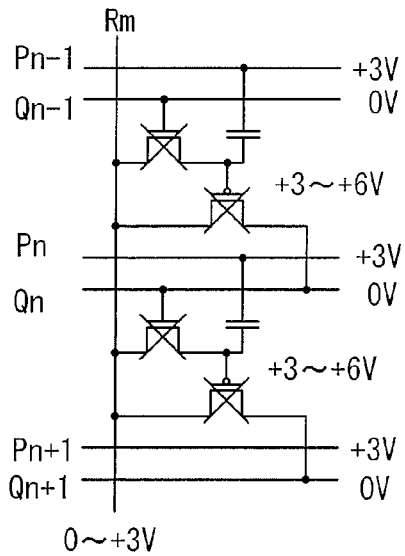
FIGS. 15A to 15D illustrate an example of a driving method (reading) of a semiconductor memory device of the present invention.

<FIG. 15A> (Reading)

Next, reading will be described. Reading of a memory cell in the n-th row will be described below; however, reading of a memory cell in another row can be performed in a similar manner. As illustrated in FIG. 15A, the potentials of the writing word line Qn−1, the writing word line Qn, and the writing word line Qn+1 are set to 0 V. Further, the potentials of the reading word line Pn−1, the reading word line Pn, and the reading word line Pn+1 are set to +3 V.

In this state, the potential of the drain of the writing transistor WTr(n,m) is set to +3 V, +4 V, +5 V, or +6 V, in accordance with the written data, and when the potential of the bit line Rm is higher than or equal to 0 V and lower than or equal to +3 V, the writing transistor WTr(n,m) and the reading transistor RTr(n,m) are in an off state. Similarly, the writing transistor WTr(n−1,m) and the reading transistor RTr(n−1,m) are in an off state. That is, a writing transistor and a reading transistor in a row where the reading is not performed are thus turned off.

Figure 15B:
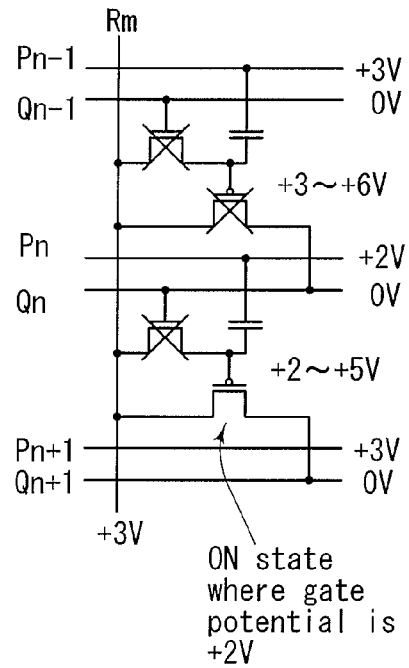

<FIG. 15B> (Reading)

On the other hand, in a row where the reading is performed, the potential of the reading word line Pn is set to a potential lower than +3 V. For example, as illustrated in FIG. 15B, the potential of the reading word line Pn is set to +2 V while the potential of the bit line Rm is +3 V. At this time, the potential of the gate of the reading transistor RTr(n,m) becomes higher than or equal to +2 V and lower than or equal to +5 V. In particular, in the case where the potential of the gate of the reading transistor RTr(n,m) is +2 V, the potential of the gate of the reading transistor RTr(n,m) is lower than the potential (+3 V) of the source (i.e., the potential of the bit line Rm), so that the reading transistor RTr(n,m) is turned on.

Although four kinds of potentials, which are 0 V, +1 V, +2 V, and +3 V, are applied at the time of writing, here, the reading transistor RTr(n,m) is turned on only in the case where a potential of 0 V is applied at the time of writing. The fact that the reading transistor RTr(n,m) is turned on can be known by a variety of methods similar to those of the other embodiments.

Figure 15C:
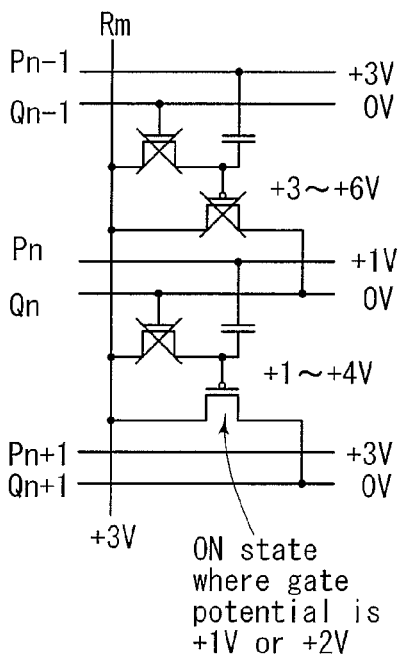

<FIG. 15C> (Reading)

In a similar manner, as illustrated in FIG. 15C, when the potential of the reading word line Pn is set to +1 V, the potential of the gate of the reading transistor RTr(n,m) is set to higher than or equal to +1 V and lower than or equal to +4 V. In particular, in the case where the potential of the gate of the reading transistor RTr(n,m) is +1 V or +2 V, the reading transistor RTr(n,m) is turned on. Here, the reading transistor RTr(n,m) is turned on only in the case where a potential of 0 V or +1 V is applied at the time of writing.

Figure 15D:
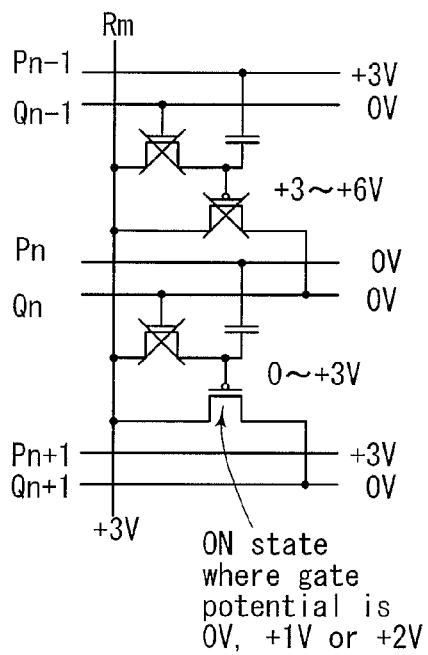

<FIG. 15D> (Reading)

As illustrated in FIG. 15D, when the potential of the reading word line Pn is set to 0 V, the potential of the gate of the reading transistor RTr(n,m) is set to higher than or equal to 0 V and lower than or equal to +3 V. In particular, in the case where the potential of the gate of the reading transistor RTr(n,m) is 0 V, +1 V, or +2 V, the reading transistor RTr(n,m) is turned on. Here, the reading transistor RTr(n,m) is turned on only in the case where a potential of 0V, +1 V, or +2 V is applied at the time of writing.

It can be assumed that the potential of the gate of the reading transistor RTr(n,m) is +3 V in the case where the reading transistor RTr(n,m) remains off even when the potential of the reading word line Pn is set to 0 V. This is only in the case where a potential of +3 V is applied at the time of writing.

In the above process, the writing transistor WTr(n,m), the writing transistor WTr(n−1,m), and the reading transistor RTr(n−1,m) remain in an off state. In this manner, the data (2 bits) at four stages can be written and read. Needless to say, much more data such as data (3 bits) at eight stages or data (4 bits) at 16 stages can be written and read in a similar manner.

In the above description, the parasitic capacitance and the gate capacitance of the reading transistor RTr(n,m) are ignored as compared to the capacitance of the capacitor C(n, m); however, voltage to be applied needs to be determined in view of these capacitance in an actual memory cell.

(Embodiment 8)

Figure 16A:
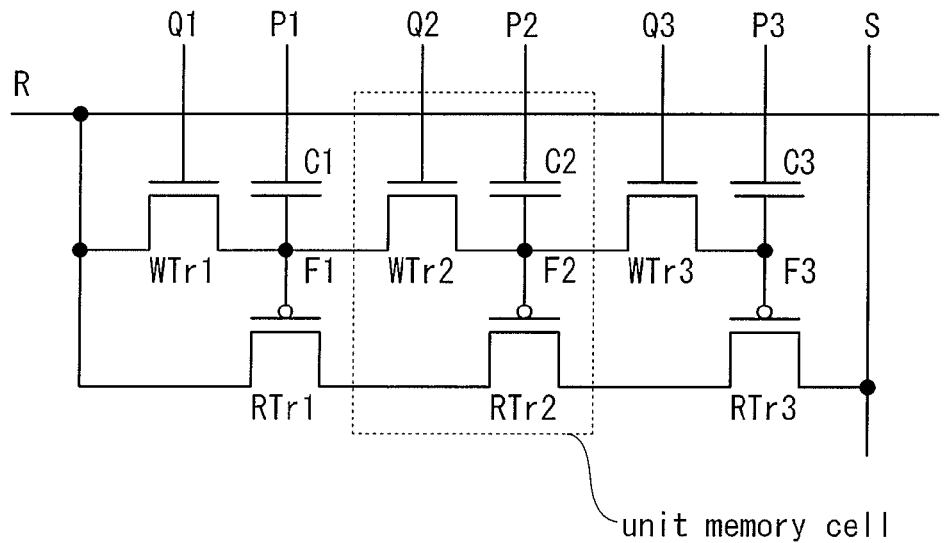
FIGS. 16A and 16B illustrate an example of a semiconductor memory device of the present invention.

In this embodiment, an example of operation of the semiconductor memory circuit illustrated in FIG. 16A will be described with reference to FIGS. 17A to 17D and FIGS. 18A to 18F. Note that specific values are given below as potentials for the purpose of aid for understanding a technical idea of the present invention. Needless to say, such values are changed in accordance with various characteristics of a transistor, a capacitor, or the like, or for convenience of the practitioner. The semiconductor memory device illustrated in FIG. 16A can write or read data by a method other than a method described below.

Here, the writing transistors WTr1, WTr2, and WTr3 are n-channel transistors and the reading transistor RTr1, RTr2, and RTr3 are p-channel transistors. The writing transistor is turned on when a potential of the gate is higher than a lower potential of either the source or the drain by 1 V or more, and the writing transistor is in an off state under the other conditions. The reading transistor is turned on when a potential of the gate is lower than a higher potential of either the source or the drain by 1 V or more, and the reading transistor is in an off state under the other conditions.

A portion of the gate capacitance of the reading transistor, which is changed due to the gate bias, is negligible as compared to the capacitance of the capacitor C. Further, the parasitic capacitance of the writing transistor WTr, the parasitic capacitance of the reading transistor RTr, the parasitic capacitance generated between wirings, and the like, which are not illustrated in the drawings, are considered to be 0. In FIGS. 17A to 17D and FIGS. 18A to 18F, a circle is on a transistor in an on state, and a cross mark is on a transistor in an off state. A description is written in the drawings in some cases when a transistor is turned on under a specific condition. In the example described below, the potential of the bias line S is always 0 V.

Figure 17A:
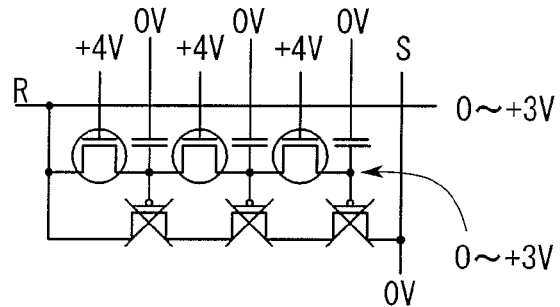
FIGS. 17A to 17D illustrate an example of a driving method (writing) of a semiconductor memory device of the present invention.

First, writing in this memory unit will be described. Writing is started from the rightmost memory cell. At the time of writing, as illustrated in FIG. 17A, potentials of reading word lines P1, P2, and P3 are set to 0 V. A potential of a bit line R is set to a value at one of four levels of 0 V, +1 V, +2 V, and +3 V, in accordance with data to be written.

Then, potentials of writing word lines Q1, Q2, and Q3 are set to +4 V, whereby the writing transistors WTr1, WTr2, and WTr3 are turned on and a potential of a drain of the writing transistor WTr3 (i.e., a potential of a node F3) becomes close to the potential of the bit line R. Here, the potential of the drain of the writing transistor WTr3 becomes equal to the potential of the bit line R.

Figure 17B:
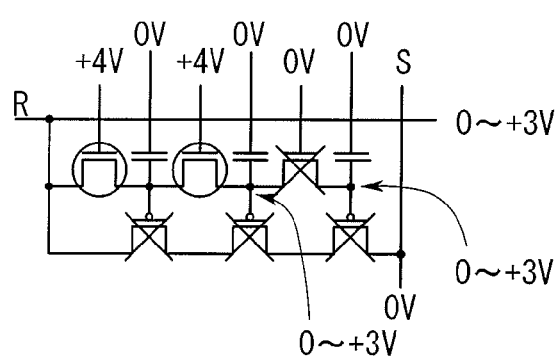
Figure 17C:
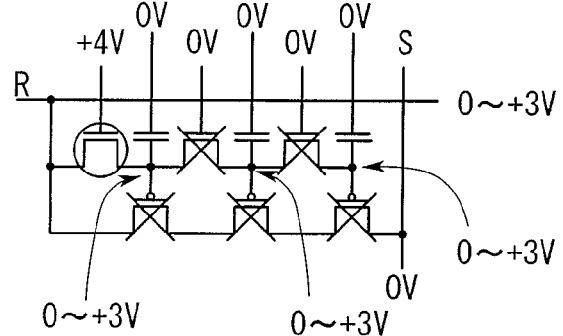

On the other hand, at this stage, the reading transistors RTr1, RTr2, and RTr3 are in an off state. Then, as illustrated in FIG. 17B, the potential of the writing word line Q3 is set to 0 V. Accordingly, the writing transistor WTr3 is turned off and the potential of the bit line R just before the writing transistor WTr3 is turned off is held in the node F3. In this manner, data can be written in the rightmost memory cell.

Next, data is written in the central memory cell. In a state illustrated in FIG. 17B, a potential of a node F2 is equal to the potential of thee bit line R. Then, when the potential of the writing word line Q2 is set to 0 V (see FIG. 17C), the writing transistor WTr2 is turned off and the potential of the bit line R just before the writing transistor WTr2 is turned off is held in the node F2. In this manner, data can be written in the central memory cell.

Figure 17D:
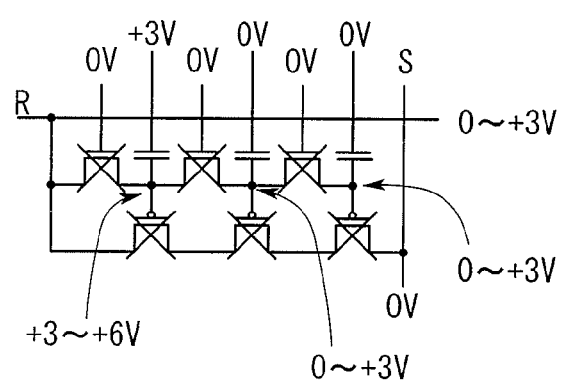

In this manner, data can be written in all the memory cells. In the case where writing operation in the memory unit is not required (e.g., the case where data is written in another memory unit), as illustrated in FIG. 17D, the potential of the reading word line P1 may be set to +3 V. At this time, a potential of a node F1 is set to higher than or equal to +3 V and lower than or equal to +6 V. Since the potential of the bit line R is higher than or equal to 0 V and lower than or equal to +3 V, the reading transistor RTr1 can remain in an off state.

Figure 18A:
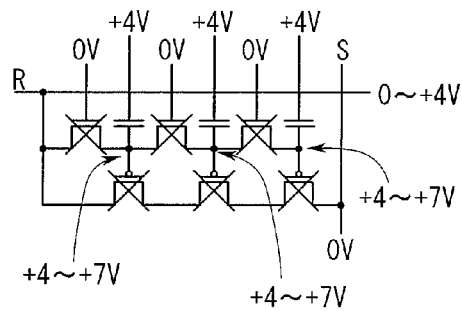
FIGS. 18A to 18F illustrate an example of a driving method (reading) of a semiconductor memory device of the present invention.

Next, reading will be described with reference to FIGS. 18A to 18F. First, in the case where reading is performed in a row other than the row including the memory unit, as illustrated in FIG. 18A, the potentials of the writing word lines Q1, Q2, and Q3 are set to 0 V, and the potentials of the reading word lines P1, P2, and P3 are set to +4 V. Accordingly, the writing transistors WTr1, WTr2, and WTr3 are turned off. Further, the potentials of the nodes F1, F2, and F3 are higher than or equal to +4 V and lower than or equal to +7 V. Since the potential of the bit line R is higher than or equal to 0 V and lower than or equal to +4 V to be described later, the reading transistors RTr1, RTr2, and RTr3 remain in an off state.

Figure 18B:
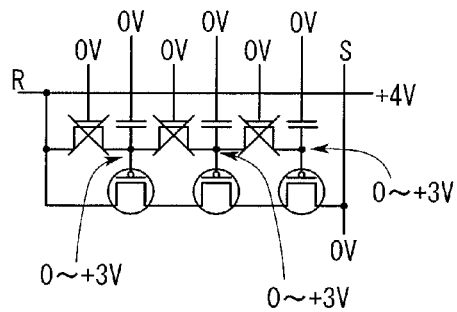

In the case where reading is performed in the memory unit, as illustrated in FIG. 18B, the potentials of the writing word lines Q1, Q2, and Q3 are set to 0 V, and the potentials of the reading word lines P1, P2, and P3 are set to 0 V. The potential of the bit line is set to +4 V. At this time, the writing transistors WTr1, WTr2, and WTr3 are in an off state. The potentials of the nodes F1, F2, and F3 are higher than or equal to 0 V and lower than or equal to +3 V, so that the reading transistors RTr1, RTr2, and RTr3 are turned on. Therefore, current flows between the bit line R and the bias line S.

In the case where a capacitor is provided in an end portion of the bit line R, the initial potential (+4 V) of the bit line R becomes close to the potential (0 V) of the bias line S when current flows between the bit line R and the bias line S. The potential of the bit line R is finally determined in accordance with the minimum values of the potentials of the nodes F1, F2, and F3. In any cases, the potential of the bit line R is changed within a range of higher than or equal to 0 V and lower than or equal to +4 V.

Figure 18C:
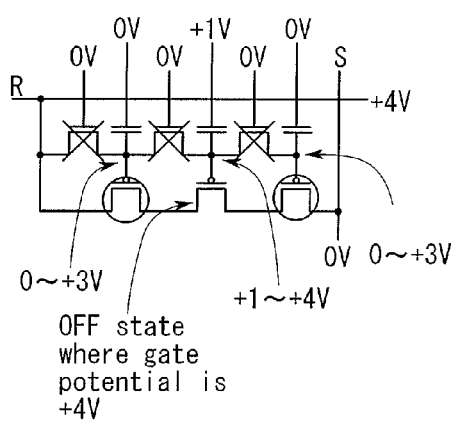

The data of the central memory cell in the memory unit is read below. As illustrated in FIG. 18C, when the potential of the reading word line P2 is increased to +1 V, the potential of the node F2 is set to +1 V, +2 V, +3 V, or +4 V in accordance with the written data. Here, when the potential of the node F2 is +4 V, the reading transistor RTr2 is turned off and current stops flowing between the bit line R and the bias line S.

At this stage, the potential of the node F2 is +4 V only in the case where the potential of the bit line is +3 V at the time of writing. That is, when the potential of the reading word line P2 is +1 V and the reading transistor RTr2 is in an off state, it is found that the potential of the bit line R is +3 V at the time of writing. Thus, a value of held data can be found.

Figure 18D:
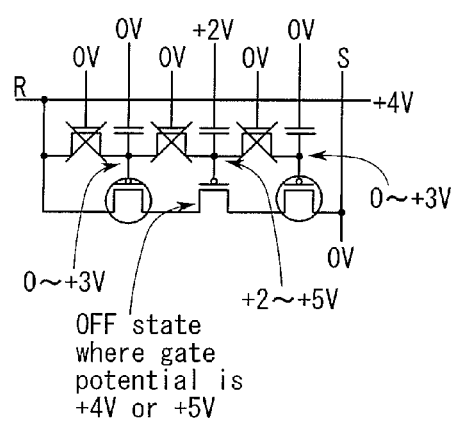

Further, as illustrated in FIG. 18D, when the potential of the reading word line P2 is increased to +2 V, the potential of the node F2 is set to +2 V, +3 V, +4 V, or +5 V in accordance with the written data. Here, when the potential of the node F2 is +4 V or +5 V, the reading transistor RTr2 is turned off and current stops flowing between the bit line R and the bias line S.

A value of the data can be found by detection of the current flow. That is, the potential of the gate of the reading transistor RTr2 is +4 V or +5 V at this stage only in the case where the potential of the bit line R is +2 V or +3 V at the time of writing. In the case where the reading transistor RTr2 is in an on state with the potential of the reading word line P2 of +1 V (i.e., the state illustrated in FIG. 18C) but is in an off state with the potential of the reading word line P2 of +2 V, the potential of the bit line R is +2 V at the time of writing.

Figure 18E:
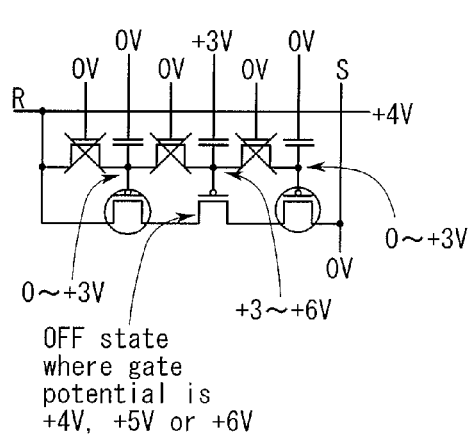

Similarly, as illustrated in FIG. 18E, when the potential of the reading word line P2 is increased to +3 V, the potential of the node F2 is set to +3 V, +4 V, +5 V, or +6 V in accordance with the written data. Here, when the potential of the node F2 is +4 V, +5 V, or +6 V, the reading transistor RTr2 is turned off and current stops flowing between the bias line R and the bias line S. That is, the potential of the bit line is +1 V, +2 V, or +3 V at the time of writing.

In the case where the potential of the bit line is 0 V at the time of writing, the potential of the node F2 is +3 V when the potential of the reading word line P2 is set to +3 V, and the reading transistor RTr2 is still in an on state. That is, in the case where current flows between the bit line R and the bias line S even when the potential of the reading word line P2 is +3 V, it is found that the potential of the bit line is 0 V at the time of writing.

Figure 18F:
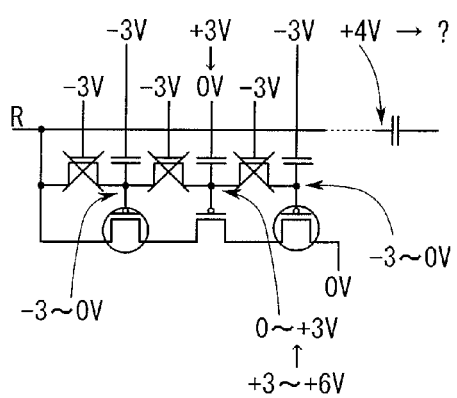
Figure 19:
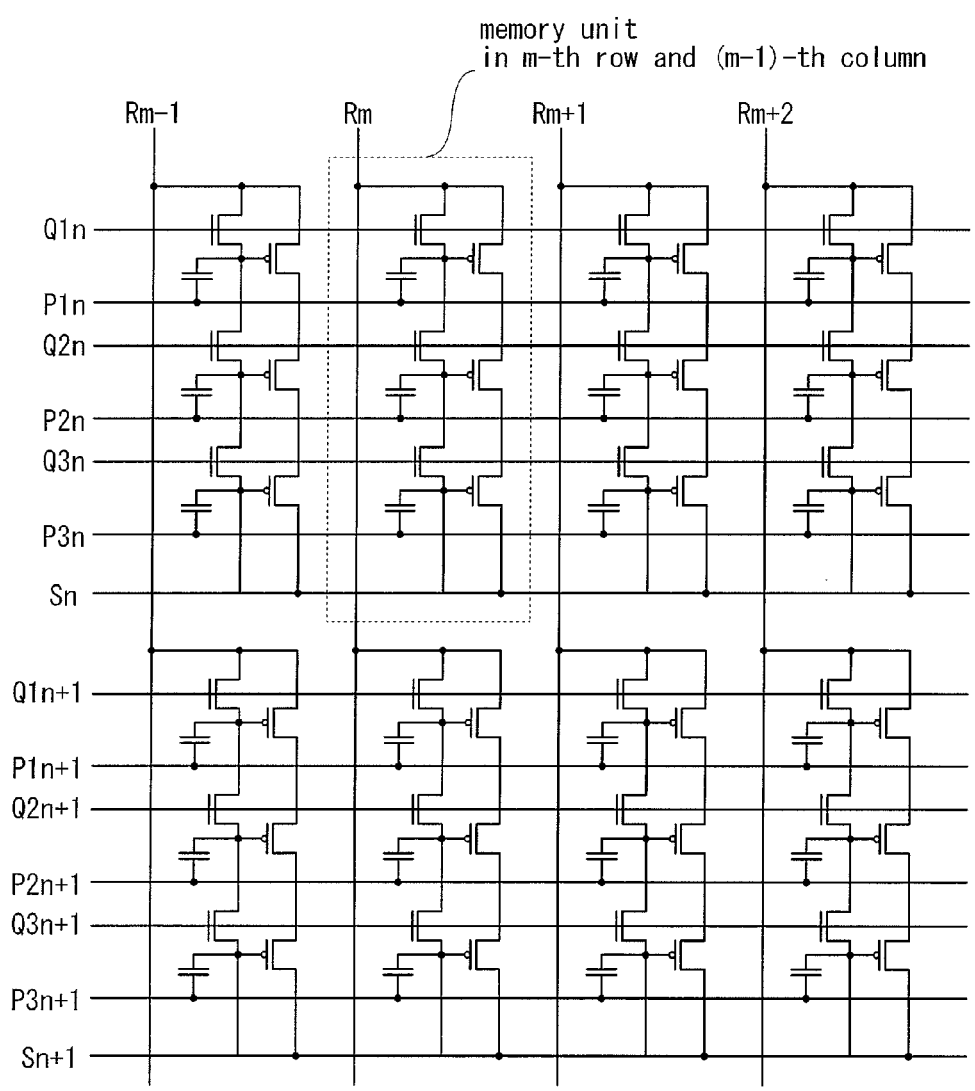
FIG. 19 illustrates an example of a semiconductor memory device of the present invention.

The above described is the method for finding the value of the data by successively changing the potential of the reading word line P2; however, the value of the data can be found by measurement of a potential. For example, as illustrated in FIG. 18F, a capacitor is provided in an end portion of the bit line and a potential on the memory cell side is set to 0 V.

Further, the potentials of the writing word lines Q1, Q2, and Q3 and the potentials of the reading word lines P1 and P3 are set to −3 V. In this state, since the potentials of the nodes F1 and F3 are higher than or equal to −3 V and lower than or equal to 0 V, the reading transistors RTr1, RTr2, and RTr3 can be turned on by setting the potential of the node F2 to an appropriate value, and the potential of the bit line R can become close to the potential (0 V) of the bias line S. For example, when the potential of the node F2 is lower than or equal to 0 V, the potential of the capacitor of the bit line R is higher than or equal to 0 V and lower than +1 V.

When the potential of the reading word line P2 is set to +3V first, the potential of the node F2 is higher than or equal to +3 V and lower than or equal to +6V, so that the reading transistor RTr2 at this stage is in an off state. Then, when the potential of the reading word line P2 is decreased to 0 V, the potential of the node F2 is higher than or equal to 0 V and lower than or equal to +3 V, so that the reading transistor RTr2 is turned on.

As described above, when the potential of the node F2 is 0V, the potential of the capacitor of the bit line R is higher than or equal to 0 V and lower than 1 V. Here, the potential of the node F2 becomes 0 V in the case where the potential of the bit line at the time of writing is 0 V.

Similarly, when the potential of the node F2 is +1 V, the potential of the capacitor of the bit line R is higher than or equal to +1 V and lower than +2 V. When the potential of the node F2 is +2 V, the potential of the capacitor of the bit line R is higher than or equal to +2 V and lower than +3 V. When the potential of the node F2 is +3 V, the potential of the capacitor of the bit line R is higher than or equal to +3 V and lower than +4 V. In each case, the potential of the bit line at the time of writing can be detected. That is, the potential of the node F2 can be found by measurement of the potential of the capacitor of the bit line R, and further, the potential of the bit line at the time of writing can be found.

In this manner, the data (2 bits) at four stages can be written and read. Needless to say, much more data such as data (3 bits) at eight stages or data (4 bits) at 16 stages can be written and read in a similar manner.

In the above description, the parasitic capacitance and the gate capacitance of the reading transistor RTr(n,m) are ignored as compared to the capacitance of the capacitor C(n,m); however, voltage to be applied needs to be determined in view of these capacitance in an actual memory cell.

The gate capacitance of the reading transistor RTr(n,m) in an on state and that in an off state greatly varies; therefore, the potential of the gate of the reading transistor RTr(n,m) is influenced by the variation. As the ratio of the gate capacitance of the reading transistor RTr(n,m) to the capacitance of the capacitor C(n,m) is higher, the influence is bigger. Accordingly, the capacitance of the capacitor C(n,m) is preferably larger than or equal to twice as large as the gate capacitance of the reading transistor RTr(n,m).

(Embodiment 9)

In this embodiment, examples of a shape and a manufacturing method of the semiconductor memory device described in Embodiment 8 will be described. In this embodiment, an oxide semiconductor containing gallium and indium is used for a writing transistor and a single crystal silicon semiconductor is used for a reading transistor. Therefore, the writing transistor is stacked over the reading transistor. Note that as for the details of the manufacturing method and the like, a known semiconductor manufacturing technique or Embodiment 3 may be referred to.

Figure 22A:
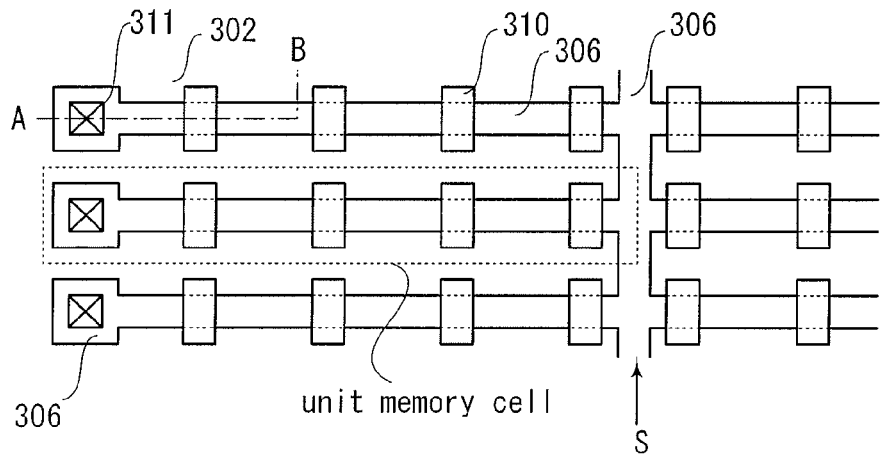
FIGS. 22A to 22C illustrate an example of layout and the like of wirings of a semiconductor memory device of the present invention.
Figure 22B:
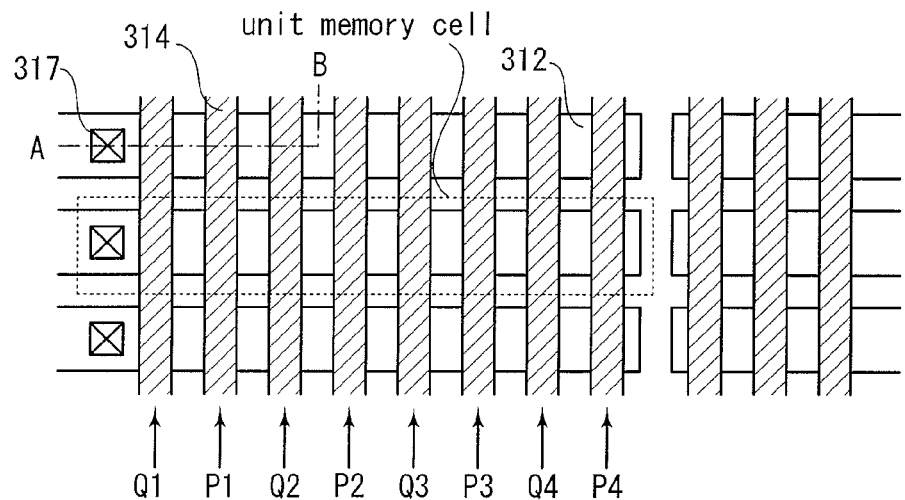
Figure 22C:
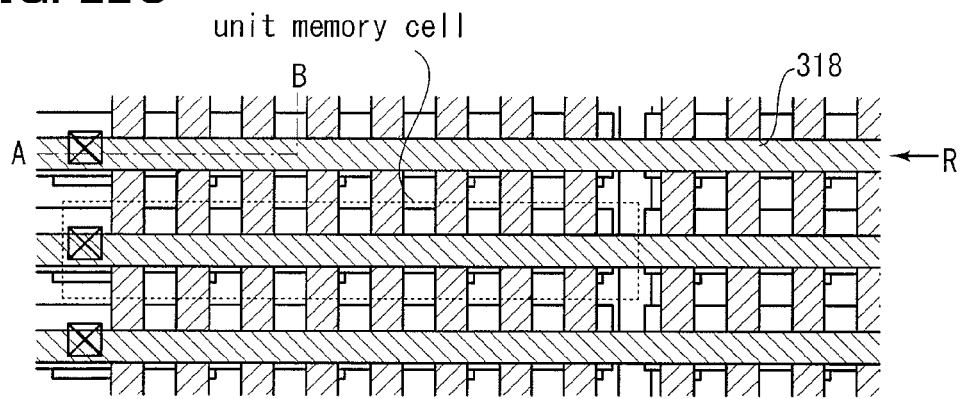

An example of layout of a memory unit of the semiconductor memory device in this embodiment is illustrated in FIGS. 22A to 22C. In this embodiment, a single memory unit includes four memory cells.

In FIG. 22A, main wirings, main electrodes, and the like provided over a single crystal silicon substrate are illustrated. An element separation region 302 is formed over the substrate. Over the substrate, a conductive region 306 is formed using a conductive material (e.g., silicide) or doped silicon. Part of the conductive region 306 serves as a source and a drain of the reading transistor. Further, another part of the conductive region 306 serves as part of a bias line S. Some portions of the conductive region 306 are separated from each other by a reading gate 310 of the reading transistor. A first connection electrode 311 is provided in part of the conductive region 306.

When the bias line S is formed with the use of the conductive region 306, the integration degree can be increased. In that case, the bias line S is preferably provided so as to be parallel to a writing word line and a reading word line (that is, orthogonal to a bit line). Note that as illustrated in FIG. 22A, the integration degree can be increased in such a manner that a memory unit shares one bias line S with an adjacent memory unit (a memory unit provided on the right side, with the bias line S therebetween).

As materials for the reading gate 310 and the first connection electrode 311, the materials for the reading gate 110 and the first connection electrode 111, which are described in Embodiment 3 (illustrated in FIGS. 8A to 8D), may be used.

Main wirings, main electrodes, and the like, focusing on the transistor including an oxide semiconductor, which is formed over the circuit illustrated in FIG. 22A, are illustrated in FIG. 22B. A plurality of island-shaped oxide semiconductor regions 312 and a plurality of first wirings 314 are formed. The first wirings 314 serve as reading word lines Q1, Q2, Q3, and Q4, and reading word lines P1, P2, P3, and P4.

Part of the first wiring 314 overlaps with the oxide semiconductor and serves as a gate electrode of the writing transistor. The oxide semiconductor region 312 is in contact with the reading gate 310 in a lower layer. Further, a capacitor is formed in a portion where part of the first wiring 314 overlaps with the reading gate 310. A second connection electrode 317 for connecting to an upper layer (e.g., a bit line R) is provided in part of the oxide semiconductor region 312.

FIG. 22C illustrates a structure where the structure illustrated in FIG. 22A overlaps with the structure illustrated in FIG. 22B. In FIG. 22C, the structures are shifted a little from each other so as to see the overlap. Further, a second wiring 318 formed over the transistor including an oxide semiconductor is also illustrated. Part of the second wiring 318 serves as the bit line R. Note that a dot A and a dot B denote the same positions through FIGS. 22A to 22C.

In FIGS. 22A to 22C, the width of the conductive region 306 and the first wiring 314 are processed to have the minimum feature size F. That is, the line width and the line interval are F. In that case, the size of the unit memory cell is 12 $F^2$. The memory unit includes a portion shared by the memory cells, so that the area per memory cell is actually greater than 12 $F^2$. The memory unit illustrated in FIGS. 22A to 22C are provided with four memory cells; as the number of memory cells in a memory unit is increased, the area per memory cell becomes close to 12 $F^2$.

(Embodiment 10)

Figure 16B:
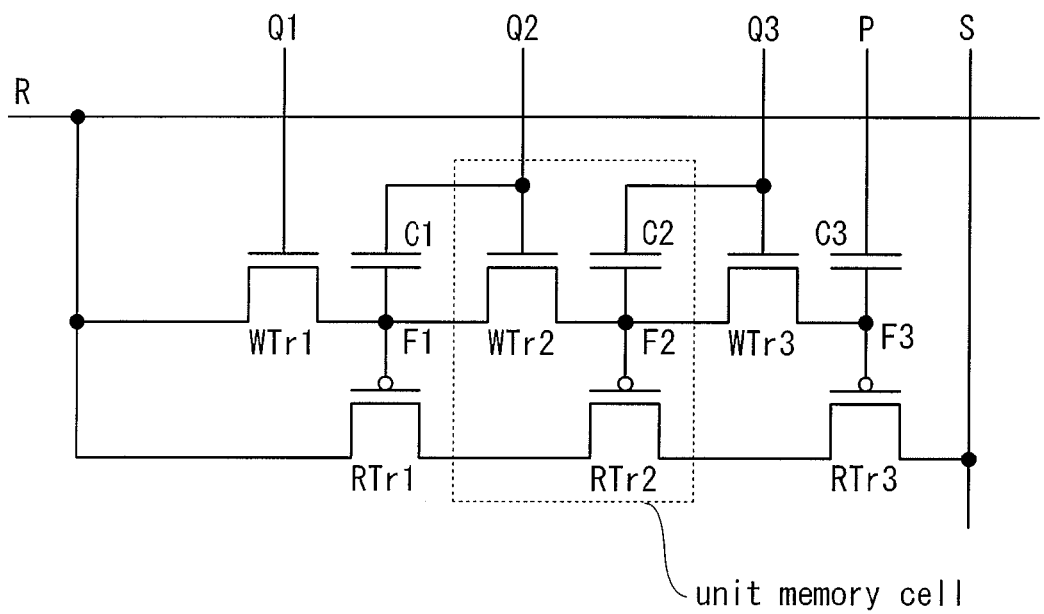

In this embodiment, an example of operation of the semiconductor memory circuit illustrated in FIG. 16B will be described with reference to FIGS. 20A to 20D and FIGS. 21A to 21E. Note that specific values are given below as potentials for the purpose of aid for understanding a technical idea of the present invention. Needless to say, such values are changed in accordance with various characteristics of a transistor, a capacitor, or the like, or for convenience of the practitioner. The semiconductor memory device illustrated in FIG. 16B can write or read data by a method other than a method described below.

Here, the writing transistors WTr1, WTr2, and WTr3 are n-channel transistors and the reading transistor RTr1, RTr2, and RTr3 are p-channel transistors. The writing transistor is turned on when a potential of the gate is higher than a potential of either the source or the drain by 1 V or more, and the writing transistor is in an off state under the other conditions. The reading transistor is turned on when a potential of the gate is lower than a potential of either the source or the drain by 1 V or more, and the reading transistor is in an off state under the other conditions.

A portion of the gate capacitance of the reading transistor, which is changed due to the gate bias, is negligible as compared to the capacitance of the capacitor C. Further, the parasitic capacitance of the writing transistor WTr, the parasitic capacitance of the reading transistor RTr, the parasitic capacitance generated between wirings, and the like, which are not illustrated in the drawings, are considered to be 0. In FIGS. 20A to 20D and FIGS. 21A to 21E, a circle is on a transistor in an on state, and a cross mark is on a transistor in an off state. A description is written in the drawings in some cases when a transistor is turned on under a specific condition. In the example described below, the potential of the bias line S is always 0 V.

Figure 20A:
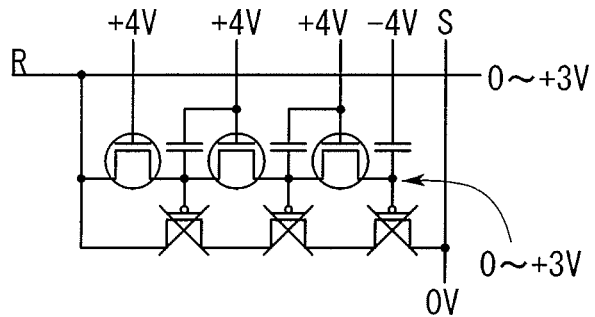
FIGS. 20A to 20D illustrate an example of a driving method (writing) of a semiconductor memory device of the present invention.

Writing is started from the rightmost memory cell. At the time of writing, as illustrated in FIG. 20A, potentials of writing word lines Q1, Q2, and Q3 are set to +4 V, and a potential of a reading word line P is set to −4 V. A potential of a bit line R is set to a value at one of four levels of 0 V, +1 V, +2 V, and +3 V in accordance with data to be written.

At this state, the writing transistors WTr1, WTr2, and WTr3 are turned on and a potential of a node F3 becomes close to the potential of the bit line R. Here, the potential of the node F3 becomes equal to the potential of the bit line R.

Figure 20B:
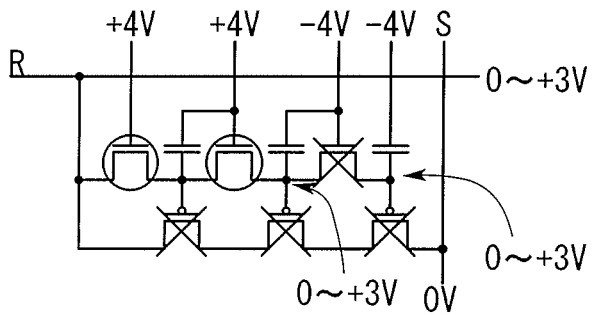
Figure 20C:
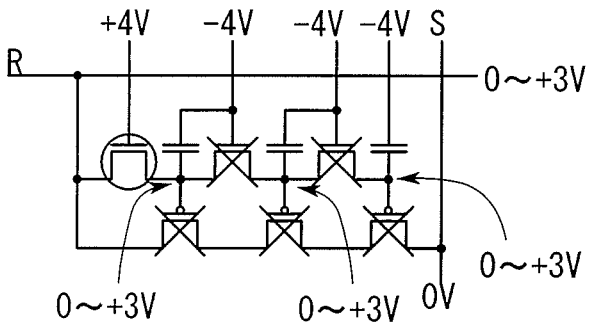

On the other hand, at this stage, the reading transistors RTr1, RTr2, and RTr3 are in an off state. Then, as illustrated in FIG. 20B, the potential of the writing word line Q3 is set to −4 V. Accordingly, the writing transistor WTr3 is turned off and the potential of the bit line R just before the writing transistor WTr3 is turned off is held in the node F3. In this manlier, data can be written in the rightmost memory cell.

Next, data is written in the central memory cell. In a state illustrated in FIG. 20B, a potential of a node F2 is equal to the potential of thee bit line R. Then, when the potential of the writing word line Q2 is set to −4 V (see FIG. 20C), the writing transistor WTr2 is turned off and the potential of the bit line R just before the writing transistor WTr2 is turned off is held in the node F2. In this manner, data can be written in the central memory cell. In this manner, data is sequentially written in other memory cells and data can be written in all the memory cells.

Figure 20D:
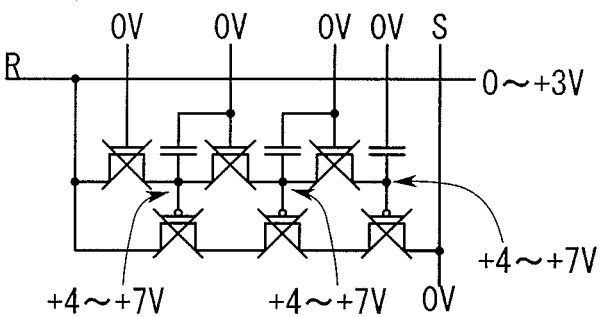

In the case where writing operation in the memory unit is not required, as illustrated in FIG. 20D, the potentials of the writing word lines Q1, Q2, and Q3 may be set to 0 V and the potential of the reading word line P may be set to 0 V. At this time, a potential of a node F1 is set to higher than or equal to +4 V and lower than or equal to +7 V. Since the potential of the bit line R is higher than or equal to 0 V and lower than or equal to +3 V, the reading transistors RTr1, RTr2, and RTr3 can remain in an off state.

Figure 21A:
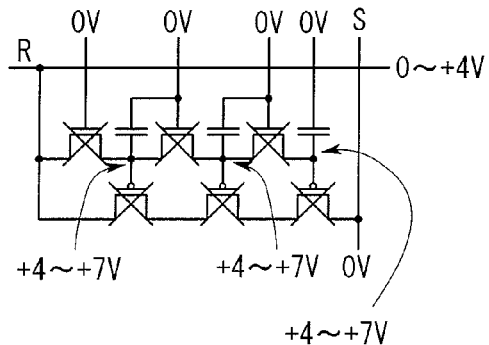
FIGS. 21A to 21E illustrate an example of a driving method (reading) of a semiconductor memory device of the present invention.

Next, reading will be described with reference to FIGS. 21A to 21E. First, in the case where reading is performed in a row other than the row including the memory unit, as illustrated in FIG. 21A, the potentials of the writing word lines Q1, Q2, and Q3 are set to 0 V, and the potential of the reading word line P is set to 0 V. Accordingly, the writing transistors WTr1, WTr2, and WTr3 are turned off. Further, the potentials of the nodes F1, F2, and F3 are higher than or equal to +4 V and lower than or equal to +7 V. Since the potential of the bit line R is higher than or equal to 0 V and lower than or equal to +4 V to be described later, the reading transistors RTr1, RTr2, and RTr3 remain in an off state.

Figure 21B:
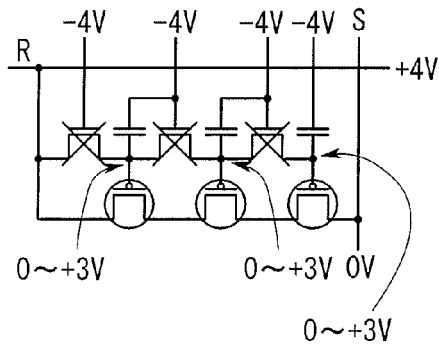

In the case where reading is performed in the memory unit, as illustrated in FIG. 21B, the potentials of the writing word lines Q1, Q2, and Q3 are set to −4 V, and the potential of the reading word line P is set to −4 V. The potential of the bit line is set to +4 V. At this time, the writing transistors WTr1, WTr2, and WTr3 are in an off state. The potentials of the nodes F1, F2, and F3 are higher than or equal to 0 V and lower than or equal to +3 V, so that the reading transistors RTr1, RTr2, and RTr3 are turned on. Therefore, current flows between the bit line R and the bias line S.

In the case where a capacitor is provided in an end portion of the bit line R, the initial potential (+4 V) of the bit line R becomes close to the potential (0 V) of the bias line S when current flows between the bit line R and the bias line S. The potential of the bit line R is finally determined in accordance with the minimum values of the potentials of the nodes F1, F2, and F3. In any cases, the potential of the bit line R is changed within a range of higher than or equal to 0 V and lower than or equal to +4 V.

Figure 21C:
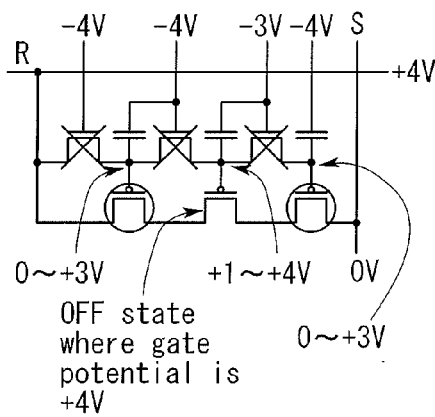

The data of the central memory cell in the memory unit is read below. As illustrated in FIG. 21C, when the potential of the writing word line Q3 is increased to −3 V, the potential of the node F2 is set to +1 V, +2 V, +3 V, or +4 V in accordance with the written data. Here, when the potential of the node F2 is +4 V, the reading transistor RTr2 is turned off and current stops flowing between the bit line R and the bias line S.

At this stage, the potential of the node F2 is +4 V only in the case where the potential of the bit line is +3 V at the time of writing. That is, when the potential of the writing word line Q3 is +1 V and the reading transistor RTr2 is in an off state, it is found that the potential of the bit line R is +3 V at the time of writing. Thus, a value of data can be found.

Figure 21D:
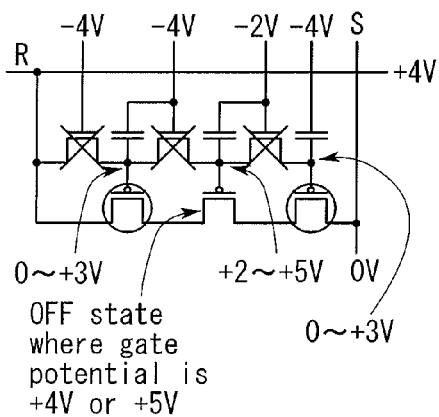

Further, as illustrated in FIG. 21D, when the potential of the writing word line Q3 is increased to −2 V, the potential of the node F2 is set to +2 V, +3 V, +4 V, or +5 V in accordance with the written data. Here, when the potential of the node F2 is +4 V or +5 V, the reading transistor RTr2 is turned off and current stops flowing between the bit line R and the bias line S. The potential of the node F2 is +4 V or +5 V only in the case where the potential of the bit line at the time of writing is +2 V or +3 V.

Figure 21E:
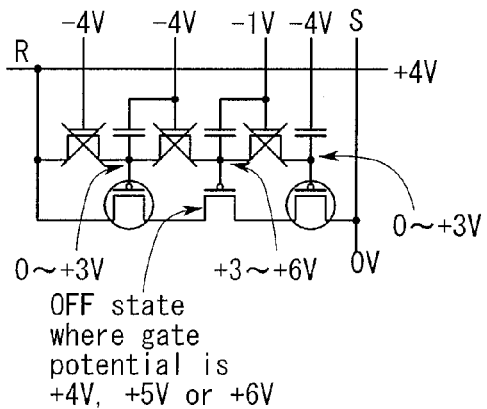

Similarly, as illustrated in FIG. 21E, when the potential of the writing word line Q3 is increased to −1 V, the potential of the node F2 is set to +3 V, +4 V, +5 V, or +6 V in accordance with the written data. Here, when the potential of the node F2 is +4 V, +5 V, or +6 V, the reading transistor RTr2 is turned off and current stops flowing between the bias line R and the bias line S. That is, the potential of the bit line is +1 V, +2 V, or +3 V at the time of writing.

In the case where the potential of the bit line is 0 V at the time of writing, the potential of the node F2 is +3 V when the potential of the writing word line Q3 is set to −1 V, and the reading transistor RTr2 is still in an on state. That is, in the case where current flows between the bit line R and the bias line S even when the potential of the writing word line Q3 is −1 V, it is found that the potential of the bit line R is 0 V at the time of writing.

Note that in a manner similar to that described with reference to FIG. 18F in Embodiment 8, multivalued data can be read by measurement of a potential.

In this manner, the data (2 bits) at four stages can be written and read. Needless to say, much more data such as data (3 bits) at eight stages or data (4 bits) at 16 stages can be written and read in a similar manner.

In the above description, the parasitic capacitance and the gate capacitance of the reading transistor RTr(n,m) are ignored as compared to the capacitance of the capacitor C(n, m); however, voltage to be applied needs to be determined in view of these capacitance in an actual memory cell.

The gate capacitance of the reading transistor RTr(n,m) in an on state and that in an off state greatly varies; therefore, the potential of the gate of the reading transistor RTr(n,m) is influenced by the variation. As the ratio of the gate capacitance of the reading transistor RTr(n,m) to the capacitance of the capacitor C(n,m) is higher, the influence is bigger. Accordingly, the capacitance of the capacitor C(n,m) is preferably larger than or equal to twice as large as the gate capacitance of the reading transistor RTr(n,m).

(Embodiment 11)

Figure 23A:
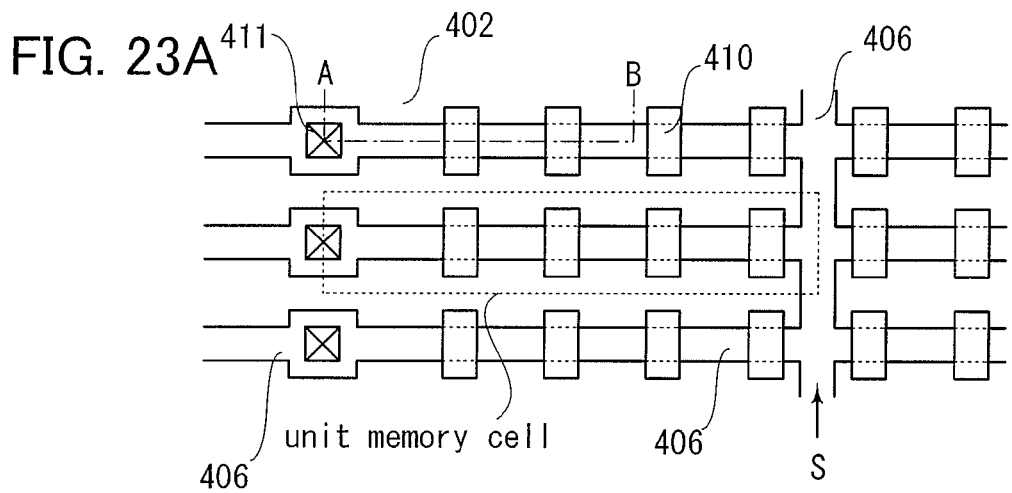
FIGS. 23A to 23C illustrate an example of layout and the like of wirings of a semiconductor memory device of the present invention.
Figure 23B:
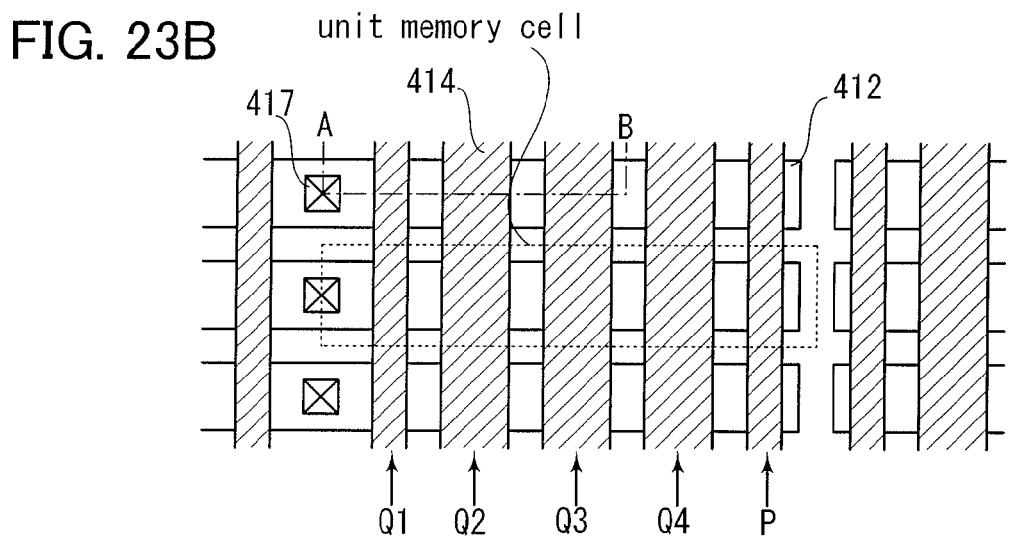
Figure 23C:
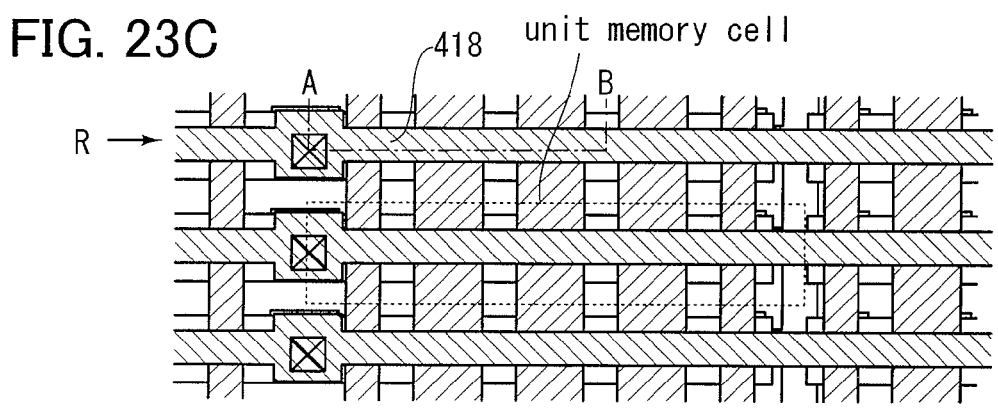

In this embodiment, examples of a shape and a manufacturing method of the semiconductor memory device described in Embodiment 10 will be described. An example of layout of a memory unit of the semiconductor memory device of this embodiment is illustrated in FIGS. 23A to 23C. In this embodiment, a single memory unit includes four memory cells.

In FIG. 23A, main wirings, main electrodes, and the like provided over a single crystal silicon substrate are illustrated. An element separation region 402 is formed over the substrate. A conductive region 406 is formed using a conductive material or doped silicon and part thereof serves as a source and a drain of a reading transistor. Another part of the conductive region 406 serves as part of a bias line S. Some portions of the conductive region 406 are separated from each other by a reading gate 410 of the reading transistor. A first connection electrode 411 is provided in part of the conductive region 406. In this embodiment, the integration degree can be increased in such a manner that one first connection electrode 411 is shared by adjacent memory units. As materials for the reading gate 410 and the first connection electrode 411, the materials which satisfy conditions for the reading gate 310 and the first connection electrode 311, which are described in Embodiment 9, may be used.

Main wirings, main electrodes, and the like, focusing on the transistor including an oxide semiconductor, which is formed over the circuit illustrated in FIG. 23A, are illustrated in FIG. 23B. A plurality of island-shaped oxide semiconductor regions 412 and a plurality of first wirings 414 are formed. The first wirings 414 serve as reading word lines Q1, Q2, Q3, and Q4, and a reading word line P.

Part of the first wiring 414 overlaps with the oxide semiconductor and serves as a gate electrode of the writing transistor. The oxide semiconductor region 412 is in contact with the reading gate 410 in a lower layer. Further, a capacitor is formed in a portion where part of the first wiring 414 overlaps with the reading gate 410. A second connection electrode 417 for connecting to an upper layer (e.g., a bit line R) is provided in the oxide semiconductor region 412.

FIG. 23C illustrates a structure where the structure illustrated in FIG. 23A overlaps with the structure illustrated in FIG. 23B. In FIG. 23C, the structures are shifted a little from each other so as to see the overlap. Further, a second wiring 418 formed over the transistor including an oxide semiconductor is also illustrated. Part of the second wiring 418 serves as the bit line R.

Note that a dot A and a dot B denote the same positions through FIGS. 23A to 23C. In FIGS. 23A to 23C, the width of the conductive region 406 is processed to have the minimum feature size F. That is, the line width and the line interval are F. In that case, the size of the unit memory cell is 9 $F^2$. The memory unit includes a portion shared by the memory cells, so that the area per memory cell is actually greater than 9 $F^2$. The memory unit illustrated in FIGS. 23A to 23C are provided with four memory cells; as the number of memory cells in a memory unit is increased, the area per memory cell becomes close to 9 $F^2$.

Figure 24A:
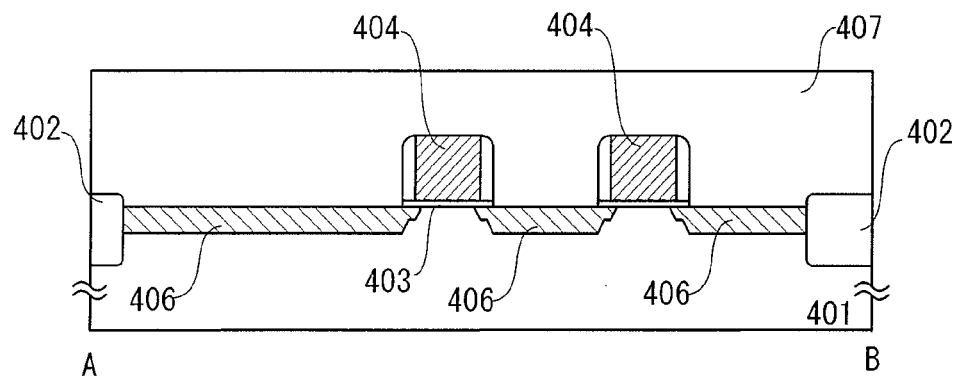
FIGS. 24A to 24C illustrate an example of a manufacturing process of a semiconductor memory device of the present invention.
Figure 24B:
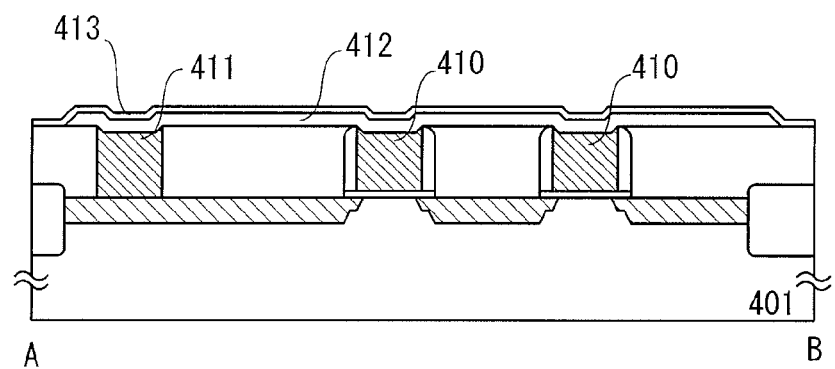
Figure 24C:
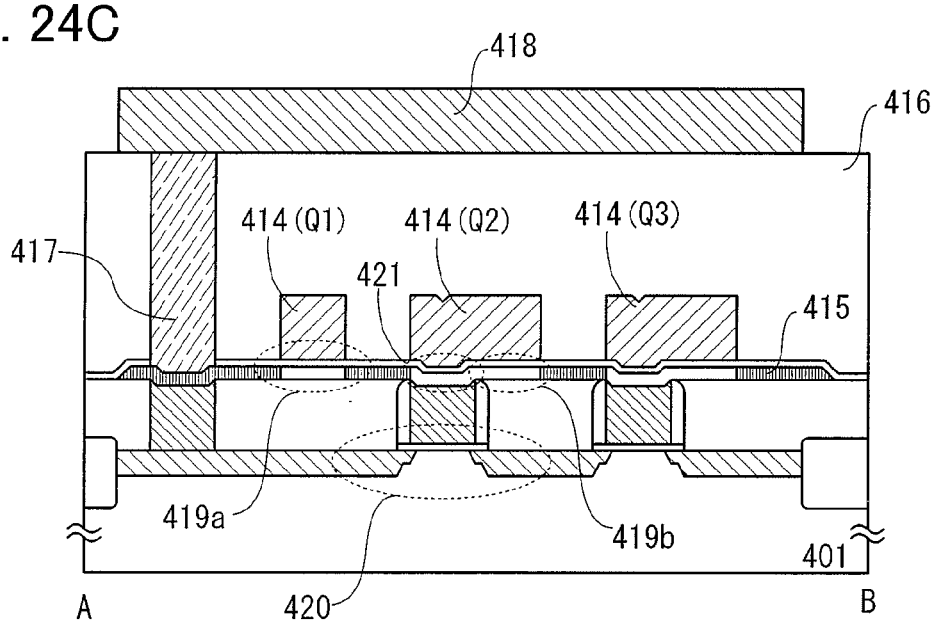

Hereinafter, a manufacturing method of the semiconductor memory device having the above-described structure will be described. FIGS. 24A to 24C are process cross-sectional views taken along a line linking the dot A and the dot B in FIGS. 23A to 23C. The manufacturing process is described below in numerical order of the cross-sectional views.

<FIG. 24A>

First, with the use of a known semiconductor manufacturing technique, the element separation region 402, the conductive region 406 of p-doped silicon region, a first gate insulating film 403, a dummy gate 404, and a first interlayer insulator 407 are formed over an n-type single crystal silicon substrate 401. A sidewall may be provided on a side surface of the dummy gate 404 as illustrated. A silicide region may be provided over a surface of the conductive region 406 so as to increase conductivity.

<FIG. 24B>

After the reading gate 410 of the reading transistor and the first connection electrode 411 are embedded by the method described in Embodiment 3, the oxide semiconductor region 412 is formed. Here, since the oxide semiconductor region is formed to have a thickness of 30 nm to 50 nm, which is several times as large as the thickness of a second gate insulating film 413 to be formed later, that is 10 nm, an end portion of the oxide semiconductor region 412 is processed to have a tapered shape for the purpose of reducing a step. The taper angle at the end of the oxide semiconductor region is preferably 30° to 60°.

<FIG. 24C>

The plurality of first wirings 414 are formed using a conductive material. The first wirings 414 serve as the writing word lines Q1, Q2, Q3, and the like. Part of the writing word lines Q1, Q2, and Q3 serves as a gate electrode of the transistor including an oxide semiconductor. Further, a region 415 exhibiting n-type conductivity, a second interlayer insulator 416, the second connection electrode 417, and the second wiring 418 are formed. The second wiring 418 is a bit line R. Thus, as illustrated in FIG. 24C, a memory cell of the semiconductor memory device, which includes writing transistors 419a and 419b, a reading transistor 420, and a capacitor 421, is manufactured.

As illustrated in FIG. 24C, the writing word line Q2 is formed as an electrode of the capacitor 421 and a gate electrode of the writing transistor 419b. The oxide semiconductor region 412 in a portion of the capacitor 421 (i.e., a portion between the writing word line Q2 and the reading gate 410) is not doped and has a thickness of 50 nm or less; therefore, more than half of the portion serves as a conductor exhibiting weak n-type conductivity.

This application is based on Japanese Patent Application serial no. 2010-063969 filed with Japan Patent Office on Mar. 19, 2010, and Japanese Patent Application serial no. 2010-

077882 filed with Japan Patent Office on Mar. 30, 2010, the entire contents of which are hereby incorporated by reference.

The invention claimed is:

1. A semiconductor memory device comprising:
a first wiring;
a second wiring;
a third wiring;
a fourth wiring;
a fifth wiring; and
a memory unit comprising a first memory cell and a second memory cell,
wherein the first to fourth wirings are parallel to one another,
wherein the first wiring and the fifth wiring intersect with each other,
wherein the first memory cell comprises a first transistor, a second transistor, and a first capacitor,
wherein the second memory cell comprises a third transistor, a fourth transistor, and a second capacitor,
wherein a drain of the first transistor is connected to a gate of the second transistor, one electrode of the first capacitor, and a source of the third transistor,
wherein a drain of the third transistor is connected to a gate of the fourth transistor and one electrode of the second capacitor,
wherein a gate of the first transistor is connected to the first wiring,
wherein the other electrode of the first capacitor is connected to the second wiring,
wherein a gate of the third transistor is connected to the third wiring,
wherein the other electrode of the second capacitor is connected to the fourth wiring,
wherein a drain of the second transistor is connected to a source of the fourth transistor,
wherein a conductivity type of the first transistor is the same as a conductivity type of the third transistor,
wherein a conductivity type of the second transistor is the same as a conductivity type of the fourth transistor, and
wherein the conductivity type of the first transistor is different from the conductivity type of the second transistor.

2. The semiconductor memory device according to claim 1, wherein the conductivity type of the second transistor is p-type.

3. The semiconductor memory device according to claim 1, wherein each of the first transistor and the third transistor comprises an oxide semiconductor.

4. The semiconductor memory device according to claim 1, wherein each of the second transistor and the fourth transistor comprises a single crystal silicon semiconductor.

5. A semiconductor memory device comprising:
a first wiring;
a second wiring;
a third wiring;
a fourth wiring;
a fifth wiring; and
a memory unit comprising a first memory cell and a second memory cell,
wherein the first to fourth wirings are parallel to one another,
wherein the first wiring and the fifth wiring intersect with each other,
wherein the first memory cell comprises a first transistor, a second transistor, and a first capacitor,
wherein the second memory cell comprises a third transistor, a fourth transistor, and a second capacitor,
wherein a source of the first transistor is connected to the fifth wiring,
wherein a drain of the first transistor is connected to a gate of the second transistor, one electrode of the first capacitor, and a source of the third transistor,
wherein a drain of the third transistor is connected to a gate of the fourth transistor and one electrode of the second capacitor,
wherein a gate of the first transistor is connected to the first wiring,
wherein the other electrode of the first capacitor is connected to the second wiring,
wherein a gate of the third transistor is connected to the third wiring,
wherein the other electrode of the second capacitor is connected to the fourth wiring,
wherein a source of the second transistor is connected to the fifth wiring,
wherein a drain of the second transistor is connected to a source of the fourth transistor,
wherein a conductivity type of the first transistor is the same as a conductivity type of the third transistor,
wherein a conductivity type of the second transistor is the same as a conductivity type of the fourth transistor, and
wherein the conductivity type of the first transistor is different from the conductivity type of the second transistor.

6. The semiconductor memory device according to claim 5, wherein the conductivity type of the second transistor is p-type.

7. The semiconductor memory device according to claim 5, wherein each of the first transistor and the third transistor comprises an oxide semiconductor.

8. The semiconductor memory device according to claim 5, wherein each of the second transistor and the fourth transistor comprises a single crystal silicon semiconductor.

9. A semiconductor memory device comprising:
a first wiring;
a second wiring;
a third wiring;
a fourth wiring;
a fifth wiring; and
a memory unit comprising a first memory cell and a second memory cell,
wherein the first to fourth wirings are parallel to one another,
wherein the first memory cell comprises a first transistor, a second transistor, and a first capacitor,
wherein the second memory cell comprises a third transistor, a fourth transistor, and a second capacitor,
wherein a drain of the first transistor is connected to a gate of the second transistor, one electrode of the first capacitor, and a source of the third transistor,
wherein a drain of the third transistor is connected to a gate of the fourth transistor and one electrode of the second capacitor,
wherein a gate of the first transistor is connected to the first wiring,
wherein the other electrode of the first capacitor is connected to the second wiring,
wherein a gate of the third transistor is connected to the third wiring,
wherein the other electrode of the second capacitor is connected to the fourth wiring, wherein a drain of the second transistor is connected to a source of the fourth transistor, wherein a drain of the fourth transistor is connected to the fifth wiring, wherein a conductivity type of the first transistor is the same as a conductivity type of the third transistor, wherein a conductivity type of the second transistor is the same as a conductivity type of the fourth transistor, and wherein the conductivity type of the first transistor is different from the conductivity type of the second transistor.

10. The semiconductor memory device according to claim 9, wherein the conductivity type of the second transistor is p-type.

11. The semiconductor memory device according to claim 9, wherein each of the first transistor and the third transistor comprises an oxide semiconductor.

12. The semiconductor memory device according to claim 9, wherein each of the second transistor and the fourth transistor comprises a single crystal silicon semiconductor.

13. A semiconductor memory device comprising:
a substrate;
a first conductive region over the substrate;
a second conductive region over the substrate;
a third conductive region over the substrate;
a first gate over the substrate;
a second gate over the substrate;
a first wiring;
a second wiring;
a third wiring;
a fourth wiring; and
a fifth wiring,
wherein the first to fourth wirings are parallel to one another,
wherein the first wiring and the fifth wiring intersect with each other,
wherein the first conductive region and the second conductive region are separated by the first gate,
wherein the second conductive region and the third conductive region are separated by the second gate,
wherein the second wiring is between the first wiring and the third wiring,
wherein the third wiring is between the second wiring and the fourth wiring,
wherein the second wiring overlaps with the first gate,
wherein the fourth wiring overlaps with the second gate, and
wherein each of the first to sixth conductive regions comprises a p-type semiconductor region.

14. The semiconductor memory device according to claim 13, wherein an oxide semiconductor layer is between the first gate and the second wiring and between the second gate and the fourth wiring.

15. The semiconductor memory device according to claim 13, wherein the substrate is a single crystal silicon substrate.

16. The semiconductor memory device according to claim 13, wherein the fifth wiring is over the first to fourth wirings.

17. A semiconductor memory device comprising:
a substrate;
a first conductive region over the substrate;
a second conductive region over the substrate;
a third conductive region over the substrate;
a first gate over the substrate;
a second gate over the substrate;
a first wiring;
a second wiring;
a third wiring;
a fourth wiring; and
wherein the first to fourth wirings are parallel to one another,
wherein the first conductive region and the second conductive region are separated by the first gate,
wherein the second conductive region and the third conductive region are separated by the second gate,
wherein the second wiring is between the first wiring and the third wiring,
wherein the third wiring is between the second wiring and the fourth wiring,
wherein the second wiring overlaps with the first gate,
wherein the fourth wiring overlaps with the second gate, and
wherein each of the first to sixth conductive regions comprises a p-type semiconductor region.

18. The semiconductor memory device according to claim 17, wherein an oxide semiconductor layer is between the first gate and the second wiring and between the second gate and the fourth wiring.

19. The semiconductor memory device according to claim 18, wherein the oxide semiconductor layer comprises a doped region.

20. The semiconductor memory device according to claim 17, wherein the substrate is a single crystal silicon substrate.

* * * * *